United States Patent
Shim et al.

(10) Patent No.: US 9,202,571 B2
(45) Date of Patent: Dec. 1, 2015

(54) VERTICALLY-INTEGRATED NONVOLATILE MEMORY DEVICES HAVING LATERALLY-INTEGRATED GROUND SELECT TRANSISTORS

(71) Applicant: Samsung Electronics Co., Ltd., Suwon-si (KR)

(72) Inventors: Sunil Shim, Seoul (KR); Jaehun Jeong, Hwaseong-si (KR); Jaehoon Jang, Seongnam-si (KR); Kihyun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/272,765

(22) Filed: May 8, 2014

(65) Prior Publication Data

US 2014/0241065 A1    Aug. 28, 2014

Related U.S. Application Data

(60) Continuation of application No. 14/095,597, filed on Dec. 3, 2013, now Pat. No. 8,743,614, which is a division of application No. 13/219,178, filed on Aug. 26, 2011, now Pat. No. 8,614,917, which is a continuation-in-part of application No. 12/701,246, filed on Feb. 5, 2010, now Pat. No. 8,644,046.

(30) Foreign Application Priority Data

Aug. 27, 2010    (KR) .................. 10-2010-0083682

(51) Int. Cl.
*G11C 11/34*    (2006.01)
*G11C 16/04*    (2006.01)
*H01L 27/115*   (2006.01)

(52) U.S. Cl.
CPC ........ *G11C 16/0483* (2013.01); *G11C 16/0408* (2013.01); *G11C 16/0466* (2013.01); *H01L 27/11519* (2013.01); *H01L 27/11551* (2013.01); *H01L 27/11556* (2013.01)

(58) Field of Classification Search
CPC ... G11C 16/0483; G11C 16/10; H01L 27/115
USPC ............................ 365/185.17, 189.09, 185.14
See application file for complete search history.

(56) References Cited

U.S. PATENT DOCUMENTS 6,188,629 B1   2/2001  Kaplinsky
6,815,805 B2  11/2004  Weimer
(Continued)

FOREIGN PATENT DOCUMENTS

EP   0 180 887    5/1986
EP   1 852 918   11/2007
(Continued)

OTHER PUBLICATIONS

H. Tanaka et al, "Bit cost Scalable Technology with Punch and Plug Process for Ultra High Density Flash Memory", 2007 Symposium on VLSI Technology Digest Technical Papers, p. 14-15.

*Primary Examiner* — Jason Lappas
(74) *Attorney, Agent, or Firm* — Myers Bigel Sibley & Sajovec, PA

(57) ABSTRACT

Nonvolatile memory devices utilize vertically-stacked strings of nonvolatile memory cells (e.g., NAND-type strings) that can be selectively coupled to common source lines within a substrate. This selective coupling may be provided by lateral ground select transistors having different threshold voltages that account for different lateral spacings between the vertically-stacked strings of nonvolatile memory cells and the common source lines.

12 Claims, 46 Drawing Sheets

(56) References Cited

U.S. PATENT DOCUMENTS

| | | |
|---|---|---|
| 7,365,388 B2 | 4/2008 | Bhattacharyya |
| 7,871,891 B2 | 1/2011 | Cho et al. |
| 8,644,046 B2 | 2/2014 | Seol et al. |
| 8,743,614 B2 * | 6/2014 | Shim et al. ............... 365/185.17 |
| 2006/0146608 A1 | 7/2006 | Fasoli et al. ............... 365/185.17 |
| 2006/0270149 A1 | 11/2006 | Lee |
| 2007/0034955 A1 | 2/2007 | Kim et al. |
| 2008/0067583 A1 | 3/2008 | Kidoh et al. |
| 2008/0068888 A1 | 3/2008 | Kim et al. |
| 2008/0123425 A1 | 5/2008 | Lutze et al. |
| 2008/0173928 A1 | 7/2008 | Arai et al. |
| 2008/0242034 A1 | 10/2008 | Mokhlesi et al. |
| 2009/0080245 A1 | 3/2009 | Lutze et al. |
| 2009/0097309 A1 | 4/2009 | Mizukami et al. |
| 2009/0121271 A1 | 5/2009 | Son et al. |
| 2009/0268522 A1 | 10/2009 | Maejima |
| 2009/0310425 A1 | 12/2009 | Sim et al. |
| 2010/0270593 A1 | 10/2010 | Lung et al. |
| 2011/0019486 A1 | 1/2011 | Jang et al. |
| 2011/0092033 A1 | 4/2011 | Arai et al. |
| 2013/0037860 A1 | 2/2013 | Jang |

FOREIGN PATENT DOCUMENTS

| | | |
|---|---|---|
| JP | 06-237003 | 8/1994 |
| JP | 2007-180389 | 7/2007 |
| JP | 2007-266143 | 10/2007 |
| JP | 2008-159699 | 7/2008 |
| KR | 1020050110785 A | 11/2005 |
| KR | 1020070036525 | 4/2007 |
| WO | WO 2012/066480 | 5/2012 |

* cited by examiner

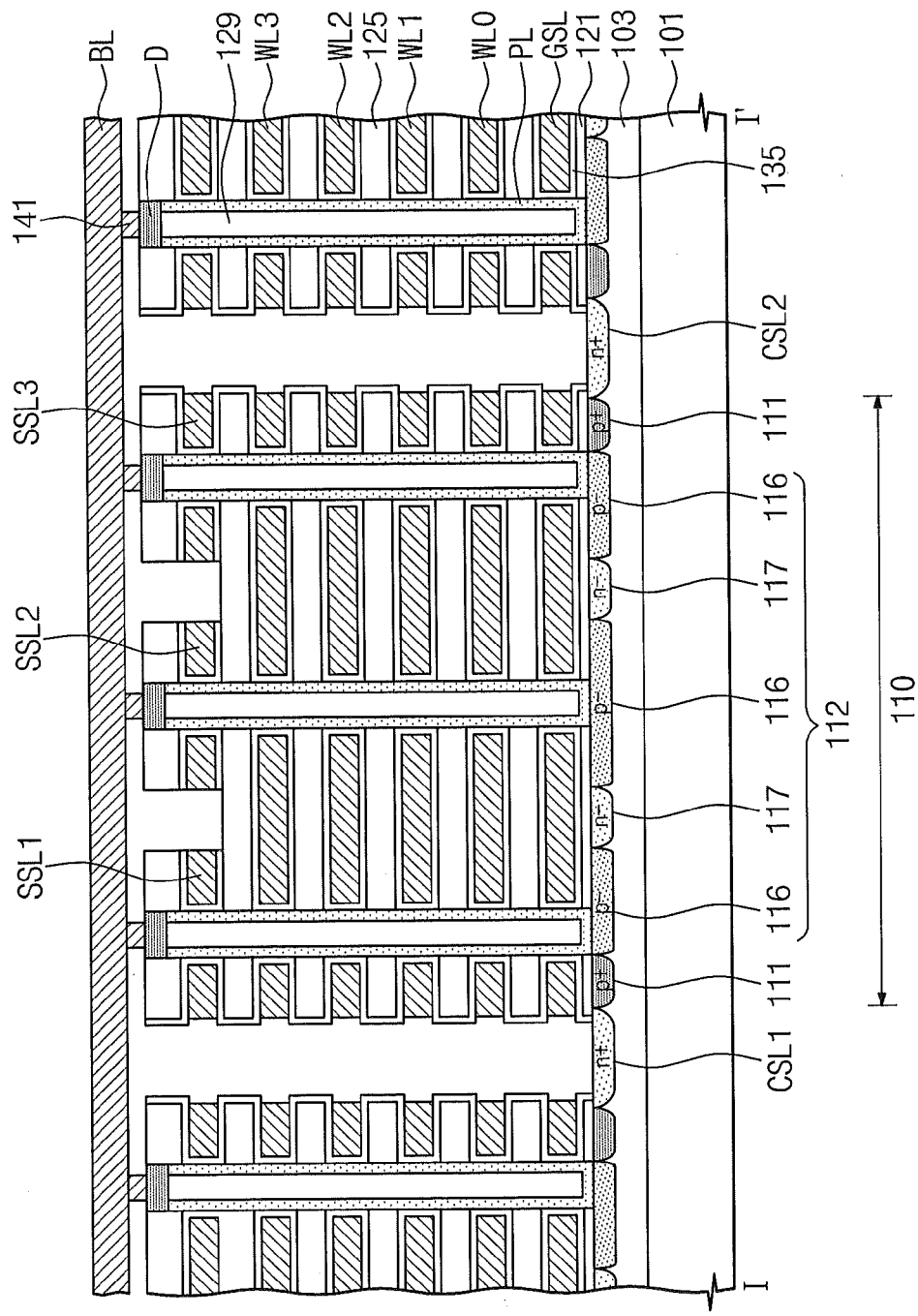

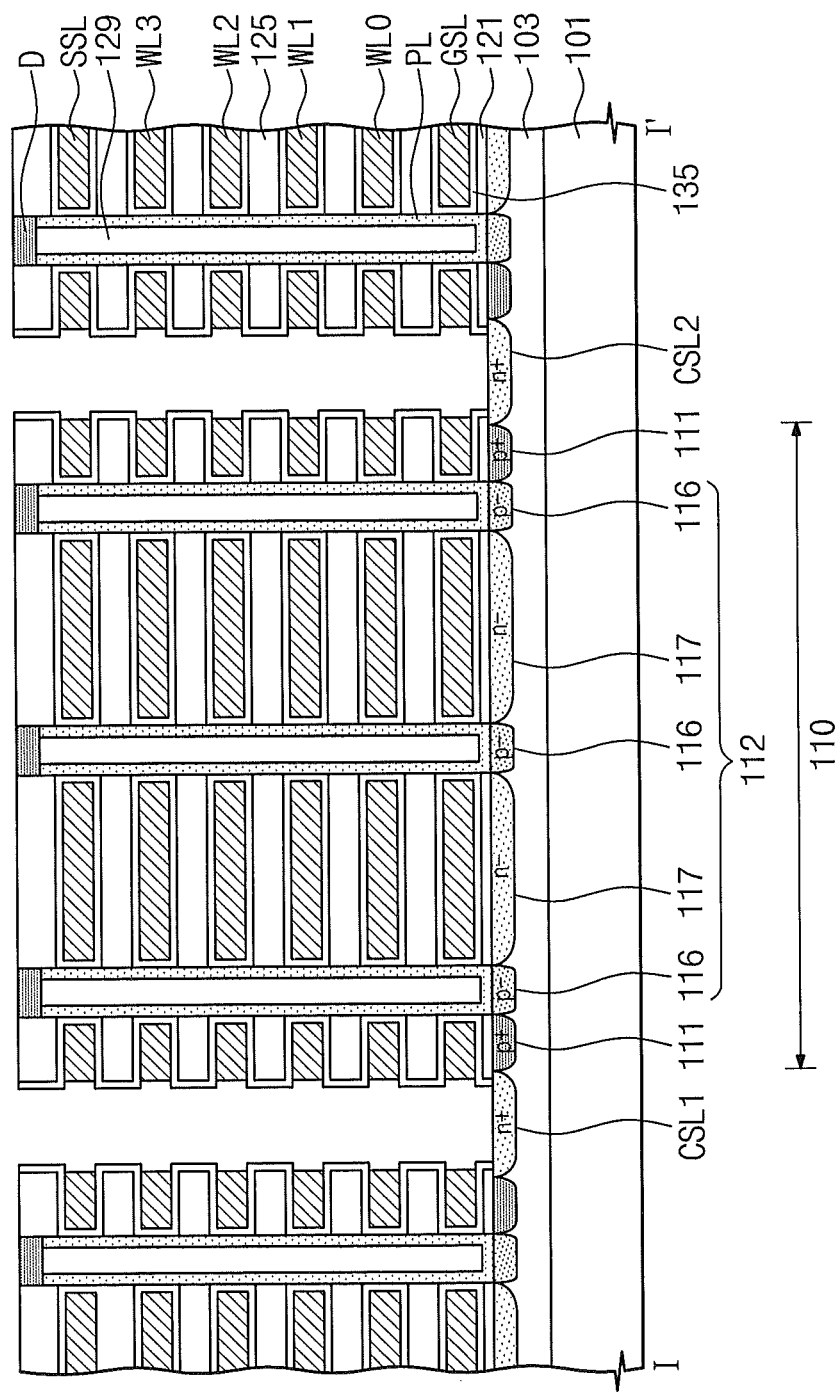

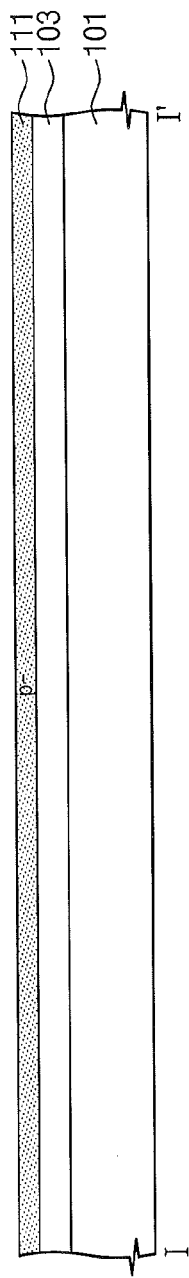
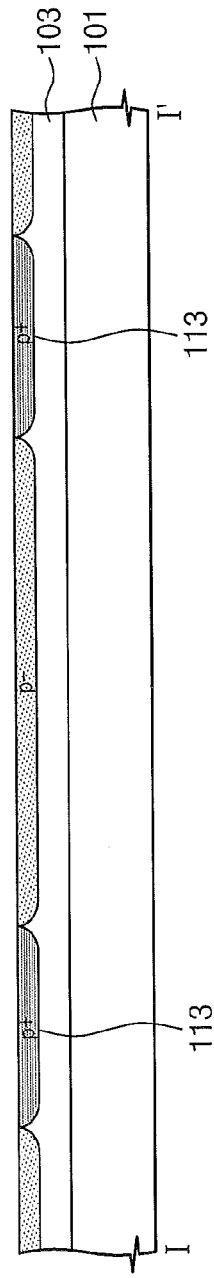
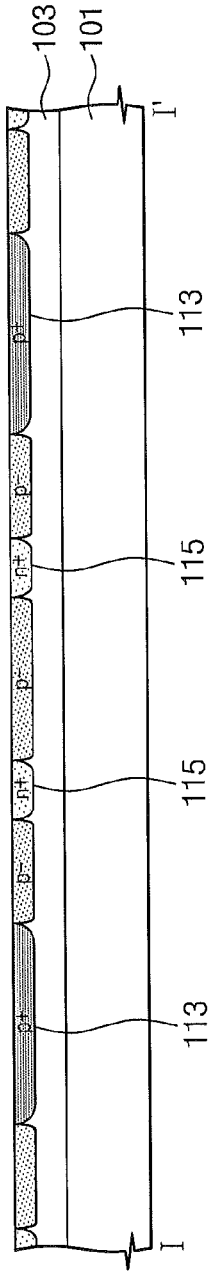

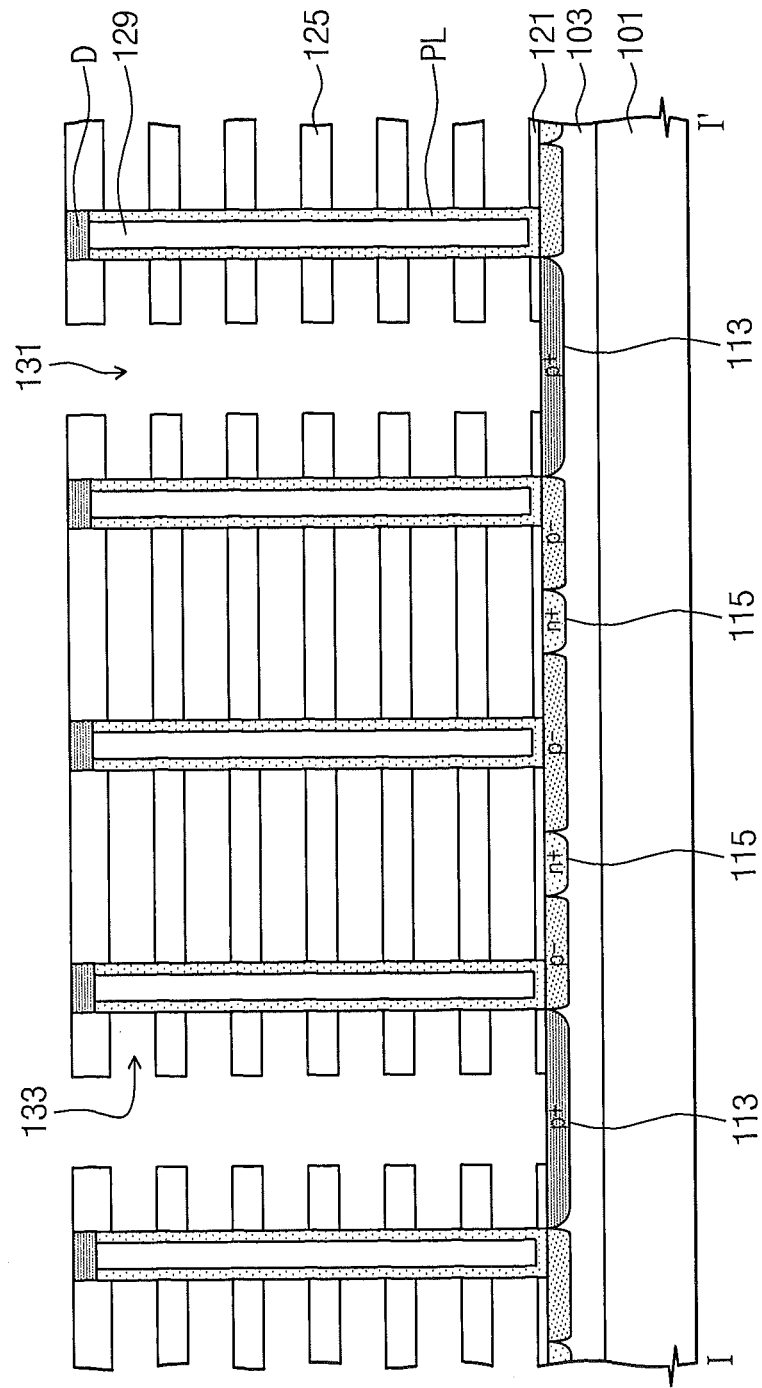

VERTICALLY-INTEGRATED NONVOLATILE MEMORY DEVICES HAVING LATERALLY-INTEGRATED GROUND SELECT TRANSISTORS

REFERENCE TO PRIORITY APPLICATION

This U.S. non-provisional patent application is a continuation of U.S. patent application Ser. No. 14/095,597 filed Dec. 3, 2013, which is a divisional of U.S. patent application Ser. No. 13/219,178 filed Aug. 26, 2011, which is a continuation-in-part of U.S. patent application Ser. No. 12/701,246 filed Feb. 5, 2010, which claims priority under 35 U.S.C. §119 to Korean Patent Application No. 10-2010-0083682, filed on Aug. 27, 2010, the entire contents of which are hereby incorporated by reference.

FIELD OF THE INVENTION

The present disclosure herein relates to semiconductor devices and methods of forming same.

BACKGROUND OF THE INVENTION

To satisfy excellent performance and low cost, it may be required to increase a degree of integration in semiconductor devices. Particularly, a degree of integration in memory devices is an important factor for determining the prices of products. In typical Two-Dimensional (2D) memory devices, a degree of integration is mainly determined in proportion to the occupied area of memory cells, which is affected by the level of fine pattern forming technology. However, since high-cost equipment is required for reducing pattern size, a degree of higher integration in 2D semiconductor memory devices may become limited.

To overcome these limitations, Three-Dimensional (3D) memory devices including three-dimensionally arranged memory cells are being proposed. For mass production of the 3-D memory devices, however, a process technology which reduces manufacturing costs per bit relative to 2-D memory devices and realizes reliable product characteristic is required.

SUMMARY OF THE INVENTION

Nonvolatile memory devices according to embodiments of the invention utilize vertically-stacked strings of nonvolatile memory cells (e.g., NAND-type strings) that can be selectively coupled to common source lines within a substrate. This selective coupling may be provided by lateral ground select transistors having different threshold voltages that account for different lateral spacings between the vertically-stacked strings of nonvolatile memory cells and the common source lines.

According to some of these embodiments of the invention, a nonvolatile memory device includes a first common source line of first conductivity type within a semiconductor substrate. A first NAND-type string of nonvolatile memory cells is provided on the semiconductor substrate. The first NAND-type string includes a first vertically-stacked plurality of nonvolatile memory cells and a first ground select transistor electrically coupled in series with the first vertically-stacked plurality of nonvolatile memory cells. A first lateral ground select transistor is also provided, which has a source terminal within the first common source line and a drain terminal electrically connected to a source terminal of the first ground select transistor. A second NAND-type string of nonvolatile memory cells is provided at a location on the semiconductor substrate that is adjacent to the first NAND-type string. The second NAND-type string includes a second vertically-stacked plurality of nonvolatile memory cells and a second ground select transistor electrically coupled in series with the second vertically-stacked plurality of nonvolatile memory cells. A second lateral enhancement-mode ground select transistor is provided, which has a source terminal electrically connected to the drain terminal of the first lateral enhancement-mode ground select transistor and a drain terminal electrically connected to a source terminal of the second ground select transistor. To maintain a relatively low series resistance between the second NAND-type string and the first common source line, the second lateral ground select transistor is configured to have a lower threshold voltage relative to the first lateral ground select transistor.

According to additional embodiments of the invention, the first common source line includes a region of first conductivity type within a region (e.g., well region) of second conductivity type and a channel region of the first lateral ground select transistor is more heavily doped with second conductivity type dopants relative to a channel region of the second lateral ground select transistor. In some of these embodiments of the invention, a net conductivity type of the channel region of the second lateral ground select transistor is of first conductivity type. In alternative embodiments of the invention, channel region of the second lateral ground select transistor includes a region of first conductivity type and a region of second conductivity type.

According to still further embodiments of the invention, a nonvolatile memory device includes first and second common source lines of first conductivity type within a semiconductor substrate. A plurality of lateral ground select transistors are also provided. These lateral ground select transistors are electrically connected in series and have commonly-connected gate electrodes. In particular, the plurality of lateral ground select transistors may include a first lateral ground select transistor having a source terminal within the first common source line and a second lateral ground select transistor having a source terminal within the second common source line. A third lateral ground select transistor is also provided, which has a threshold voltage lower than a threshold voltage of at least one of the first and second lateral ground select transistors. The memory device further includes first, second and third NAND-type strings of vertically-stacked nonvolatile memory cells on the semiconductor substrate. The first NAND-type string includes a first ground select transistor having a source terminal electrically connected to a drain terminal of the first lateral ground select transistor. The second NAND-type string includes a second ground select transistor having a source terminal electrically connected to a drain terminal of the second lateral ground select transistor. The third NAND-type string includes a third ground select transistor having a source terminal electrically connected to a current carrying terminal of the third lateral ground select transistor.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 9A is a cross-sectional view taken along line I-I' of FIG. 3;

FIGS. 22A to 22G illustrate another example of a method of forming the nonvolatile memory device according to an embodiment of the inventive concept which will be described below with reference to FIG. 8B, and are cross-sectional views corresponding to line I-I' of FIG. 3;

FIGS. 23A to 23G illustrate another example of a method of forming the nonvolatile memory device according to an embodiment of the inventive concept which will be described below with reference to FIG. 9B, and are cross-sectional views corresponding to line I-I' of FIG. 3;

DETAILED DESCRIPTION OF THE EMBODIMENTS

Figure 1:
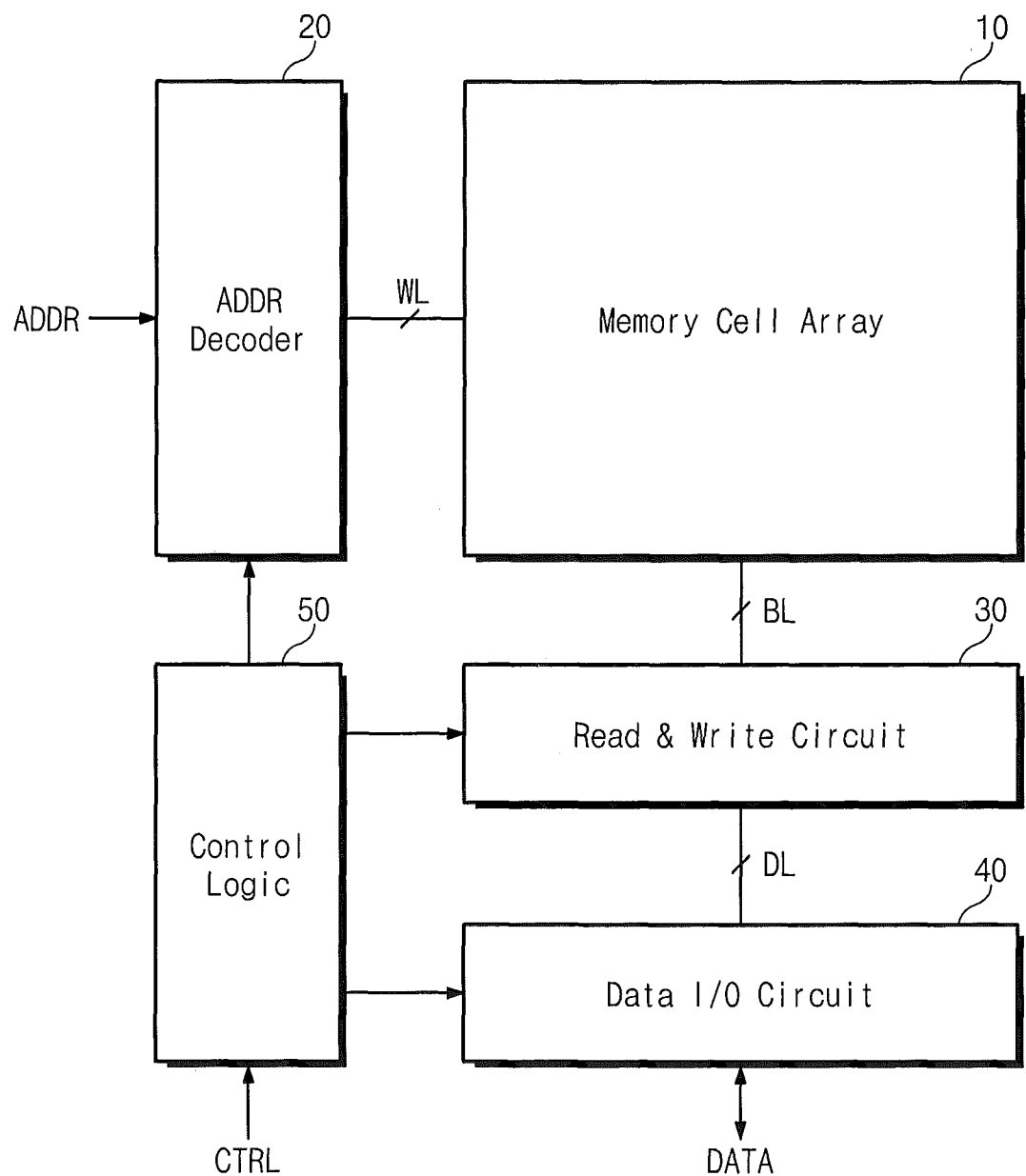
FIG. 1 is a block diagram illustrating a nonvolatile memory device according to embodiments of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In embodiments of the inventive concept, an impurity-doped region may have a first conductive type or a second conductive type by doping a first conductive impurity ion and a second conductive impurity ion at different concentrations. The doping concentration of the impurity-doped region denotes a final conductive concentration with different conductive types offset.

In the specification, it will be understood that when an element such as a layer, film, region, or substrate is referred to as being "on" another element, it can be directly on the other element or intervening elements may also be present. In the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. In the specification, the term 'and/or' is used as meaning in which the term includes at least one of preceding and succeeding elements. Like reference numerals refer to like elements throughout.

In this specification, a region is doped with different quantity of impurity ions including a first conductive type impurity ions and a second conductive type impurity ions such that the doped region has the first or second conductive type. The impurity doping concentration of the doped region represents final conductive type having an amount of the impurity ions that the first and second conductive type impurity ions are offset each other.

Hereinafter, exemplary embodiments of the inventive concept will be described in detail with reference to the accompanying drawings.

FIG. 1 is a block diagram illustrating a nonvolatile memory device according to embodiments of the inventive concept. Referring to FIG. 1, a nonvolatile memory device according to embodiments of the inventive concept includes a memory cell array 10, an address decoder 20, a read/write circuit 30, a data input/output circuit 40, and a control logic 50. The memory cell array 10 may be connected to the address decoder 20 through a plurality of word lines WL, and be connected to the read/write circuit 30 through a plurality of bit lines BL. The memory cell array 10 includes a plurality of memory cells. For example, the memory cell array 10 may store one or more bits in each cell.

The address decoder 20 may be connected to the memory cell array 10 through the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder and address buffer.

The read/write circuit 30 may be connected to the memory cell array 10 through the bit line BL, and be connected to the data input/output circuit 40 through the data lines DL. The read/write circuit 30 may operate according to the control of the control logic 50. The read/write circuit 30 receives the decoded column address from the address decoder 20. The read/write circuit 30 selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region of the memory cell array 10, and writes the read data in a second storage region of the memory cell array 10. For example, the read/write circuit 30 may perform a copy-back operation.

The read/write circuit 30 may include elements which include a page buffer (or a page register) and a column selection circuit. As another example, the read/write circuit 30 may include elements which include a sensing amplifier, a write driver and a column selection circuit.

The data input/output circuit 40 may be connected to the read/write circuit 30 through the data lines DL. The data input/output circuit 40 operates according to the control of the control logic 50. The data input/output circuit 40 exchanges data DATA with the outside. The data input/output circuit 40 transfers the data DATA to the read/write circuit 30 through the data lines DL. The data input/output circuit 40 outputs the data DATA, which is transferred from the read/write circuit 30 through the data lines DL, to the outside. For example, the data input/output circuit 40 may include an element such as a data buffer.

The control logic 50 may be connected to the address decoder 20, the read/write circuit 30 and the data input/output circuit 40. The control logic 50 controls the operation of a 3D semiconductor device. The control logic 50 may operate in response to a control signal CTRL transferred from the outside.

Figure 2:
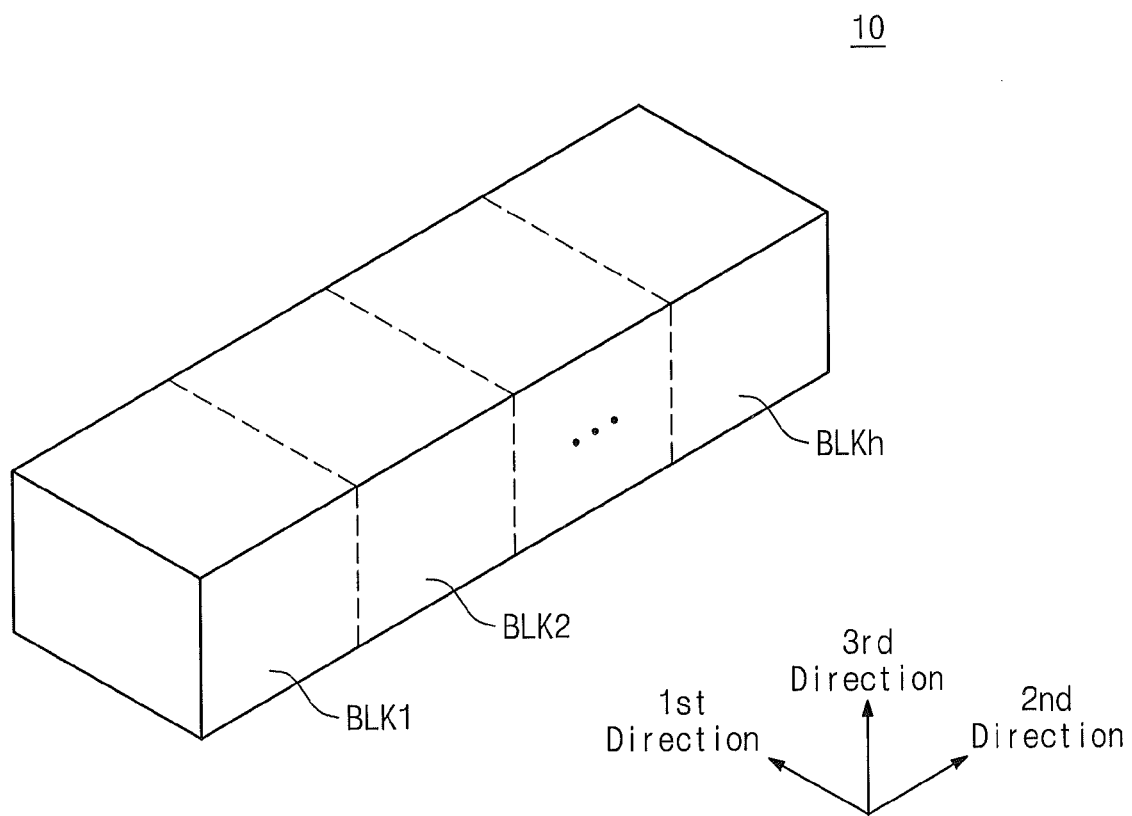
FIG. 2 is a block diagram illustrating as an example of a memory cell array in FIG. 1.

FIG. 2 is a block diagram illustrating as an example of the memory cell array 10 of FIG. 1. Referring to FIG. 2, the memory cell array 10 may include a plurality of memory blocks BLK1 to BLKh. Each of the memory blocks BLK1 to BLKh may have a 3D structure (or a vertical structure). For example, the each of the memory blocks BLK1 to BLKh may include structures that are extended in first to third directions intersecting each other. For example, the each of the memory blocks BLK1 to BLKh includes a plurality of cell strings that are extended in the third direction.

Figure 3:
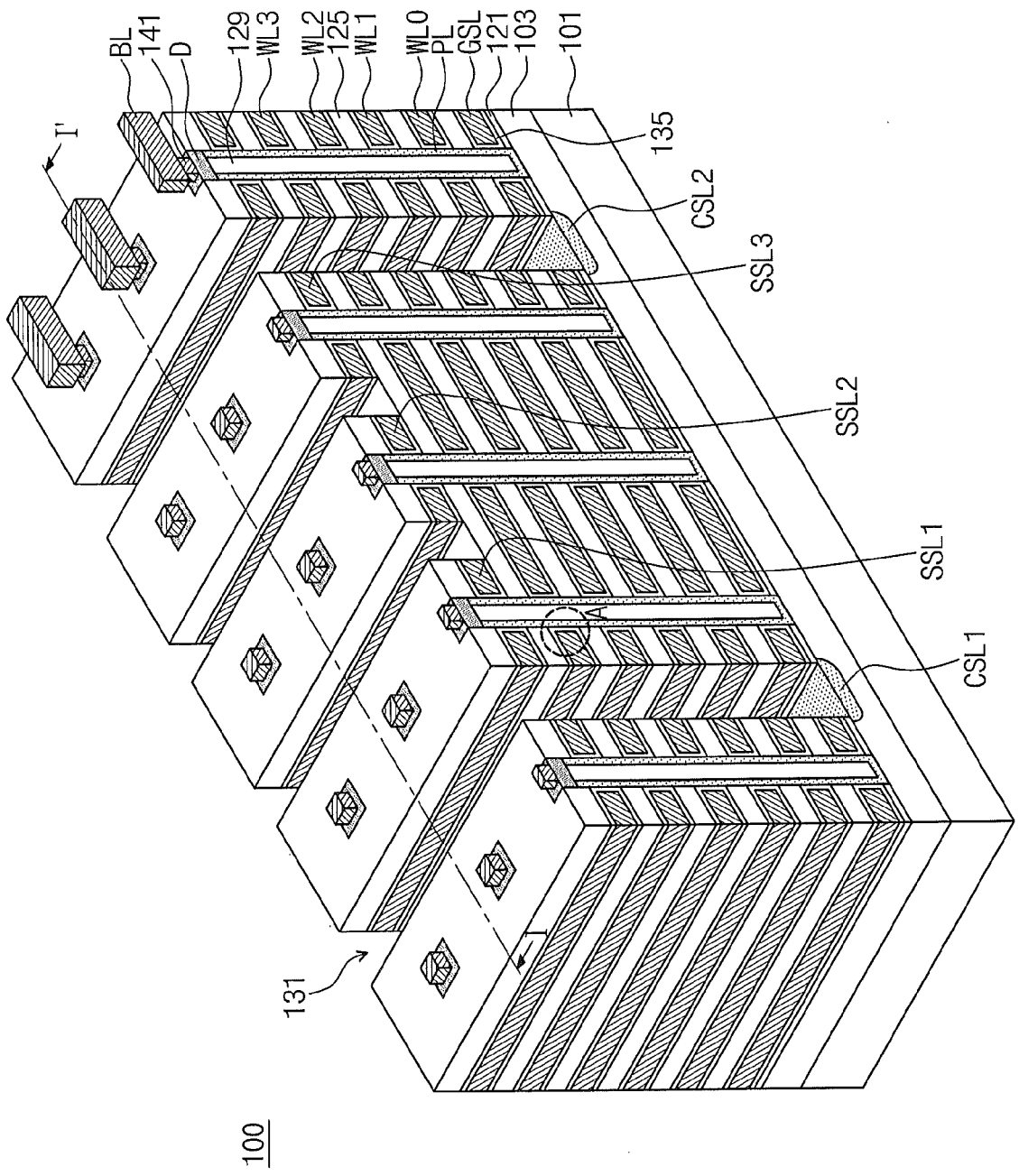
FIG. 3 is a perspective view of a memory block in FIGS. 1 and 2.

FIG. 3 is a perspective view of the memory block which has been described above with reference to FIGS. 1 and 2, and the nonvolatile memory device 100 according to an embodiment of the inventive concept will be described below with reference to FIG. 3. Referring to FIG. 3, a first conductive well 103 may be provided in a substrate 101. A buffer dielectric layer 121 may be provided on the substrate 101. The buffer dielectric layer 121 may be a silicon oxide layer. Insulation patterns 125 and conductive patterns, which are separated from each other by disposing the insulation patterns 125, may be provided on the buffer dielectric layer 121. The insulation patterns 125 may be a silicon oxide layer. The buffer dielectric layer 121 may be much thinner than the insulation patterns 125.

The conductive patterns may include a ground selection line GSL, string selection lines SSL1 to SSL3, and word lines WL0 to WL3 therebetween. The conductive patterns may have a line shape extended in the first direction. The conductive patterns may include silicon, tungsten, metal nitrides or metal silicides that is/are doped.

An isolation region 131 expanded in the first direction may be provided between the conductive patterns adjacent in the second direction. The isolation region 131 may be filled with an isolation pattern (not shown). The isolation pattern may be formed of silicon oxide. The common source lines CSL1 and CSL2 are provided in the well 103 under the isolation region 131. The common source lines CSL1 and CSL2 may be separated from each other and extended in the first direction inside the well 103. The common source lines CSL1 and CSL2 may have a second conductive type different from the first conductive type.

Figure 4:
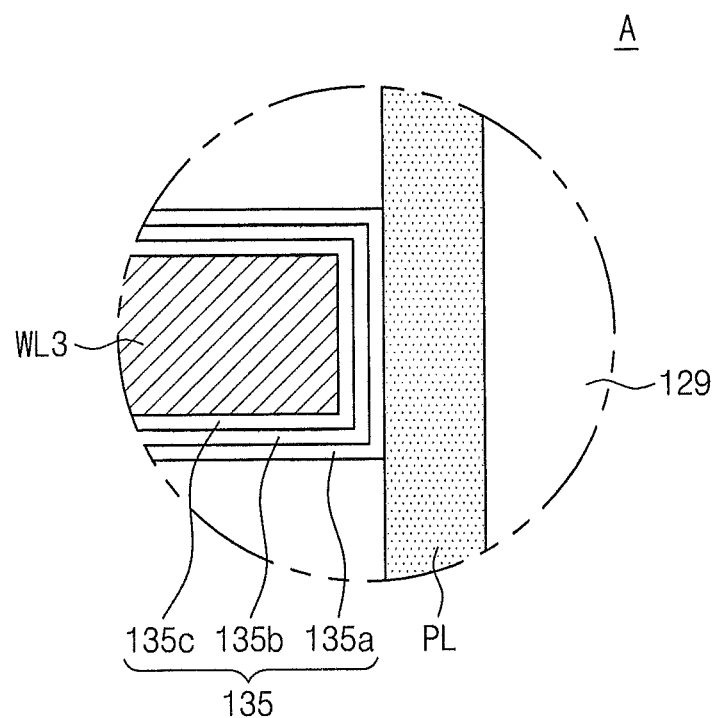
FIG. 4 is an enlarged view of a portion A of FIG. 3.

A plurality of active pillars PL are provided to be connected to the well 103 of the substrate 101 through the conductive patterns GSL, WL0 to WL3 and SSL1 to SSL3, as illustrated by FIG. 4. The active pillars PL may have a long axis that is vertically extended from the substrate 101 (i.e., that is extended in the third direction). The active pillars PL may include a semiconductor material. The active pillars PL may have a solid cylinder shape or a hollow cylinder shape (for example, a macaroni shape). The internal portions of the macaroni-shaped active pillars may be filled with the filling insulation layer 129. The filling insulation layer 129 may be formed of silicon oxide. In one aspect of the inventive concept, the active pillars PL and the substrate 101 may be a semiconductor having a continuous structure. The active pillars PL may be a single crystal semiconductor. In another aspect of the inventive concept, the active pillars PL and the substrate 101 may have a discontinuous interface. The active pillars PL may be a semiconductor having a poly-crystal or amorphous structure. The active pillars PL may include a body part adjacent to the substrate 101, and a drain region D separated from the substrate 101 in an upper portion of the active pillar PL. The body part may have the first conductive type, and the drain region D may have a second conductive type different from the first conductive type.

One ends (i.e., the body part) of the active pillars PL may be connected to the well 103 of the substrate 101, and other ends (i.e., the drain region) of the active pillars PL be connected to the bit line BL through bit line contact 141. The bit line BL may be extended in the second direction. The active pillars PL may be arranged in a matrix type along the first and second directions. Therefore, intersection points between the word lines WL0 to WL3 and the active pillars PL are distributed three-dimensionally. The memory cells MC of the nonvolatile memory device 100 according to an embodiment of the inventive concept are provided in the three-dimensionally distributed intersection points. At least three active pillars PL may be arranged in the second direction between the first and second common source lines CSL1 and CSL2 and be connected to one bit line BL in common.

The first to third string selection lines SSL1 to SSL3 are electrically coupled with the active pillars PL arranged in the first direction between the first and second common source lines CSL1 and CSL2.

An information storage layer 135 may be provided between the word lines WL0 to WL3 and the active pillars PL. The information storage layer 135 may be extended to the tops and bottoms of the word lines. FIG. 4 is an enlarged view of a portion A of FIG. 3. Referring to FIG. 4, the information storage layer 135 may include a blocking insulation layer 135c adjacent to the word lines WL0 to WL3, a tunnel insulation layer 135a adjacent to the active pillars PL, and a charge storage layer 135b therebetween. The blocking insulation layer 135c may include a high dielectric layer (for example, aluminum oxide or hafnium oxide). The blocking insulation layer 135c may be a multi-layer that is configured with a plurality of thin films. For example, the blocking insulation layer 135c may include aluminum oxide and silicon oxide, and a stacked order between the aluminum oxide and the silicon oxide may be various. The charge storage layer 135b may be an insulation layer including a charge trap layer or a conductive nano particle. The charge trap layer, for example, may include silicon nitride. The tunnel insulation layer 135a may include silicon oxide.

Figure 5:
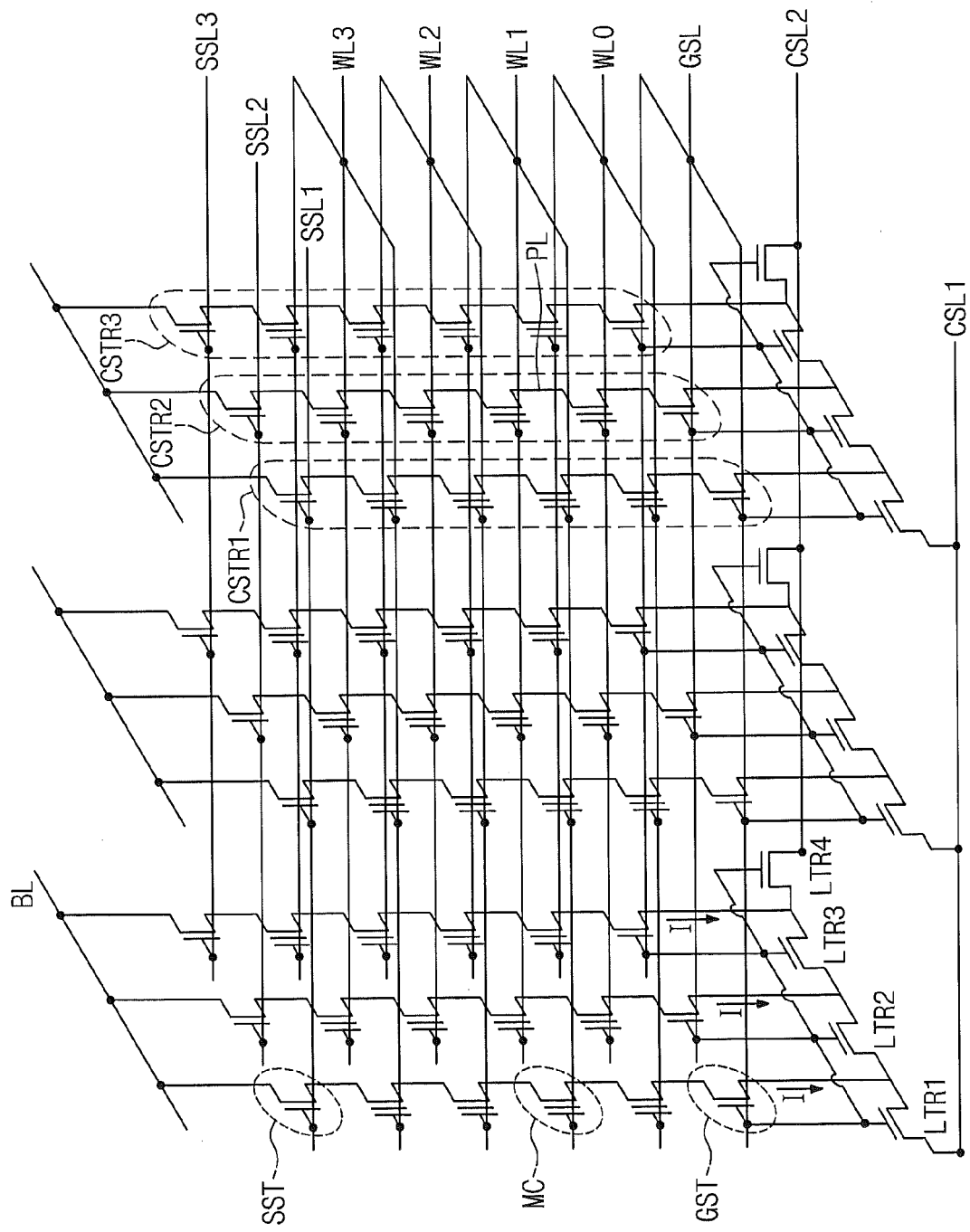
FIGS. 5 and 6 are circuit diagrams illustrating a memory block of a nonvolatile memory device according to an embodiment of the inventive concept.
Figure 6:
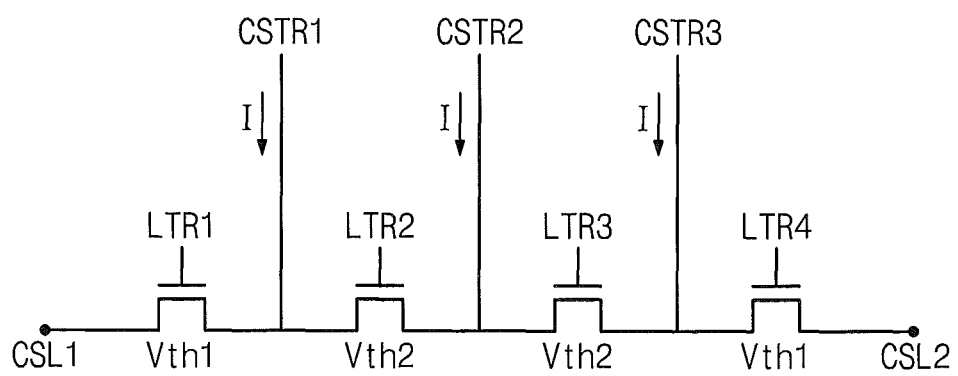

FIGS. 5 and 6 are circuit diagrams illustrating a memory block of a nonvolatile memory device according to an embodiment of the inventive concept. Referring to FIG. 5, a nonvolatile memory device 100 according to an embodiment of the inventive concept may include a bit line BL, a plurality of word lines WL0 to WL3, a plurality of string selection lines SSL1 to SSL3, a ground selection line GSL, a first common source line CSL1 and a second common source line CSL2. A plurality of cell strings CSTR1 to CSTR3 are provided between the bit line BL and the first and second common source lines CSL1 and CSL2.

One cell string may include a string selection transistor SST connected to the bit line BL, a ground selection transistor GST connected to the first and second common source lines CSL1 and CSL2, and a plurality of memory cells MC provided between the string selection transistor SST and the ground selection transistor GST. The memory cells MC are provided at one active pillar. The gate of the ground selection transistor GST is connected to the ground selection line GSL. The gates of the memory cells MC are connected to the word lines WL0 to WL3. The string selection transistor SST may be in plurality. The gates of string selection transistors arranged in the first direction are connected to one of the string selection lines SSL1 to SSL3, and the drains of a plurality of string selection transistors arranged in the second direction are connected to the bit line BL.

Each of the cell strings CSTR1 to CSTR3 may have a structure in which the memory cells MC are connected in series. Therefore, the channels of the string selection transistors SST, the channels of the ground selection transistors GST and the channels of the memory cells MC may be connected in series.

Lateral transistors may be provided in the well 103 of the substrate 101 between the first and second common source lines CSL1 and CSL2. The lateral transistors may include first to fourth lateral transistors LTR1 to LTR4 that are connected in series. The gates of the first to fourth lateral transistors LTR1 to LTR4 are connected to the ground selection line GSL. That is, the ground selection transistor GST and the first to fourth lateral transistors LTR1 to LTR4 may share a gate.

Referring to FIGS. 5 and 6, three cell strings, for example, first to third cell strings CSTR1 to CSTR3 may be connected to one bit line BL in common and be provided between the first and second common source lines CSL1 and CSL2.

The sources of the three cell strings may be connected between the first and second lateral transistors LTR1 and LTR2, between the second and third lateral transistors LTR2 and LTR3, between the third and fourth lateral transistors LTR3 and LTR4, respectively. The first and fourth lateral transistors LTR1 and LTR4 may have a first threshold voltage Vth1, and the second and third lateral transistors LTR2 and LTR3 may have a second threshold voltage Vth2. The second threshold voltage Vth2 is lower than the first threshold voltage Vth1.

Most quantity of a current I passing through the first cell string CSTR1 may flow to the first common source line CSL1 through the first lateral transistor LTR1. The remain quantity of the current I passing through the first cell string CSTR1 may flow to the second common source line CSL2 through the second to fourth lateral transistors LTR2 to LTR4. A current I passing through the second cell string CSTR2 may flow to the first common source line CSL1 through the first and second lateral transistors LTR1 and LTR2, and flow to the second common source line CSL2 through the third and fourth lateral transistors LTR3 and LTR4. Most quantity of a current I passing through the third cell string CSTR3 may flow to the second common source line CSL2 through the fourth lateral transistor LTR4. The remain quantity of the current I passing through the third cell string CSTR3 may flow to the first common source line CSL1 through the first to third lateral transistors LTR1 to LTR3. As the second threshold voltage Vth2 is controlled to less than the first threshold voltage Vth1, a difference between currents I passing through the cell strings can decrease.

Figure 7A:
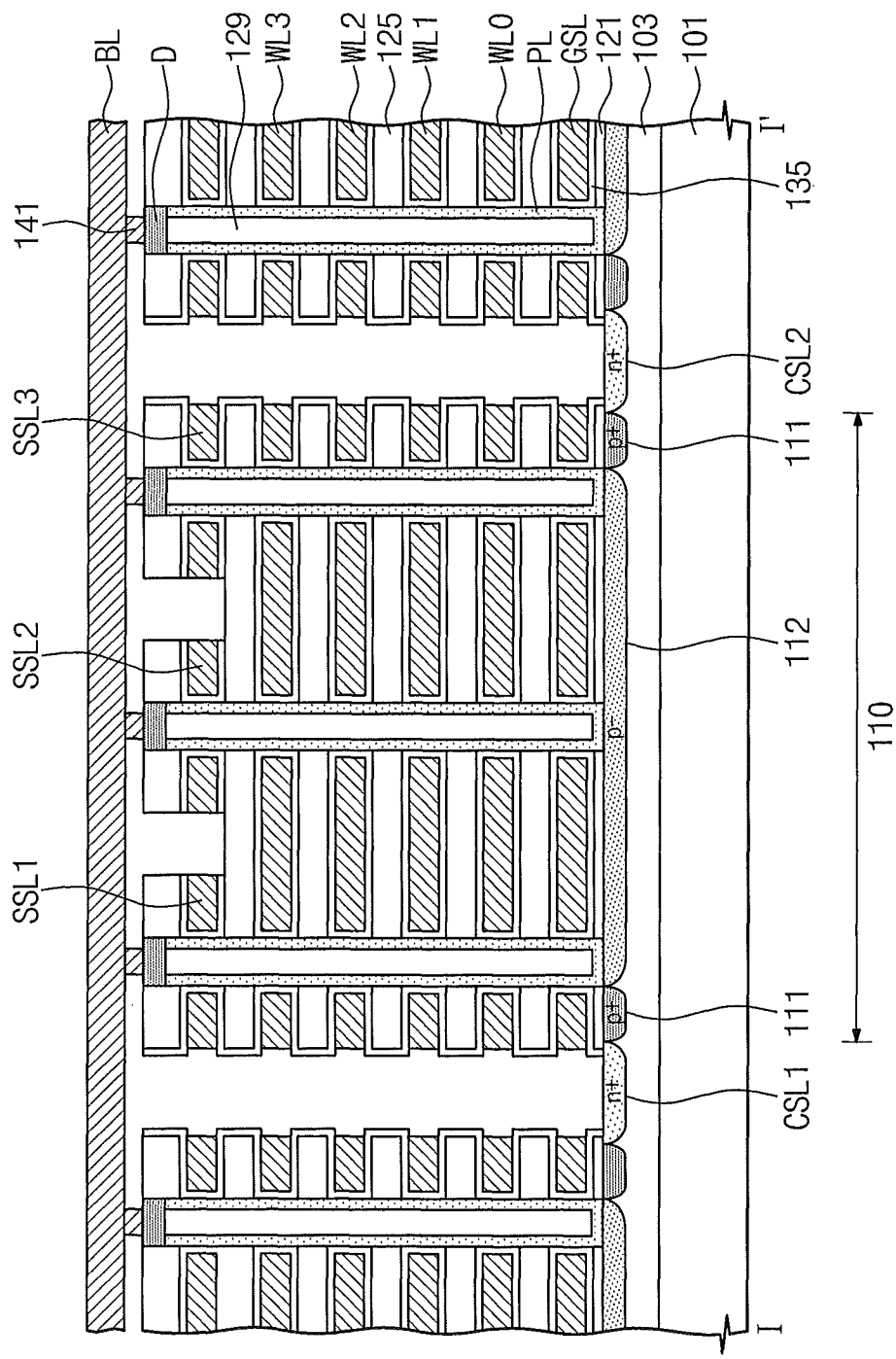
FIG. 7A is a cross-sectional view taken along line I-I' of FIG. 3, in an example of a nonvolatile memory device according to an embodiment of the inventive concept.
Figure 7B:
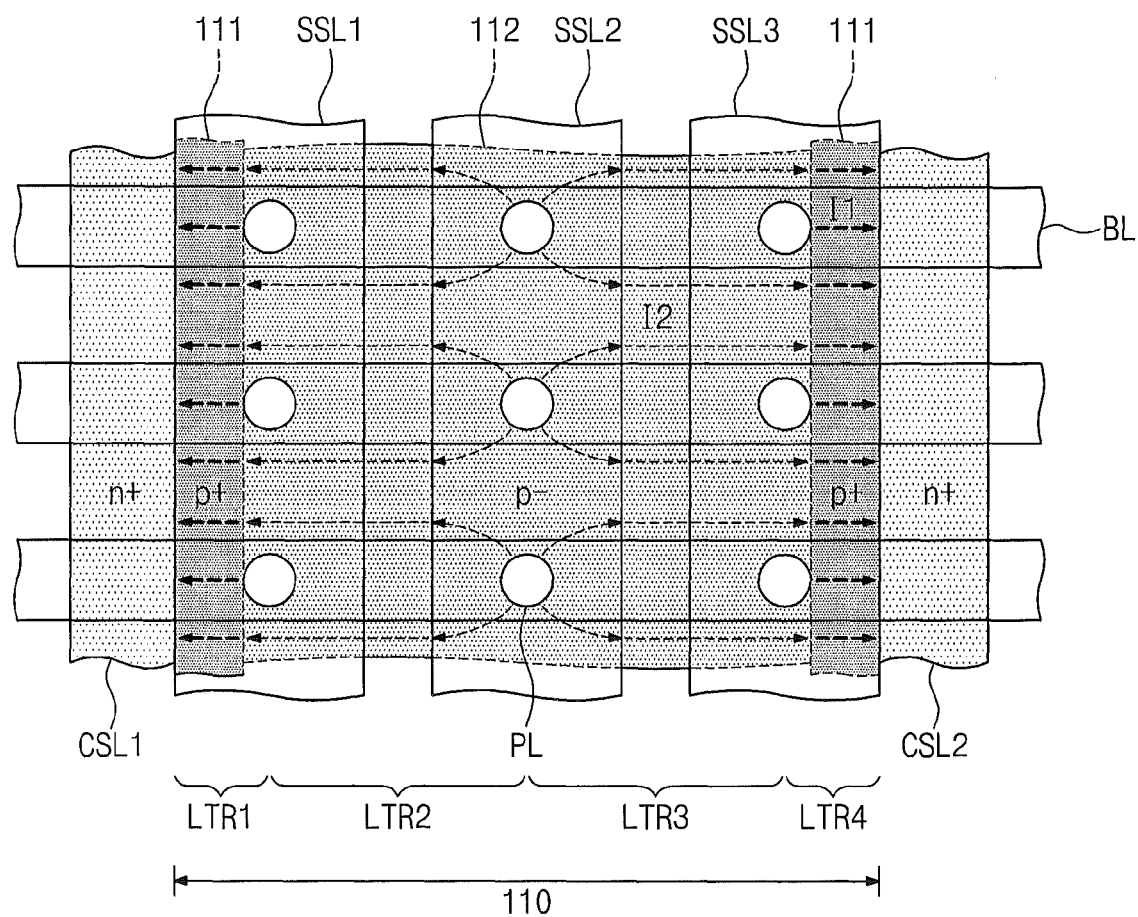
FIG. 7B is a plan view illustrating disposition of impurity regions which are doped on a well, in an example of a nonvolatile memory device according to an embodiment of the inventive concept.

FIGS. 7A and 7B illustrate an example of the nonvolatile memory device 100 according to an embodiment of the inventive concept. FIG. 7A is a cross-sectional view taken along line I-I' of FIG. 3. FIG. 7B is a plan view illustrating disposition of impurity regions which are doped on a well. Referring to FIGS. 7A and 7B, a substrate channel region 110 is provided in the well 103 between the first and second common source lines CSL1 and CSL2. The substrate channel region 110 may include edge regions 111 that are adjacent to the first and second common source lines CSL1 and CSL2 and extended in the first direction, and a middle region 112 between the edge regions 111. The edge regions 111 may be provided between the first and second common source lines CSL1 and CSL2 and active pillars most adjacent to the first and second common source lines CSL1 and CSL2.

The edge regions 111 and the middle region 112 may have the first conductive type. The edge regions 111 may have a first impurity doping concentration, and the middle region 112 may have a second impurity doping concentration lower than the first impurity doping concentration. The active pillars PL may contact the middle region 112. As illustrated by FIGS. 6, 7A and 7B, the first to fourth lateral transistors LTR1 to LTR4, which use the ground selection line GSL as a gate, may be provided in the substrate channel region 110. The first and fourth lateral transistors LTR1 and LTR4 use the edge regions 111 as a channel. The second and third lateral transistors LTR2 and LTR3 use the middle region 112 as a channel.

The first and fourth lateral transistors LTR1 and LTR4 of the edge regions 111 may have a first threshold voltage Vth1. The second and third lateral transistors LTR2 and LTR3 of the middle region 112 may have a second threshold voltage Vth2. Based on the above-described doping profile, the second threshold voltage Vth2 may be lower than the first threshold voltage Vth1. Therefore, a first current I1 from active pillars PL electrically coupled to the first and third string selection transistors SSL1 and SSL3 to a common source line just adjacent to the active pillars PL may be the substantially same as a second current I2 from active pillars PL electrically coupled to the second string selection transistors SSL2 to the common source lines. A current from active pillars PL electrically coupled to the first to third string selection transistors SSL1 to SSL3 to a common source line that is not just adjacent to the active pillars PL may be lower by a minimal degree.

In contrast, if the impurity doping concentration of the edge regions 111 is the same as that of the middle region 112, the second current I2 will be lower than the first current I1. This is because a second distance from active pillars PL coupled to the second string selection transistors SSL2 to the common source lines CSL1 and CSL2 is greater than a first distance from active pillars PL coupled to the first and third string selection transistors SSL1 and SSL3 to the common source lines CSL1 and CSL2.

Due to the high concentration doping of the first conductive impurities of the edge regions 111, the current off characteristic of the ground selection line GSL is maintained, the influence of the second conductive impurity ion of the common source lines CSL1 and CSL2 being diffused into the middle region 112 can be reduced. Due to the low concentration doping of the first conductive impurities of the middle region 112, a cell current dispersion between active pillars that are separated by the first distance from the common source lines and active pillars that are separated by the second distance greater than the first distance from the common source lines can decrease.

Figure 8A:
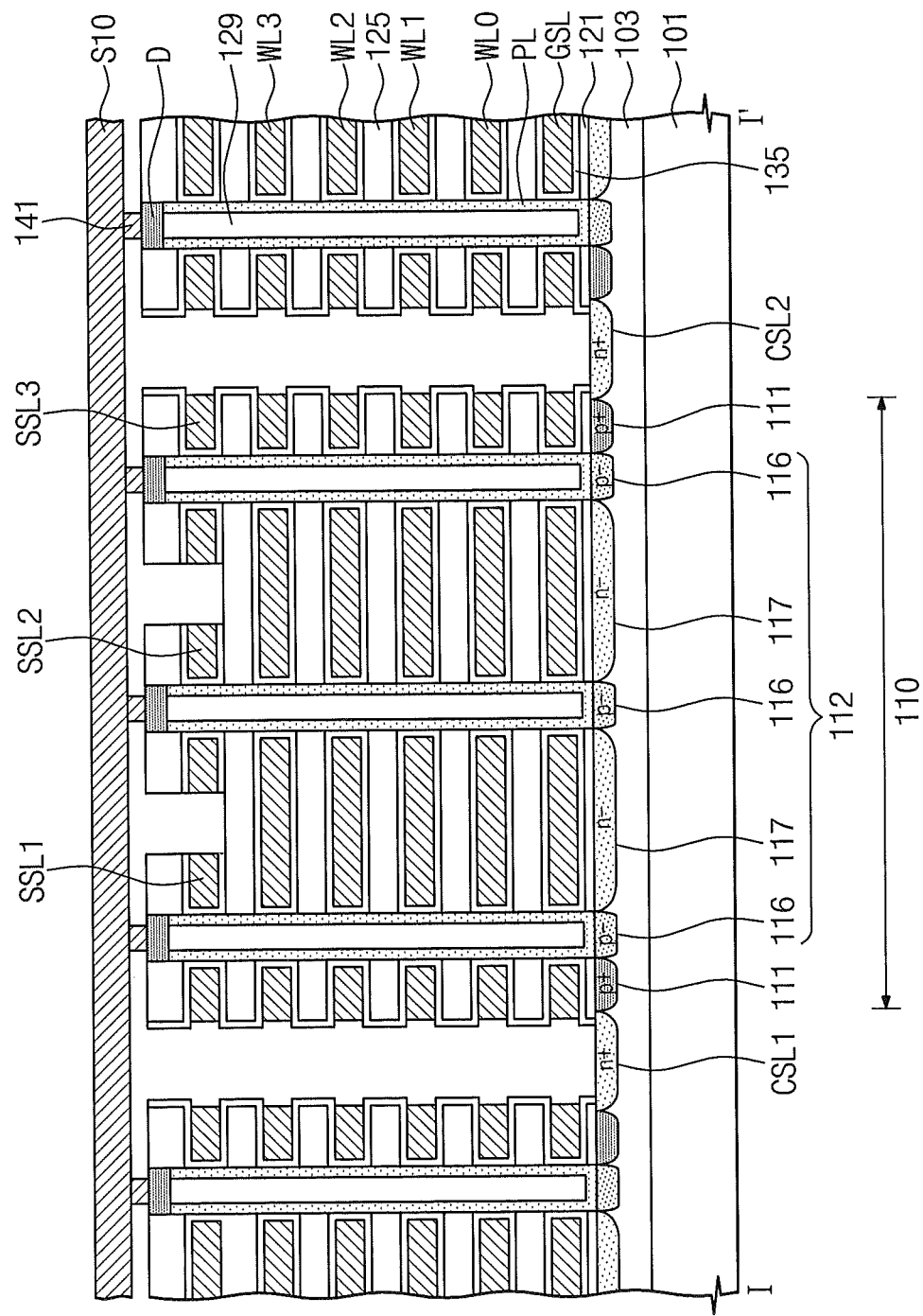
FIG. 8A is a cross-sectional view taken along line I-I' of FIG. 3, in another example of a nonvolatile memory device according to an embodiment of the inventive concept.
Figure 8B:
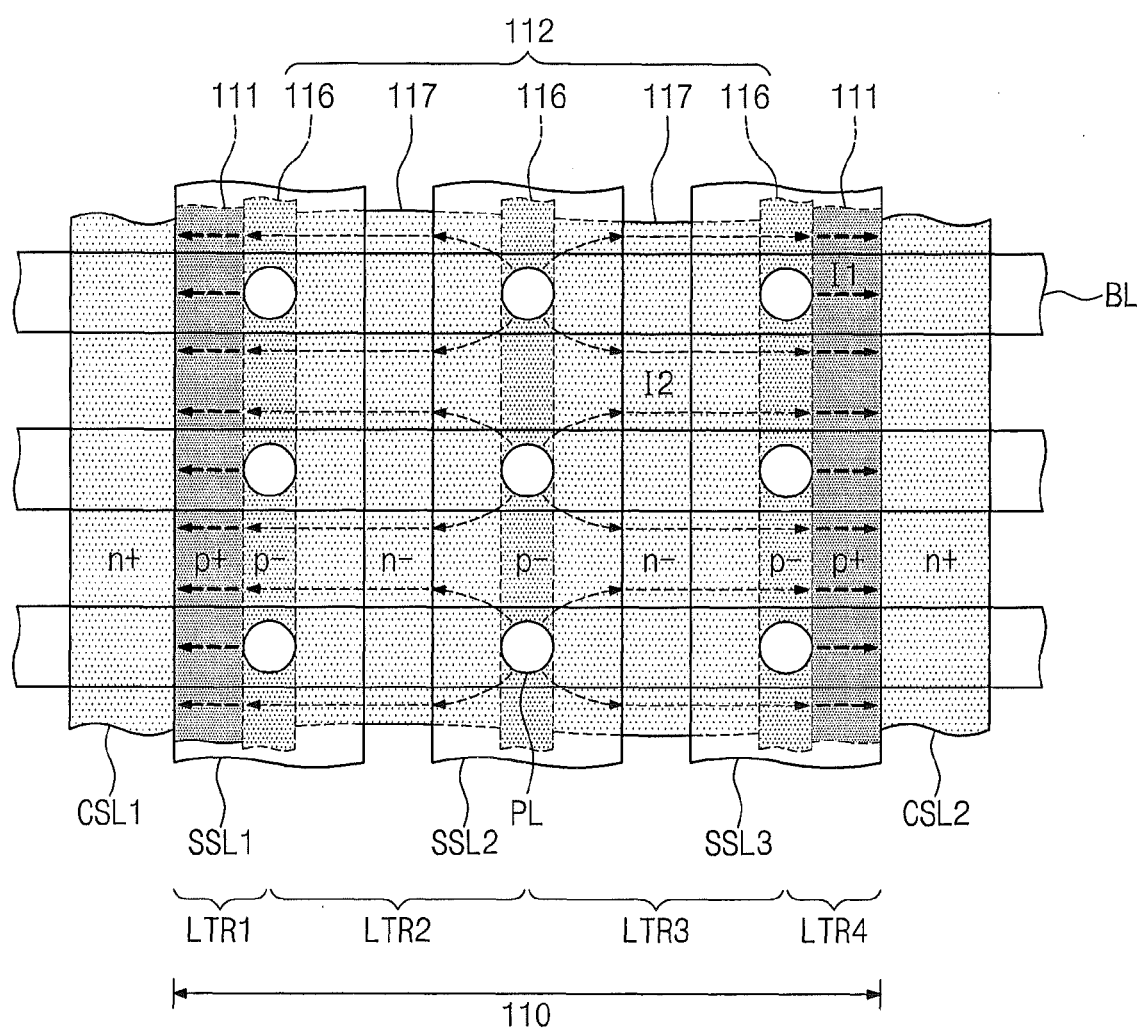
FIG. 8B is a plan view illustrating disposition of impurity regions which are doped on a well, in another example of a nonvolatile memory device according to an embodiment of the inventive concept.

FIGS. 8A and 8B illustrate another example of the non-volatile memory device 100 according to an embodiment of the inventive concept. FIG. 8A is a cross-sectional view taken along line I-I' of FIG. 3. FIG. 8B is a plan view illustrating disposition of impurity regions which are doped on a well. Repetitive description on the same technical feature as that of FIGS. 7A and 7B will be omitted, and only a difference will be described below.

Referring to FIGS. 8A and 8B, the edge regions 111 may be edge regions 111 having the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. The third impurity regions 117 may have the second conductive type. On the other hand, the third impurity regions 117 may have the first conductive type, and a third impurity doping concentration lower than the second impurity doping concentration. The active pillars PL may contact the second impurity regions 116. The second impurity regions 116 may be extended in the second direction in which the active pillars PL are arranged. The third impurity regions 117 may be provided between the second impurity regions 116.

FIGS. 6, 8A and 8B, the first to fourth lateral transistors LTR1 to LTR4 using the ground selection line GSL as a gate may be provided in the substrate channel region 110. The first and fourth lateral transistors LTR1 and LTR4 may use the edge regions 111 as a channel. The second and third lateral transistors LTR2 and LTR3 may use the third impurity regions 117 as a channel.

The first and fourth lateral transistors LTR1 and LTR4 of the edge regions 111 may have a first threshold voltage Vth1. The second and third lateral transistors LTR2 and LTR3 of the middle region 112 may have a second threshold voltage Vth2. Based on the above-described doping profile, the second threshold voltage Vth2 may be lower than the first threshold voltage Vth1. The second threshold voltage Vth2 may be lower than that of the example which has been described above with reference to FIGS. 7A and 7B. Therefore, a first current I1 from active pillars PL electrically coupled to the first and third string selection transistors SSL1 and SSL3 to a common source line just adjacent to the active pillars PL may be the substantially same as a second current I2 from active pillars PL electrically coupled to the second string selection transistors SSL2 to the common source lines.

Figure 9B:
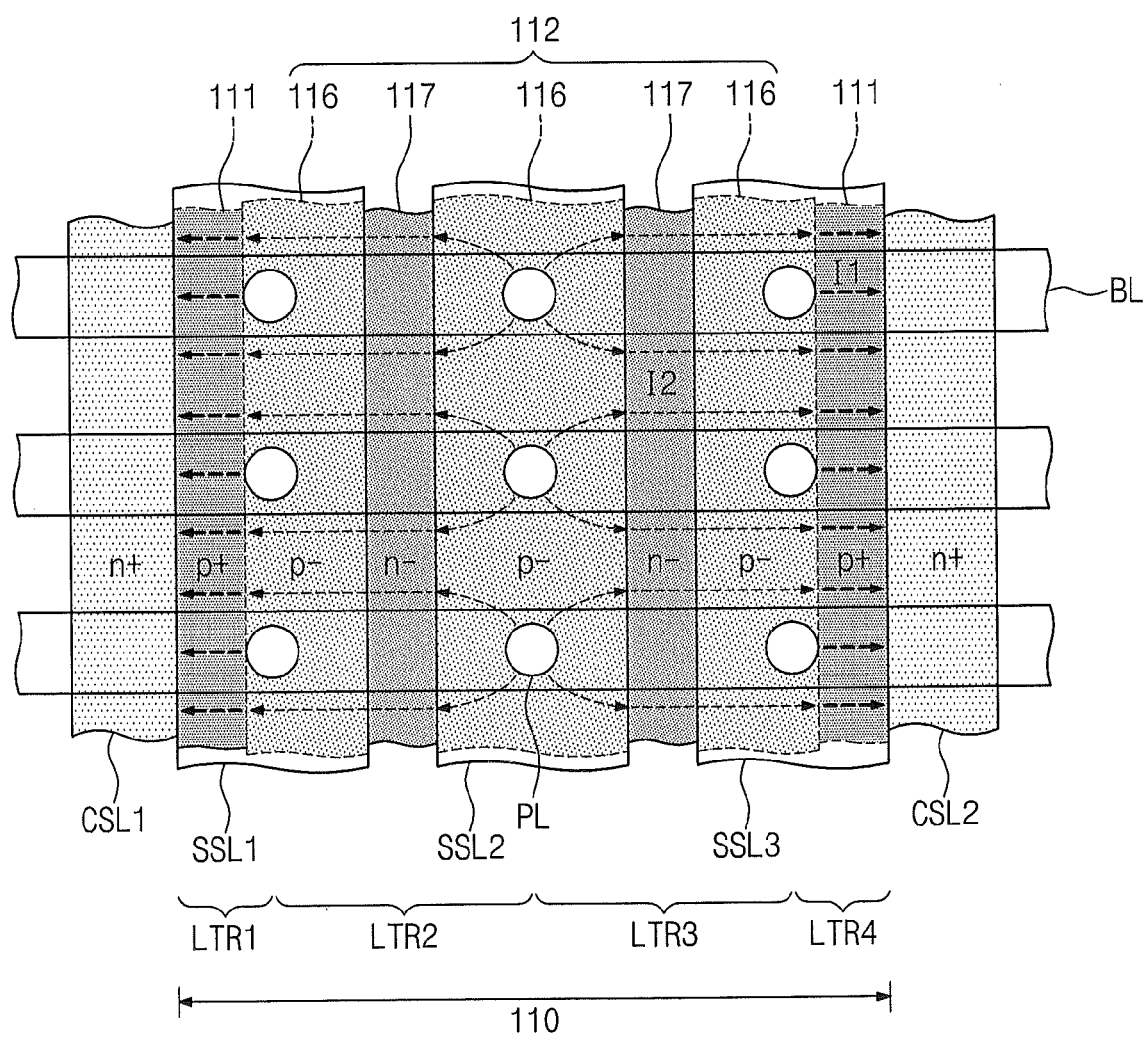
FIG. 9B is a plan view illustrating disposition of impurity regions which are doped on a well.

FIGS. 9A and 9B illustrate another example of the non-volatile memory device 100 according to an embodiment of the inventive concept. FIG. 9A is a cross-sectional view taken along line I-I' of FIG. 3. FIG. 9B is a plan view illustrating disposition of impurity regions which are doped on a well. Repetitive description on the same technical feature as that of FIGS. 8A and 8B will be omitted, and only a difference will be described below.

Referring to FIGS. 9A and 9B, the edge regions 111 may be edge regions 111 having the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. On the other hand, the third impurity regions 117 may have the second conductive type. The third impurity regions 117 may have the first conductive type, and a third impurity doping concentration lower than the second impurity doping concentration.

The edge regions 111 and the second impurity regions 116 just adjacent to the edge regions 111 may be coupled and be provided to overlap with the first and third string selection lines SSL1 and SSL3. The other of the second impurity regions 116 may be provided to overlap with the second string selection line SSL2. The second impurity region 116 may have a width broader than that of the other example which has been described above with reference to FIG. 8B. The third impurity regions 117 may be provided between the second impurity regions 116. The third impurity regions 117 may overlap with a separated space between the string selection lines SSL1 to SSL3.

The first and fourth lateral transistors LTR1 and LTR4 may use the edge regions 111 as a channel. The second and third lateral transistors LTR2 and LTR3 may use the second and third impurity regions 117 as a channel.

Figure 10:
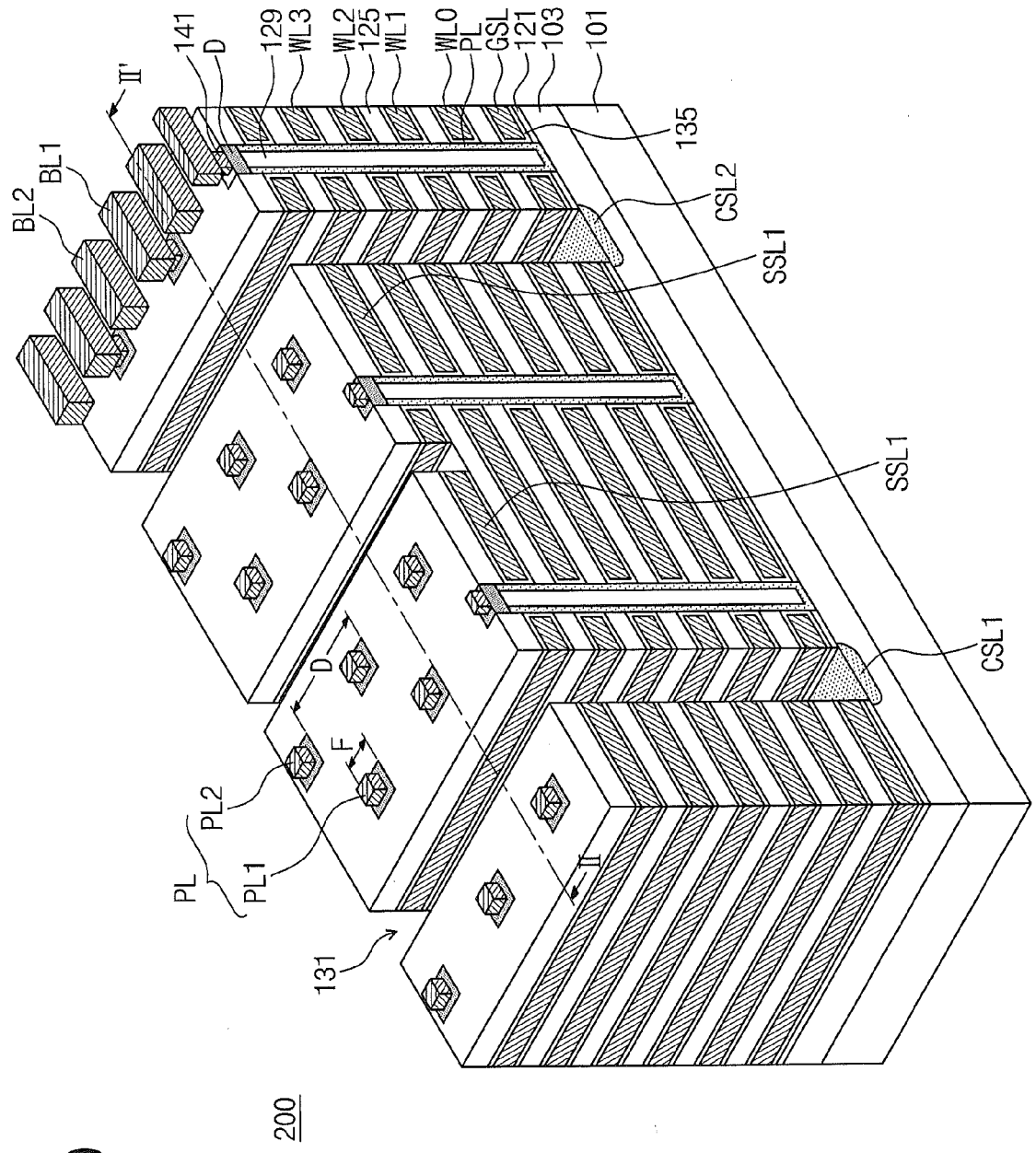
FIG. 10 is a perspective view illustrating a memory block of a nonvolatile memory device according to another embodiment of the inventive concept.

FIG. 10 is a perspective view of the memory block which has been described above with reference to FIGS. 1 and 2, and a nonvolatile memory device 200 according to another embodiment of the inventive concept will be described below with reference to FIG. 10. Repetitive description on the same technical feature as that of FIGS. 3 and 4 will be omitted, and only a difference will be described below.

Referring to FIG. 10, a first conductive well 103 may be provided in a substrate 101. A buffer dielectric layer 121 may be provided on the substrate 101. Insulation patterns 125 and conductive patterns, which are separated from each other by disposing the insulation patterns, may be provided on the buffer dielectric layer 121. The buffer dielectric layer 121 may be much thinner than the insulation patterns 125.

The conductive patterns may include a ground selection line GSL, string selection lines SSL1 and SSL2, and word lines WL0 to WL3 therebetween. The conductive patterns may have a line shape extended in the first direction.

An isolation region 131 extended in the first direction may be provided between the conductive patterns adjacent in the second direction. The common source lines CSL1 and CSL2 are provided in the well 103 under the isolation region 131. The common source lines CSL1 and CSL2 may be separated from each other and be extended in the first direction inside the well 103. The common source lines CSL1 and CSL2 may have a second conductive type different from the first conductive type.

A plurality of active pillars PL are provided to be connected to the well 103 of the substrate 101 through the conductive patterns GSL, WL0 to WL3 and SSL1 to SSL3. The active pillars PL may have a long axis that is vertically extended from the substrate 101. (i.e., that is extended in the third direction).

The active pillars PL are just adjacent and arranged to be alternately offset. The active pillars PL, which are just adjacent and are alternately offset, are arranged to be offset to each other in the second direction. For example, the active pillars PL may be arranged at first distances D in the first direction. The first distance D may be two times greater than the size F of the active pillars PL (i.e., D=2F). The active pillars PL may include first active pillars PL1 of a first line in the first direction, and second active pillars PL2 of a second line in the first direction, wherein the second active pillars PL2 are adjacent to the first line in the second direction. The second active pillars PL2 may be shifted by F (i.e., D/2) in the first direction from the first active pillars PL1. As illustrated in FIG. 10, the first and second active pillars PL1 and PL2 may be alternately provided in the second direction.

The first and second active pillars PL1 and PL2 may be connected to different bit lines. The bit lines may include first and second bit lines BL1 and BL2. The first bit line BL1, for example, may connect the first active pillars PL1 and be extended in the second direction. The second bit line BL2, for example, may connect the second active pillars PL2 and be extended in the second direction.

A plurality of active pillars, which are just adjacent and are alternately offset, may be electrically coupled to one string selection line extended in the first direction. Two string selection lines SSL1 and SSL2 may be provided between the first and second common source lines CSL1 and CSL2.

Figure 11:
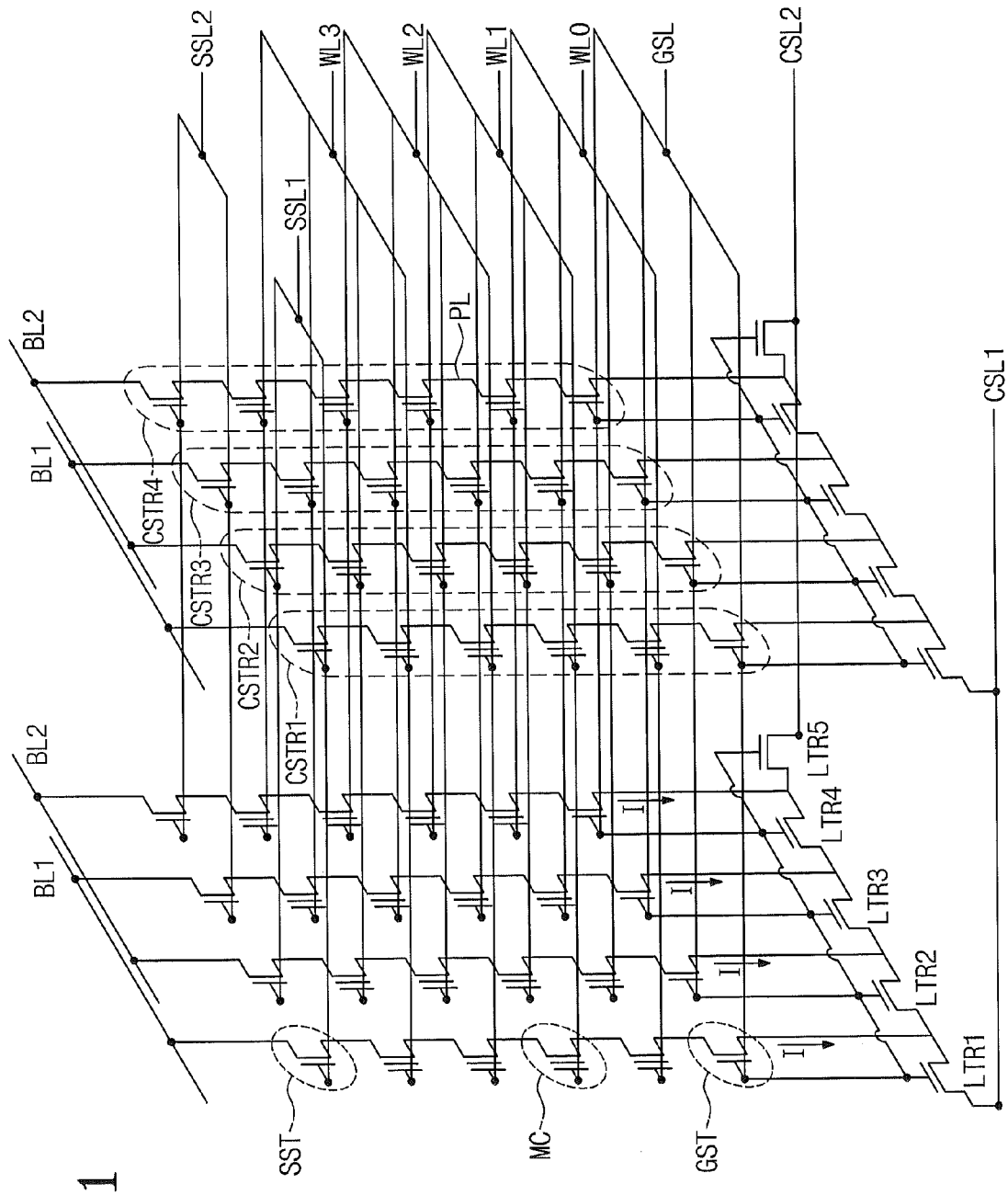
FIGS. 11 and 12 are circuit diagrams illustrating a memory block of a nonvolatile memory device according to another embodiment of the inventive concept.
Figure 12:
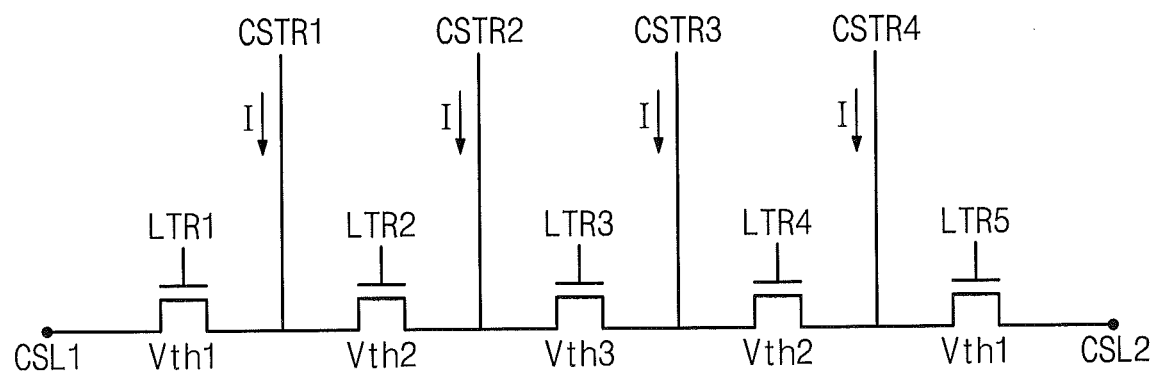

FIGS. 11 and 12 are circuit diagrams illustrating a memory block of a nonvolatile memory device according to another embodiment of the inventive concept. Repetitive description on the same technical feature as that of FIGS. 5 and 6 will be omitted, and only a difference will be described below.

Referring to FIG. 11, a nonvolatile memory device 200 according to another embodiment of the inventive concept may include a bit line BL, a plurality of word lines WL0 to WL3, a plurality of string selection lines SSL1 to SSL3, a ground selection line GSL, a first common source line CSL1 and a second common source line CSL2. The bit line may include first and second bit lines BL1 and BL2 which are adjacent to each other and extended in the second direction. A plurality of cell strings CSTR1 to CSTR4 are provided between the bit line BL and the first and second common source lines CSL1 and CSL2.

One cell string may include a string selection transistor SST connected to the bit line BL, a ground selection transistor GST connected to the first and second common source lines CSL1 and CSL2, and a plurality of memory cells MC provided between the string selection transistor SST and the ground selection transistor GST. The memory cells MC are provided at one active pillar. The gate of the ground selection transistor GST is connected to the ground selection line GSL. The gates of the memory cells MC are connected to the word lines WL0 to WL3.

Lateral transistors may be provided in the well 103 of the substrate 101 between the first and second common source lines CSL1 and CSL2. The lateral transistors may include first to fifth lateral transistors LTR1 to LTR5 that are connected in series. The gates of the first to fifth lateral transistors LTR1 to LTR5 are connected to the ground selection line GSL. That is, the ground selection transistor GST and the first to fifth lateral transistors LTR1 to LTR5 may share a gate.

Two cell strings, for example, the first and third cell strings CSTR1 and CSTR3 may be connected to the first bit line BL1 in common. Other two cell strings, for example, the two and fourth cell strings CSTR2 and CSTR4 may be connected to the second bit line BL2 in common. The first to fourth cell strings CSTR1 to CSTR4 may be provided between the first and second common source lines CSL1 and CSL2. Two cell strings, for example, the first and second cell strings CSTR1 and CSTR2 may be connected to the first string selection SSL1 in common. Other two cell strings, for example, the third and fourth cell strings CSTR3 and CSTR4 may be connected to the second string selection line SSL2 in common.

Referring to FIGS. 11 and 12, the sources of the first to fourth cell strings CSTR1 to CSTR4 may be connected between the first and second lateral transistors LTR1 and LTR2, between the second and third lateral transistors LTR2 and LTR3, between the third and fourth lateral transistors LTR3 and LTR4, and between the fourth and fifth lateral transistors LTR4 and LTR5, respectively. The first and fifth lateral transistors LTR1 and LTR5 may have a first threshold voltage Vth1, the second and fourth lateral transistors LTR2 and LTR4 may have a second threshold voltage Vth2, and the third lateral transistor LTR3 may have a third threshold voltage Vth3. The second and third threshold voltages Vth2 and Vth3 may be lower than the first threshold voltage Vth1. The third threshold voltage Vth3 may be equal to or lower than the second threshold voltage Vth2.

Most quantity of a current I passing through the first cell string CSTR1 may flow to the first common source line CSL1 through the first lateral transistor LTR1. The remain quantity of the current I passing through the first cell string CSTR1 may flow to the second common source line CSL2 through the second to fifth lateral transistors LTR2 to LTR5. Most quantity of a current I passing through the second cell string CSTR2 may flow to the first common source line CSL1 through the first and second lateral transistors LTR1 and LTR2. The remain quantity of the current I passing through the second cell string CSTR2 may flow to the second common source line CSL2 through the third to fifth lateral transistors LTR3 to LTR5. Most quantity of a current I passing through the third cell string CSTR3 may flow to the second common source line CSL2 through the fourth and fifth lateral transistors LTR4 and LTR5. The remain quantity of the current I passing through the third cell string CSTR3 may flow to the first common source line CSL1 through the first to third lateral transistors LTR1 to LTR3. Most quantity of a current I passing through the fourth cell string CSTR4 may flow to the second common source line CSL2 through the fifth lateral transistor LTR5. The remain quantity of the current I passing through the fourth cell string CSTR4 may flow to the first common source line CSL1 through the first to fourth lateral transistors LTR1 to LTR4.

As the second and third threshold voltages Vth2 and Vth3 are controlled to less than the first threshold voltage Vth1, a difference between currents I passing through the cell strings can decrease.

According to another embodiment of the inventive concept, moreover, the area of a memory cell is $5F^2$, and thus a degree of integration can increase. The number of bit lines selected by one string selection line, i.e., a page size can increase by two times compared to a typical nonvolatile memory device. Therefore, the nonvolatile memory device 200 according to another embodiment of the inventive concept can increase a programming and reading speed by two times compared to the typical nonvolatile memory device. The nonvolatile memory device 200 according to another embodiment of the inventive concept can decrease the number of control lines for controlling string selection lines by half compared to the typical nonvolatile memory device.

Figure 13A:
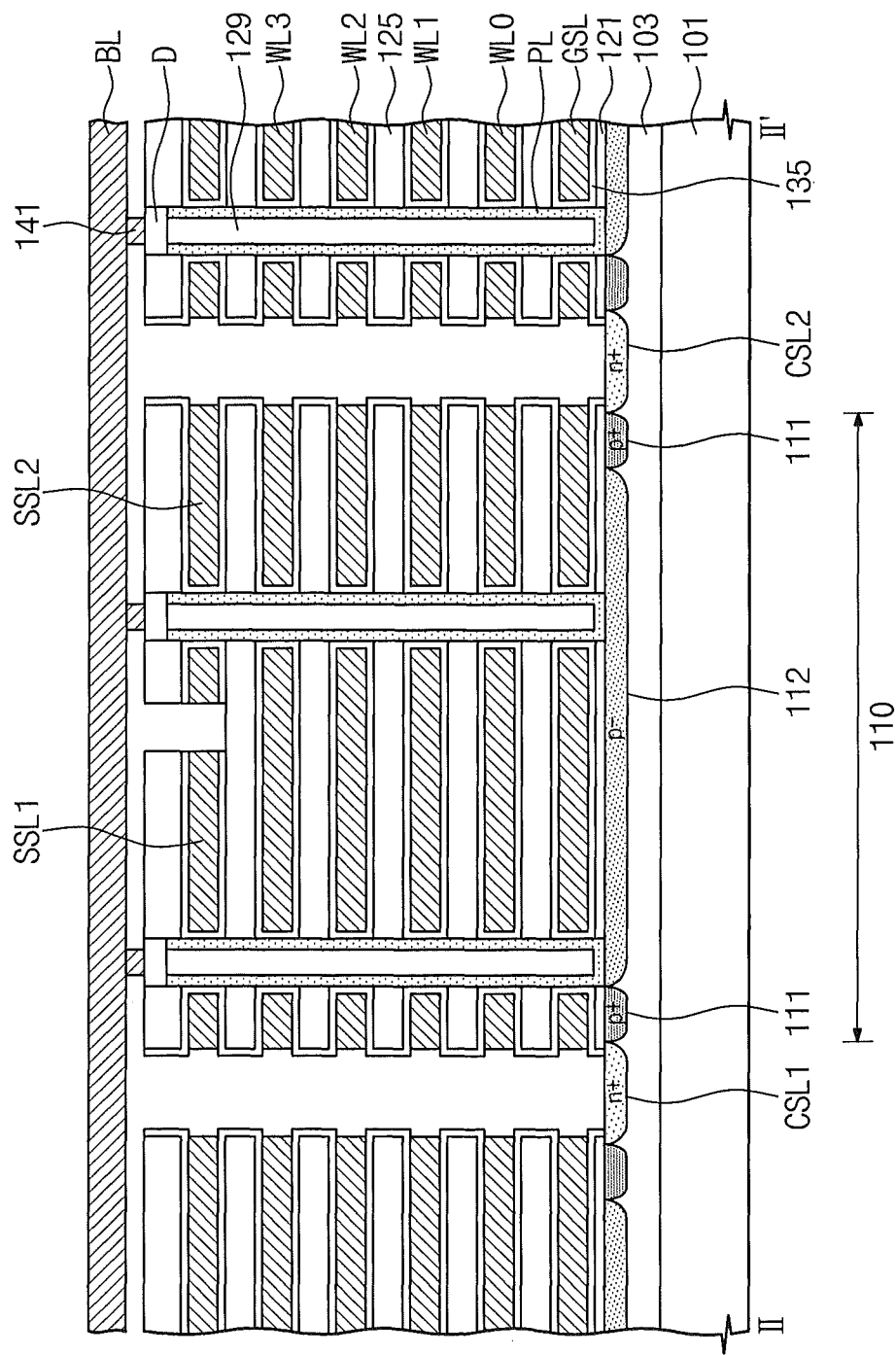
FIG. 13A is a cross-sectional view taken along line II-II' of FIG. 10, in an example of a nonvolatile memory device according to another embodiment of the inventive concept.
Figure 13B:
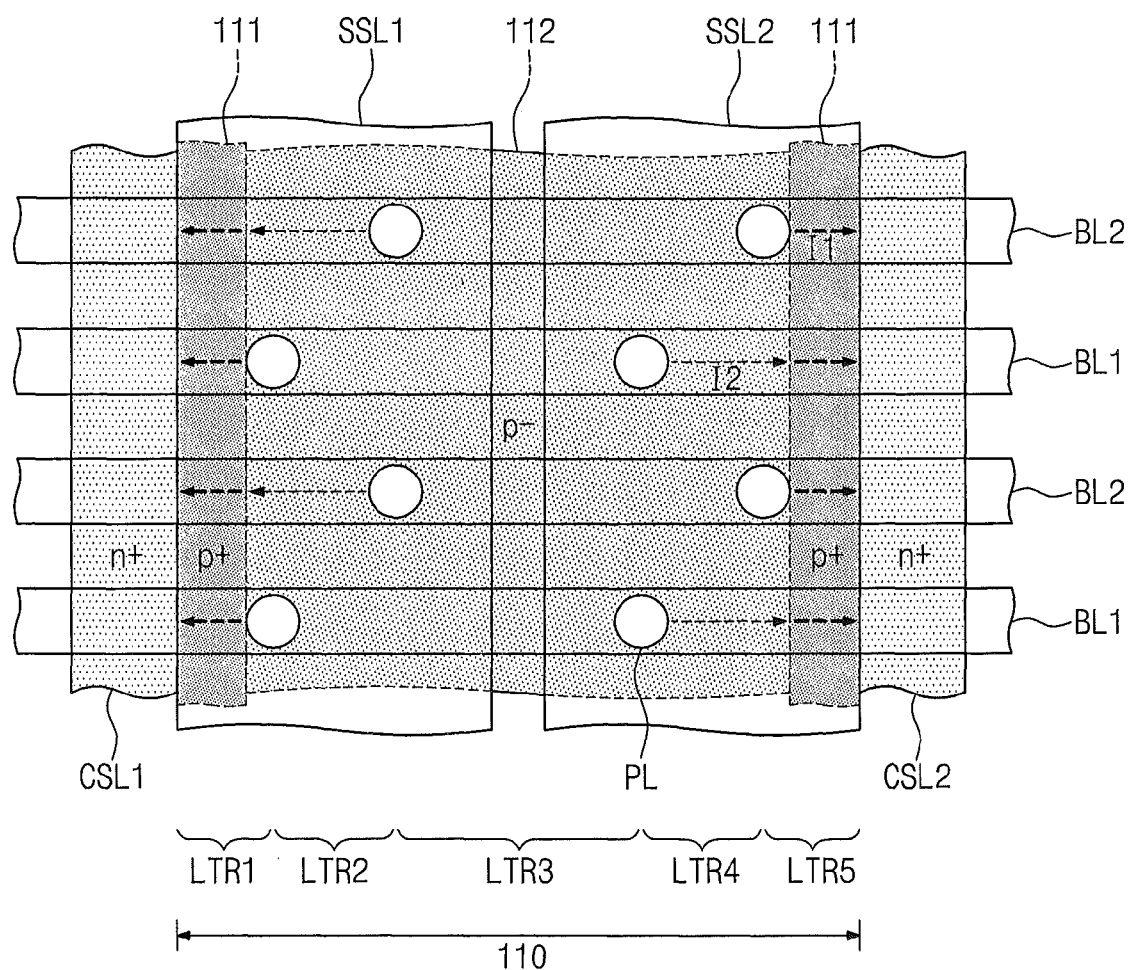
FIG. 13B is a plan view illustrating disposition of impurity regions which are doped on a well, in an example of a nonvolatile memory device according to another embodiment of the inventive concept.

FIGS. 13A and 13B illustrate an example of the nonvolatile memory device 200 according to another embodiment of the inventive concept. FIG. 13A is a cross-sectional view taken along line II-II' of FIG. 10. FIG. 13B is a plan view illustrating disposition of impurity regions which are doped on a well.

Referring to FIGS. 13A and 13B, a substrate channel region 110 is provided in the well 103 between the first and second common source lines CSL1 and CSL2. The substrate channel region 110 may include edge regions 111 that are adjacent to the first and second common source lines CSL1 and CSL2 and extended in the firs direction, and a middle region 112 between the edge regions 111. The edge regions 111 may be provided between the first and second common source lines CSL1 and CSL2 and active pillars most adjacent to the first and second common source lines CSL1 and CSL2.

The edge regions 111 and the middle region 112 may have the first conductive type. The edge regions 111 may have a first impurity doping concentration, and the middle region 112 may have a second impurity doping concentration lower than the first impurity doping concentration. The active pillars PL may contact the middle region 112.

FIGS. 12, 13A and 13B, the first to fifth lateral transistors LTR1 to LTR5 using the ground selection line GSL as a gate may be provided in the substrate channel region 110. The first and fifth lateral transistors LTR1 and LTR5 use the edge regions 111 as a channel. The second to forth lateral transistors LTR2 to LTR4 use the middle region 112 as a channel.

The first and fifth lateral transistors LTR1 and LTR5 of the edge regions 111 may have a first threshold voltage Vth1. The second and fourth lateral transistors LTR2 and LTR4 of the middle region 112 may have a second threshold voltage Vth2. The third lateral transistors LTR3 of the middle region 112 may have a third threshold voltage Vth3. Based on the above-described doping profile, the second threshold voltage Vth2 may be the same as the third threshold voltage Vth3. The second and third threshold voltages Vth2 and Vth3 may be lower than the first threshold voltage Vth1.

Therefore, a first current I1 from active pillars PL, which are separated by a first distance from the common source lines CSL1 and CSL2, to a common source line just adjacent to the active pillars PL may be the substantially same as a second current I2 from active pillars PL, which are separated by a second distance greater than the first distance from the common source lines CSL1 and CSL2, to a common source line adjacent to the active pillars PL. A current from the active pillars PL to a common source line that is not just adjacent to the active pillars PL may be low by an ignorable degree.

If the impurity doping concentration of the edge regions 111 is the same as that of the middle region 112, the second current I2 is inevitably lower than the first current I1. This is because a second distance from active pillars PL, which are not just adjacent to the edge regions 111, to the common source lines CSL1 and CSL2 is greater than a first distance from active pillars PL just adjacent to the edge regions 111 to the common source lines CSL1 and CSL2.

Due to the high concentration doping of the first conductive impurities of the edge regions 111, the current off characteristic of the ground selection line GSL is maintained, the influence of the second conductive impurity ion of the common source lines CSL1 and CSL2 being diffused into the middle region 112 can be reduced. Due to the low concentration doping of the first conductive impurities of the middle region 112, a cell current dispersion between active pillars that are separated by the first distance from the common source lines and active pillars that are separated by the second distance greater than the first distance from the common source lines can decrease.

Figure 14A:
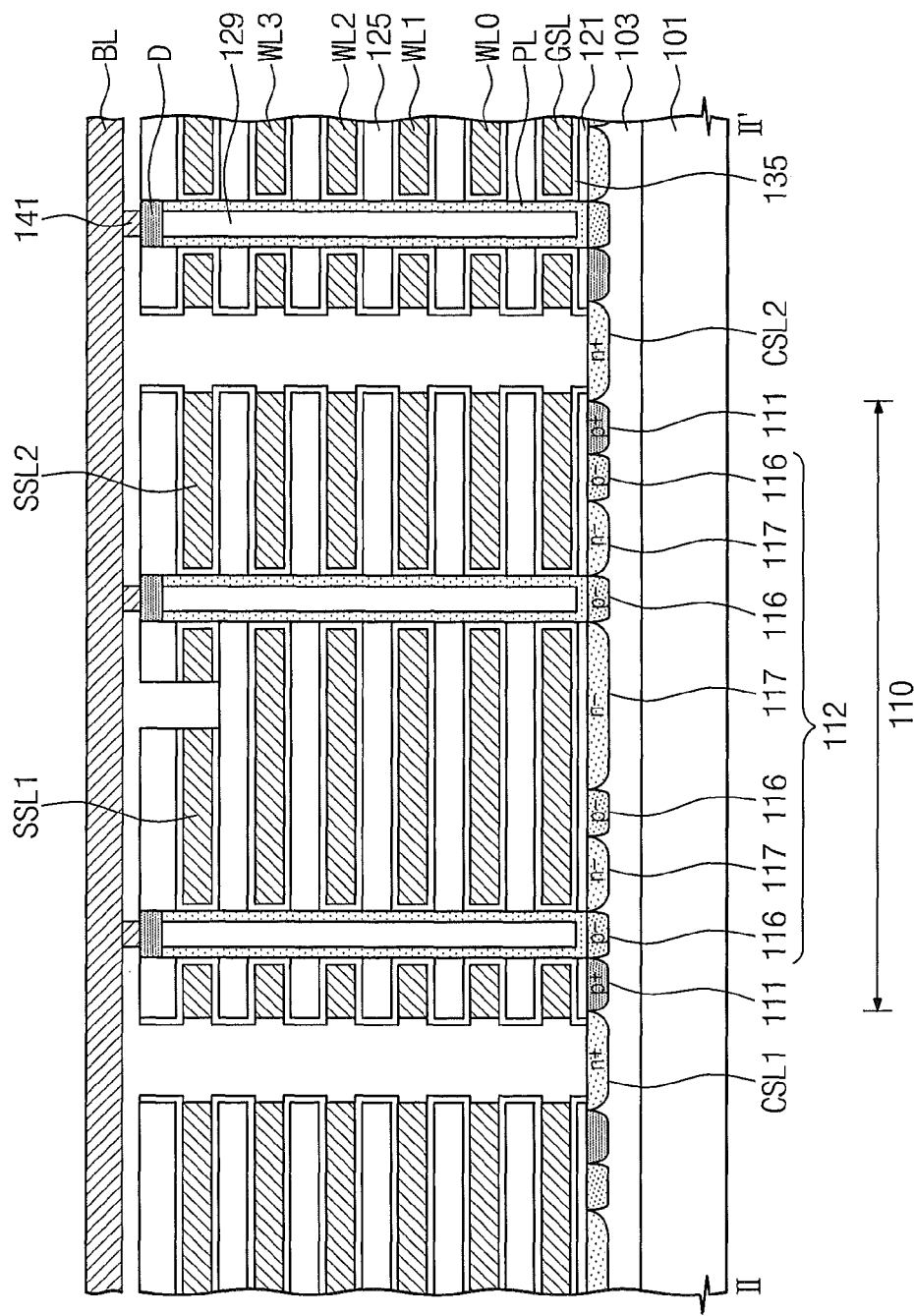
FIG. 14A is a cross-sectional view taken along line II-II' of FIG. 10, in another example of a nonvolatile memory device according to an embodiment of the inventive concept.
Figure 14B:
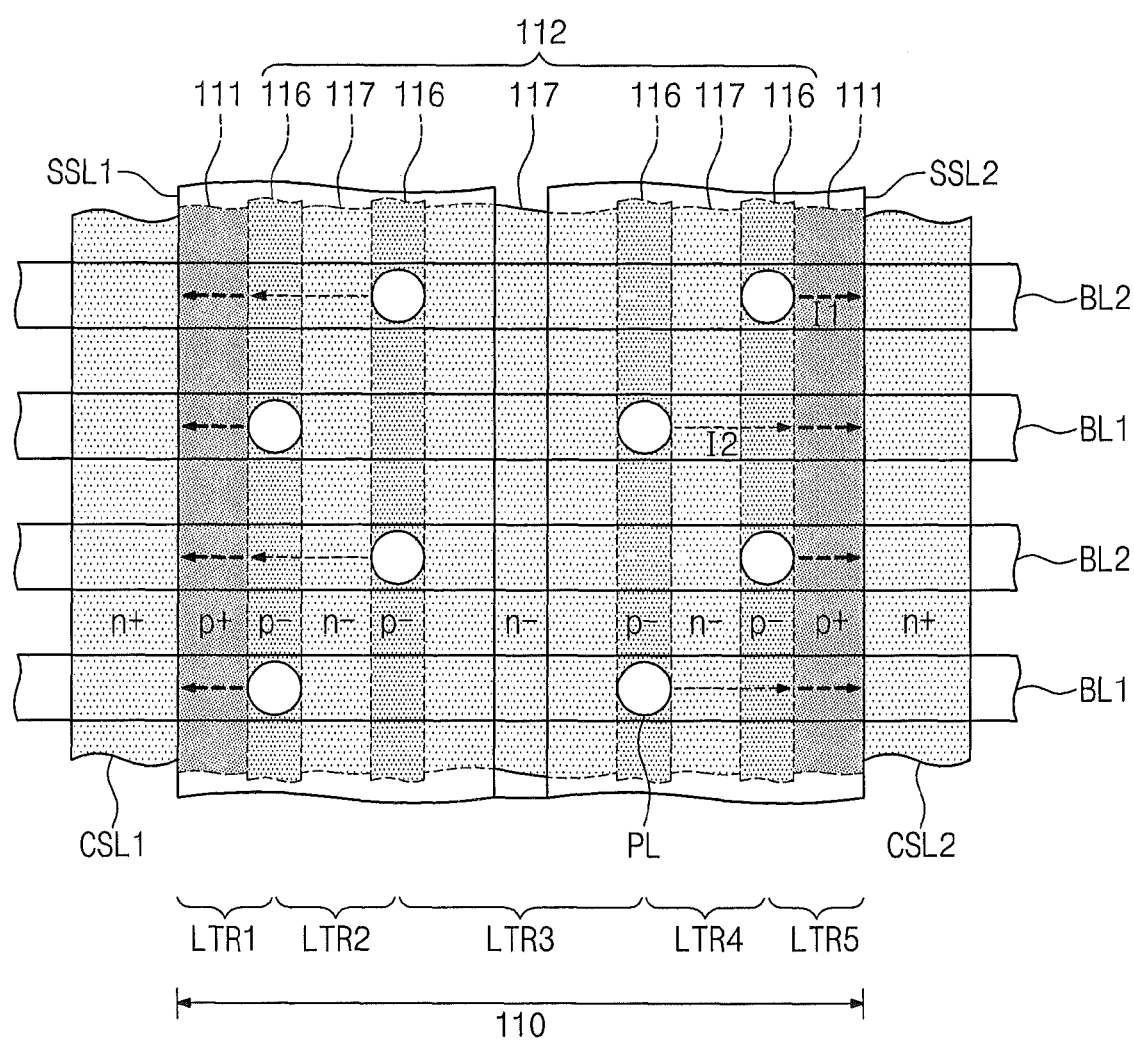
FIG. 14B is a plan view illustrating disposition of impurity regions which are doped on a well, in another example of a nonvolatile memory device according to another embodiment of the inventive concept.

FIGS. 14A and 14B illustrate another example of the nonvolatile memory device 200 according to another embodiment of the inventive concept. FIG. 14A is a cross-sectional view taken along line II-II' of FIG. 10. FIG. 14B is a plan view illustrating disposition of impurity regions which are doped on a well. Repetitive description on the same technical feature as that of FIGS. 13A and 13B will be omitted, and only a difference will be described below.

Referring to FIGS. 14A and 14B, the edge regions 111 may be edge regions 111 having the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. The third impurity regions 117 may have the second conductive type. On the other hand, the third impurity regions 117 may have the first conductive type, and a third impurity doping concentration lower than the second impurity doping concentration. The active pillars PL may contact the second impurity regions 116. The second impurity regions 116 may be extended in the second direction in which the active pillars PL are arranged. The third impurity regions 117 may be provided between the second impurity regions 116.

FIGS. 10, 14A and 14B, the first to fifth lateral transistors LTR1 to LTR5 using the ground selection line GSL as a gate may be provided in the substrate channel region 110. The first and fifth lateral transistors LTR1 and LTR5 may use the edge regions 111 as a channel. The second to fourth lateral transistors LTR2 to LTR4 may use the third impurity regions 117 as a channel.

The second and fourth lateral transistors LTR2 and LTR4 of the middle region 112 may have a second threshold voltage Vth2. The third lateral transistor LTR3 of the middle region 112 may have a third threshold voltage Vth3. Based on the above-described doping profile, the second threshold voltage Vth2 may be similar to the third threshold voltage Vth3. The second and third threshold voltages Vth2 and Vth3 may be lower than the first threshold voltage Vth1. The second and third threshold voltages Vth2 and Vth3 may be lower than that of the example which has been described above with reference to FIGS. 13A and 13B. The second to fourth lateral transistors LTR2 to LTR4 may always have a normally-on state.

Figure 15A:
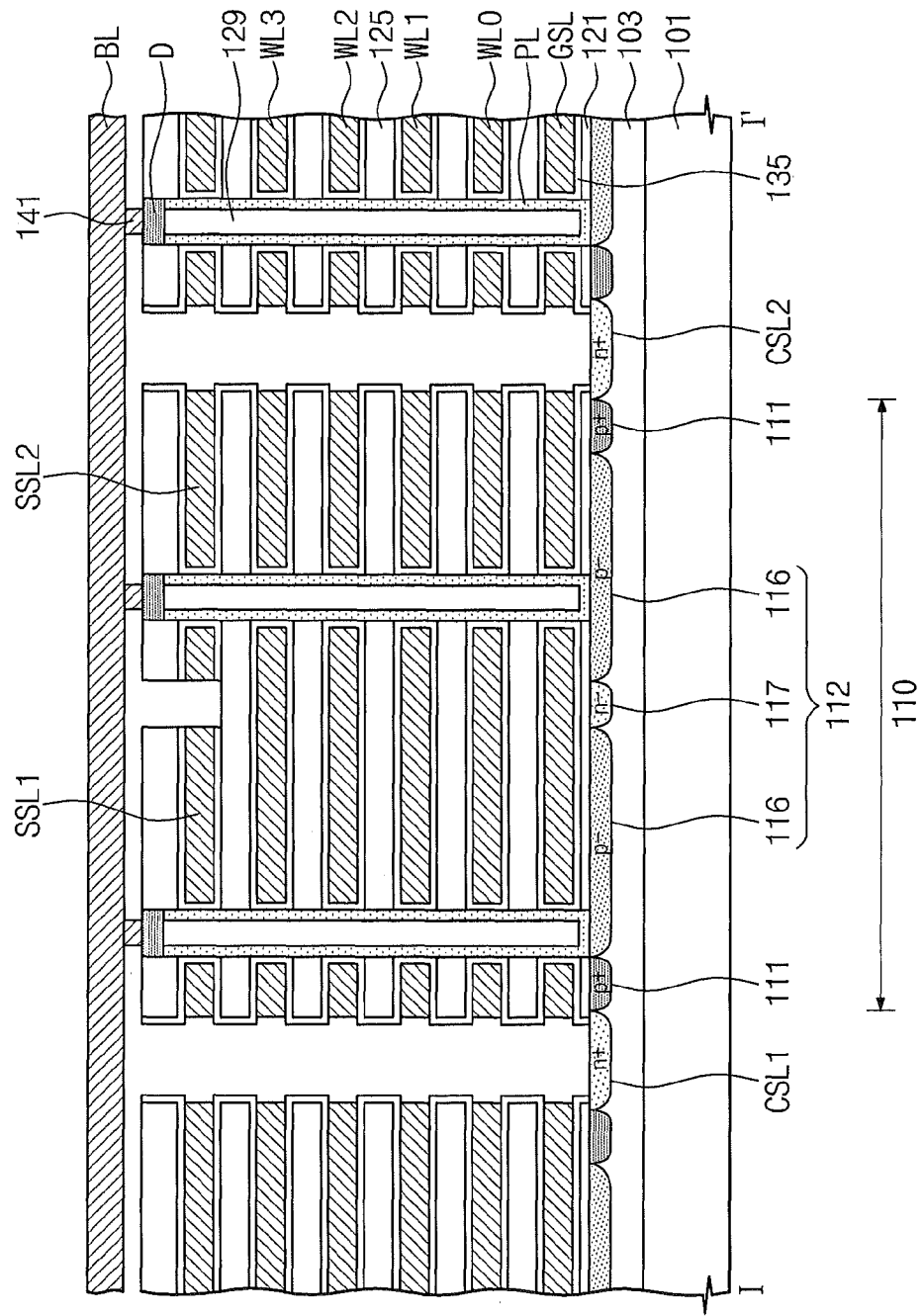
FIG. 15A is a cross-sectional view taken along line II-II' of FIG. 10, in another example of a nonvolatile memory device according to another embodiment of the inventive concept.
Figure 15B:
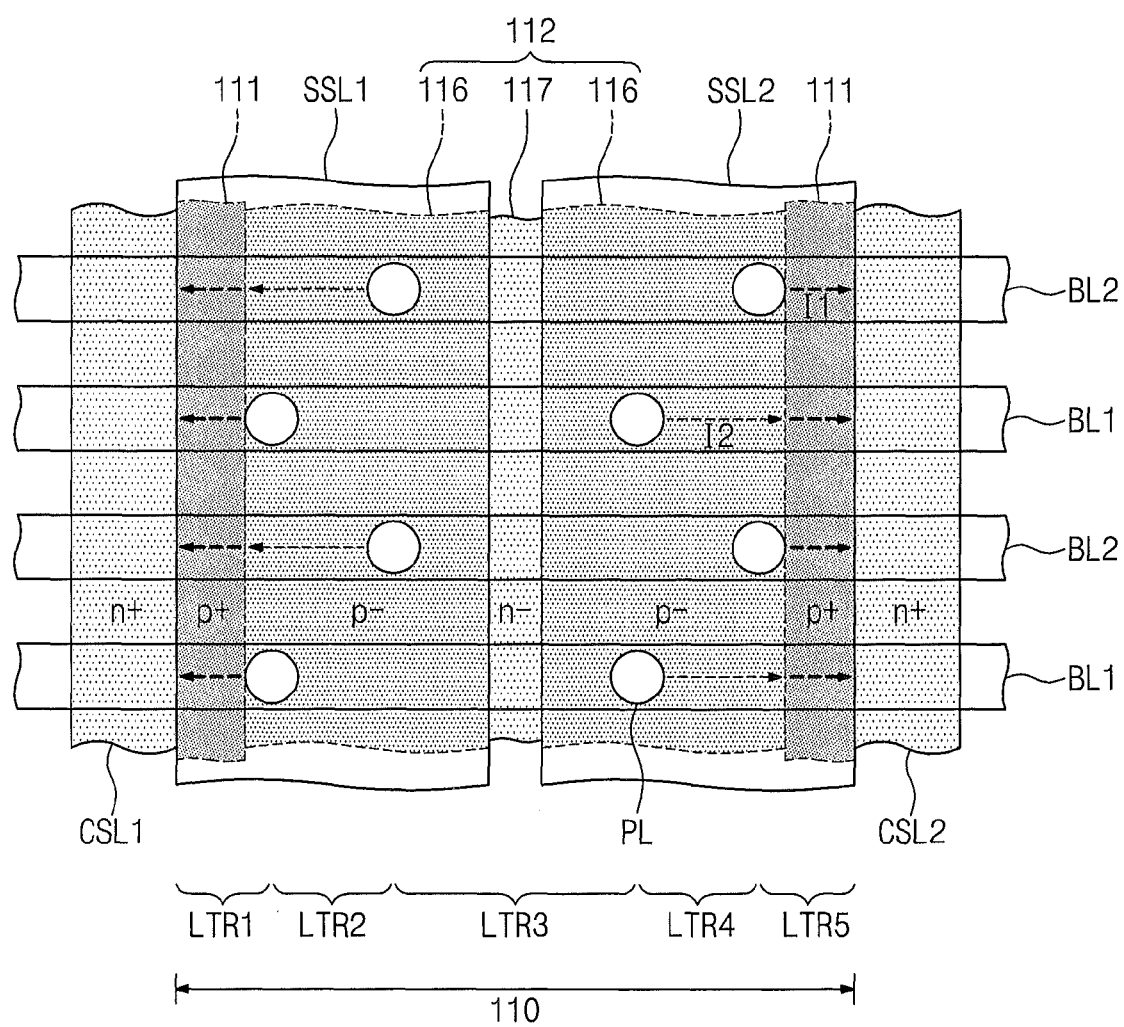
FIG. 15B is a plan view illustrating disposition of impurity regions which are doped on a well, in another example of a nonvolatile memory device according to another embodiment of the inventive concept.

FIGS. 15A and 15B illustrate another example of the non-volatile memory device 200 according to another embodiment of the inventive concept. FIG. 15A is a cross-sectional view taken along line II-II' of FIG. 10. FIG. 15B is a plan view illustrating disposition of impurity regions which are doped on a well. Repetitive description on the same technical feature as that of FIGS. 14A and 14B will be omitted, and only a difference will be described below.

Referring to FIGS. 15A and 15B, the edge regions 111 may have the first conductive type. The middle region 112 may have second impurity doping regions 116 having the first conductive type, and a third impurity region 117. The edge regions 111 may have a first impurity doping concentration, and the second impurity regions 116 may have a second impurity doping concentration lower than the first impurity doping concentration. The third impurity region 117 may have the second conductive type. On the other hand, the third impurity region 117 may have the first conductive type, and a third impurity doping concentration lower than the second impurity doping concentration.

The second impurity regions 116 may be provided to overlap with the string selection lines SSL1 to SSL3. The third impurity region 117 may be provided between the second impurity regions 116. The third impurity region 117 may overlap with a separated space between the string selection lines SSL1 and SSL2.

Figure 16:
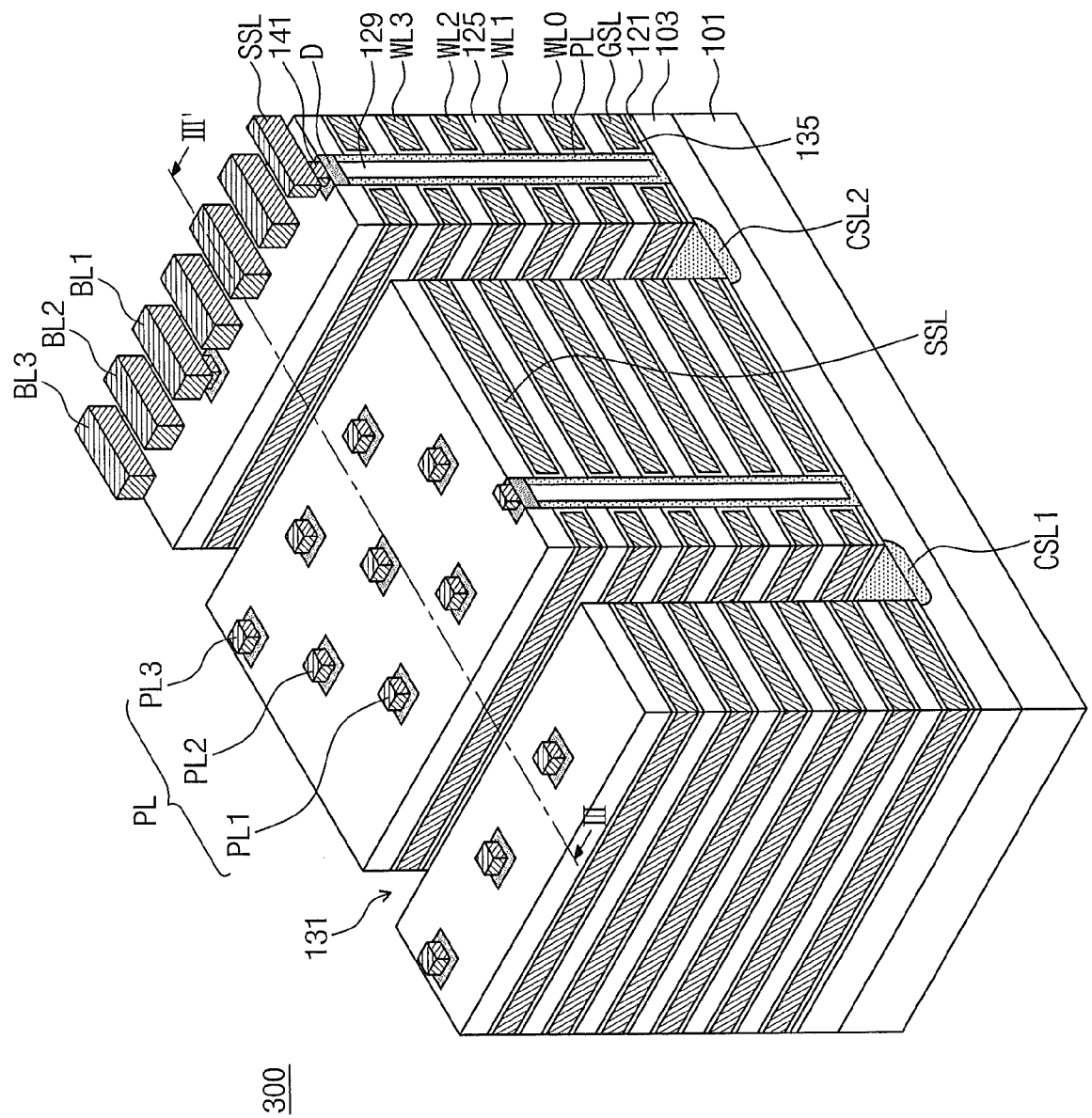
FIG. 16 is a perspective view illustrating a memory block of a nonvolatile memory device according to another embodiment of the inventive concept.

FIGS. 16, 15A and 15B, the first to fifth lateral transistors LTR1 to LTR5 using the ground selection line GSL as a gate may be provided in the substrate channel region 110. The first and fifth lateral transistors LTR1 and LTR5 may use the edge regions 111 as a channel. The second and fourth lateral transistors LTR2 and LTR4 may use the second impurity regions 116 as a channel. The third lateral transistor LTR3 may use the second and third impurity regions 116 and 117 as a channel.

The first and fifth lateral transistors LTR1 and LTR5 of the edge regions 111 may have a first threshold voltage Vth1. The second and fourth lateral transistors LTR2 and LTR4 of the middle region 112 may have a second threshold voltage Vth2. The third lateral transistors LTR3 of the middle region 112 may have a third threshold voltage Vth3. Based on the above-described doping profile, the second threshold voltage Vth2 may be lower than the first threshold voltage Vth1. The third threshold voltage Vth3 may be lower than the second threshold voltage Vth2.

FIG. 16 is a perspective view of the memory block which has been described above with reference to FIGS. 1 and 2, and a nonvolatile memory device 300 according to another embodiment of the inventive concept will be described below with reference to FIG. 16. Repetitive description on the same technical feature as that of FIGS. 3 and 4 will be omitted, and only a difference will be described below.

Referring to FIG. 16, a first conductive well 103 may be provided in a substrate 101. A buffer dielectric layer 121 may be provided on the substrate 101. Insulation patterns 125 and conductive patterns, which are separated from each other by disposing the insulation patterns, may be provided on the buffer dielectric layer 121. The buffer dielectric layer 121 may be much thinner than the insulation patterns 125.

The conductive patterns may include a ground selection line GSL, a string selection line SSL, and word lines WL0 to WL3 therebetween. The conductive patterns may have a line shape extended in the first direction.

An isolation region 131 expanded in the first direction may be provided between the conductive patterns adjacent in the second direction. The common source lines CSL1 and CSL2 are provided in the well 103 under the isolation region 131. The common source lines CSL1 and CSL2 may be separated from each other and be extended in the first direction inside the well 103. The common source lines CSL1 and CSL2 may have a second conductive type different from the first conductive type.

A plurality of active pillars PL are provided to be connected to the well 103 of the substrate 101 through the conductive patterns GSL, WL0 to WL3 and SSL1 to SSL3. The active pillars PL may have a long axis that is vertically extended from the substrate 101. (i.e., that is extended in the third direction).

The active pillars PL are just adjacent and arranged to be alternately offset. The active pillars PL, which are just adjacent and are alternately offset, are arranged to be offset to each other in the first direction. For example, the active pillars PL may be arranged at first distances D along a plurality of lines in the first direction. The first distance D may be two times greater than the size F of the active pillars PL (i.e., D=2F). In FIG. 16, for convenience, the first distance D is exaggeratedly illustrated. The active pillars PL may include first active pillars PL1 of a first line in the first direction, second active pillars PL2 of a second line in the first direction, and third active pillars PL3 of a third line in the first direction, wherein the second active pillars PL2 are separated from and adjacent to the first line, and the third active pillars PL3 are separated from and adjacent to the third line. The second active pillars PL2 may be shifted by 2F/3 (i.e., D/3) in the first direction from the first active pillars PL1. The third active pillars PL3 may be shifted by 2F/3 (i.e., D/3) in the first direction from the second active pillars PL2. As illustrated in FIG. 16, the first to third active pillars PL1 to PL3 may be repeatedly provided in the second direction intersecting the first direction. Other active pillars, which are shifted by 2F/3 (i.e., D/3) in the first direction from the third active pillars PL3, may be aligned with the first active pillars PL1 in the first direction.

The first to third active pillars PL1 to PL3 may be connected to different bit lines. The bit lines may include first to third bit lines BL1 to BL3. The first bit line BL1, for example, may connect the first active pillars PL1 and be extended in the second direction. The second bit line BL2, for example, may connect the second active pillars PL2 and be extended in the second direction. The third bit line BL3, for example, may connect the third active pillars PL3 and be extended in the second direction.

A plurality of active pillars, which are just adjacent and are alternately offset, may be electrically coupled to one string selection line extended in the first direction. One string selection line SSL may be provided between the first and second common source lines CSL1 and CSL2.

Figure 17:
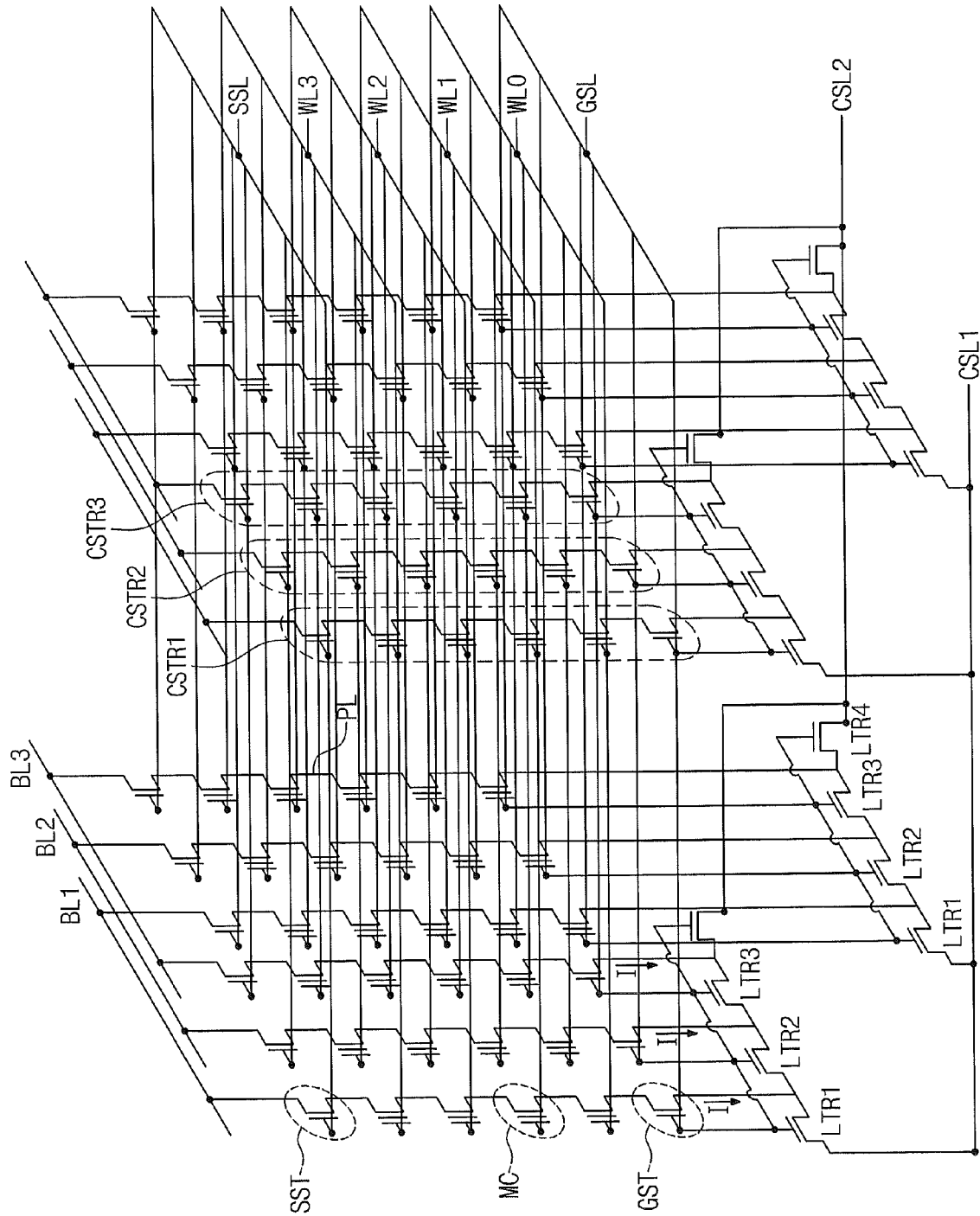
FIGS. 17 and 18 are circuit diagrams illustrating a memory block of a nonvolatile memory device according to another embodiment of the inventive concept.
Figure 18:
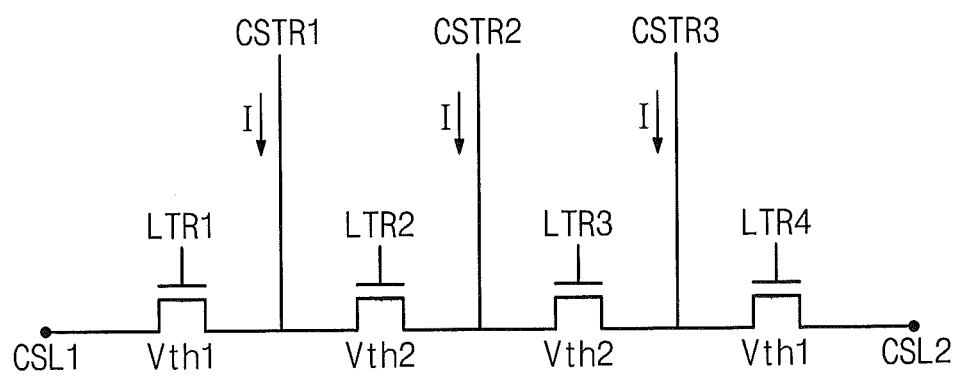

FIGS. 17 and 18 are circuit diagrams illustrating a memory block of a nonvolatile memory device according to another embodiment of the inventive concept. Repetitive description on the same technical feature as that of FIGS. 5 and 6 will be omitted, and only a difference will be described below.

Referring to FIG. 17, a nonvolatile memory device 300 according to another embodiment of the inventive concept may include a bit line, a plurality of word lines WL0 to WL3, a plurality of string selection lines SSL1 to SSL3, a ground selection line GSL, a first common source line CSL1 and a second common source line CSL2. The bit line may include first and second bit lines BL1 and BL2 which are adjacent to each other and extended in the second direction. A plurality of cell strings CSTR1 to CSTR3 are provided between the bit line and the first and second common source lines CSL1 and CSL2.

One cell string may include a string selection transistor SST connected to the bit line, a ground selection transistor GST connected to the first and second common source lines CSL1 and CSL2, and a plurality of memory cells MC provided between the string selection transistor SST and the ground selection transistor GST. The memory cells MC are provided at one active pillar. The gate of the ground selection transistor GST is connected to the ground selection line GSL. The gates of the memory cells MC are connected to the word lines WL0 to WL3. The gate of the string selection transistor SST is connected to the string selection line SSL.

Lateral transistors may be provided in the well 103 of the substrate 101 between the first and second common source lines CSL1 and CSL2. The lateral transistors may include first to fourth lateral transistors LTR1 to LTR4 that are connected in series. The gates of the first to fourth lateral transistors LTR1 to LTR4 are connected to the ground selection line GSL. That is, the ground selection transistor GST and the first to fourth lateral transistors LTR1 to LTR4 may share a gate.

The first to third cell strings CSTR1 to CSTR3 may be connected to different bit lines, respectively. The first to third cell strings CSTR1 to CSTR3 may be provided between the first and second common source lines CSL1 and CSL2. Three cell strings, for example, the first to third cell strings CSTR1 to CSTR3 may be connected to the string selection line SSL in common.

Referring to FIGS. 17 and 18, the sources of the first to third cell strings CSTR1 to CSTR3 may be connected between the first and second lateral transistors LTR1 and LTR2, between the second and third lateral transistors LTR2 and LTR3, and between the third and fourth lateral transistors LTR3 and LTR4, respectively. The first and fourth lateral transistors LTR1 and LTR4 may have a first threshold voltage Vth1, and the second and third lateral transistors LTR2 and LTR3 may have a second threshold voltage Vth2. The second threshold voltages Vth2 may be lower than the first threshold voltage Vth1.

Most quantity of a current I passing through the first cell string CSTR1 may flow to the first common source line CSL1 through the first lateral transistor LTR1. The remain quantity of the current I passing through the first cell string CSTR1 may flow to the second common source line CSL2 through the second to fourth lateral transistors LTR2 to LTR4. A current I passing through the second cell string CSTR2 may flow to the first common source line CSL1 through the first and second lateral transistors LTR1 and LTR2, and flow to the second common source line CSL2 through the third and fourth lateral transistors LTR3 and LTR4. Most quantity of a current I passing through the third cell string CSTR3 may flow to the second common source line CSL2 through the fourth lateral transistor LTR4. The remain quantity of the current I passing through the third cell string CSTR3 may flow to the first common source line CSL1 through the first to third lateral transistors LTR1 to LTR3.

As the second threshold voltage Vth2 is controlled to less than the first threshold voltage Vth1, a difference between currents I passing through the cell strings can decrease.

According to another embodiment of the inventive concept, moreover, the area of a memory cell is $4.7F^2$, and thus a degree of integration can increase. According to another embodiment of the inventive concept, the number of bit lines selected by one string selection line, i.e., a page size can increase by three times compared to a typical nonvolatile memory device. Therefore, the nonvolatile memory device 300 according to another embodiment of the inventive concept can increase a programming and reading speed by three times compared to the typical nonvolatile memory device. The nonvolatile memory device 300 according to another embodiment of the inventive concept can decrease the number of control lines for controlling string selection lines by one-third compared to the typical nonvolatile memory device.

Figure 19A:
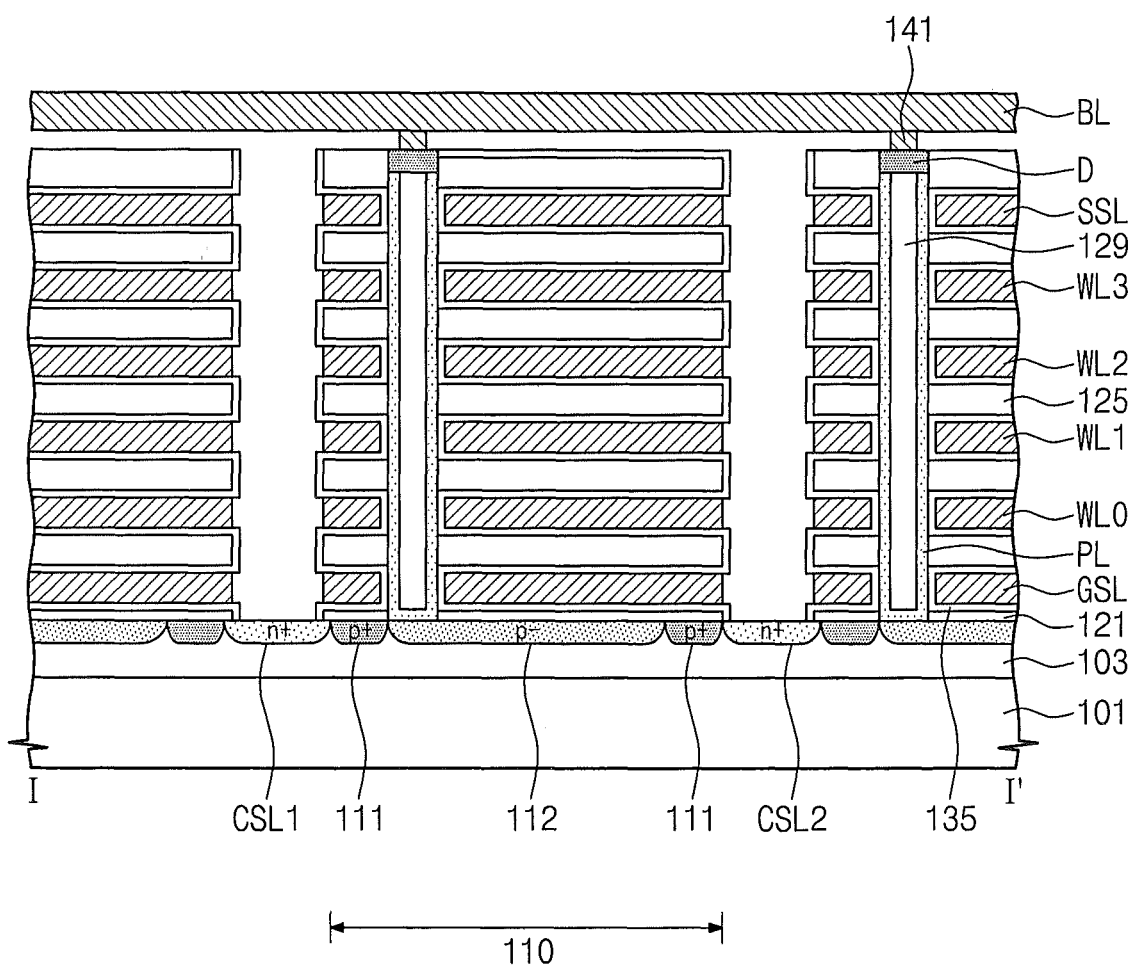
FIG. 19A is a cross-sectional view taken along line II'-III' of FIG. 16, in an example of a nonvolatile memory device according to another embodiment of the inventive concept.
Figure 19B:
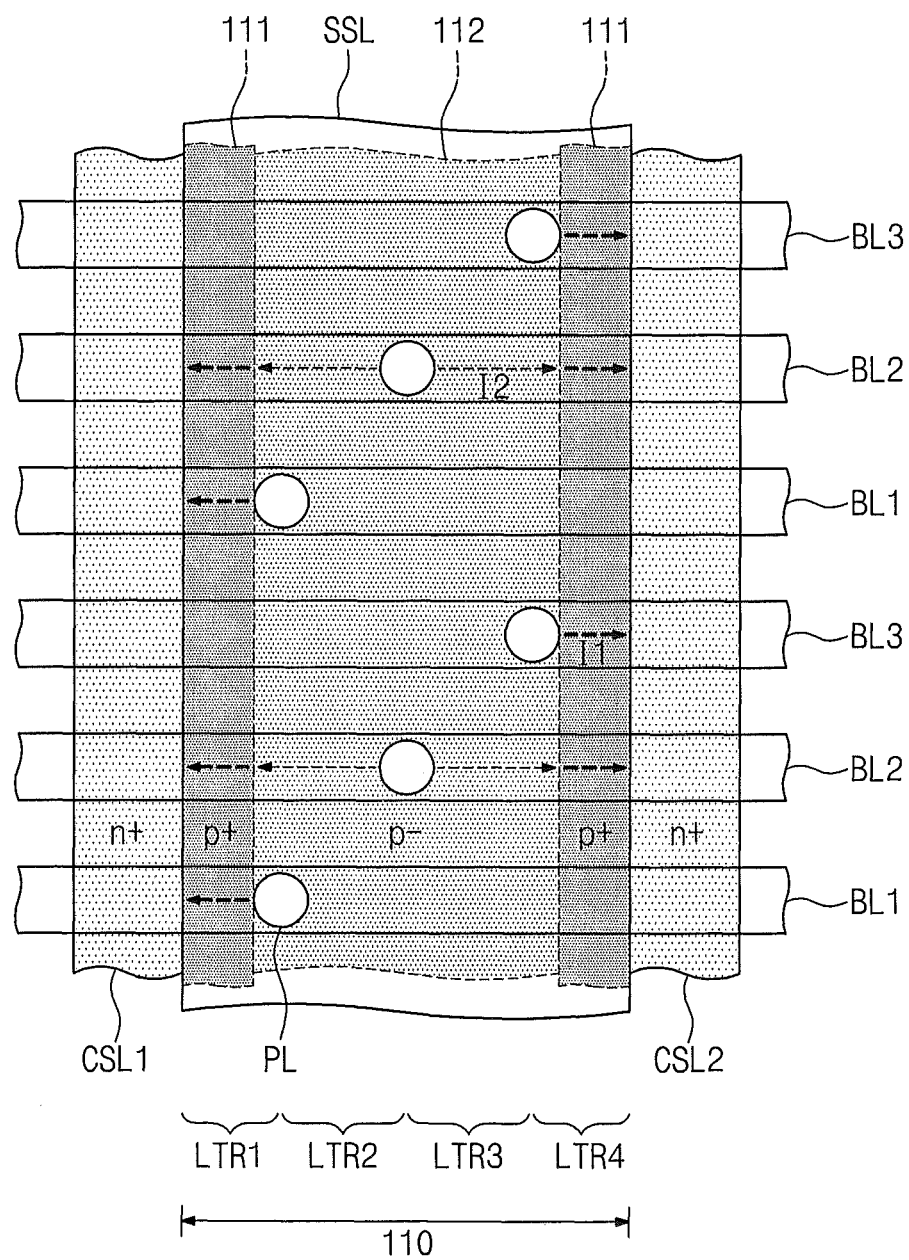
FIG. 19B is a plan view illustrating disposition of impurity regions which are doped on a well, in an example of a nonvolatile memory device according to another embodiment of the inventive concept.

FIGS. 19A and 19B illustrate an example of the nonvolatile memory device 300 according to another embodiment of the inventive concept. FIG. 19A is a cross-sectional view taken along line III-III' of FIG. 16. FIG. 19B is a plan view illustrating disposition of impurity regions which are doped on a well.

Referring to FIGS. 19A and 19B, a substrate channel region 110 is provided in the well 103 between the first and second common source lines CSL1 and CSL2. The substrate channel region 110 may include edge regions 111 that are adjacent to the first and second common source lines CSL1 and CSL2 and extended in the firs direction, and a middle region 112 between the edge regions 111. The edge regions 111 may be provided between the first and second common source lines CSL1 and CSL2 and active pillars most adjacent to the first and second common source lines CSL1 and CSL2.

The edge regions 111 and the middle region 112 may have the first conductive type. The edge regions 111 may have a first impurity doping concentration, and the middle region 112 may have a second impurity doping concentration lower than the first impurity doping concentration. The active pillars PL may contact the middle region 112.

FIGS. 16, 19A and 19B, the first to fourth lateral transistors LTR1 to LTR4 using the ground selection line GSL as a gate may be provided in the substrate channel region 110. The first and fourth lateral transistors LTR1 and LTR4 use the edge regions 111 as a channel. The second and third lateral transistors LTR2 and LTR3 use the middle region 112 as a channel.

The first and fourth lateral transistors LTR1 and LTR4 of the edge regions 111 may have a first threshold voltage Vth1. The second and third lateral transistors LTR2 and LTR3 of the middle region 112 may have a second threshold voltage Vth2. The second threshold voltage Vth2 may be lower than the first threshold voltage Vth1. Therefore, a first current I1 from active pillars PL, which are separated by a first distance from the common source lines CSL1 and CSL2, to a common source line just adjacent to the active pillars PL may be the substantially same as a second current I2 from active pillars PL, which are separated by a second distance greater than the first distance from the common source lines CSL1 and CSL2, to a common source line adjacent to the active pillars PL. A current from the active pillars PL to a common source line that is not just adjacent to the active pillars PL may be low by an ignorable degree.

If the impurity doping concentration of the edge regions 111 is the same as that of the middle region 112, the second current I2 is inevitably lower than the first current I1. This is because a second distance from active pillars PL, which are not just adjacent to the edge regions 111, to the common source lines CSL1 and CSL2 is greater than a first distance from active pillars PL just adjacent to the edge regions 111 to the common source lines CSL1 and CSL2.

Due to the high concentration doping of the first conductive impurities of the edge regions 111, the current off characteristic of the ground selection line GSL is maintained, the influence of the second conductive impurity ion of the common source lines CSL1 and CSL2 being diffused into the middle region 112 can be reduced. Due to the low concentration doping of the first conductive impurities of the middle region 112, a cell current dispersion between active pillars that are separated by the first distance from the common source lines and active pillars that are separated by the second distance greater than the first distance from the common source lines can decrease.

Figure 20A:
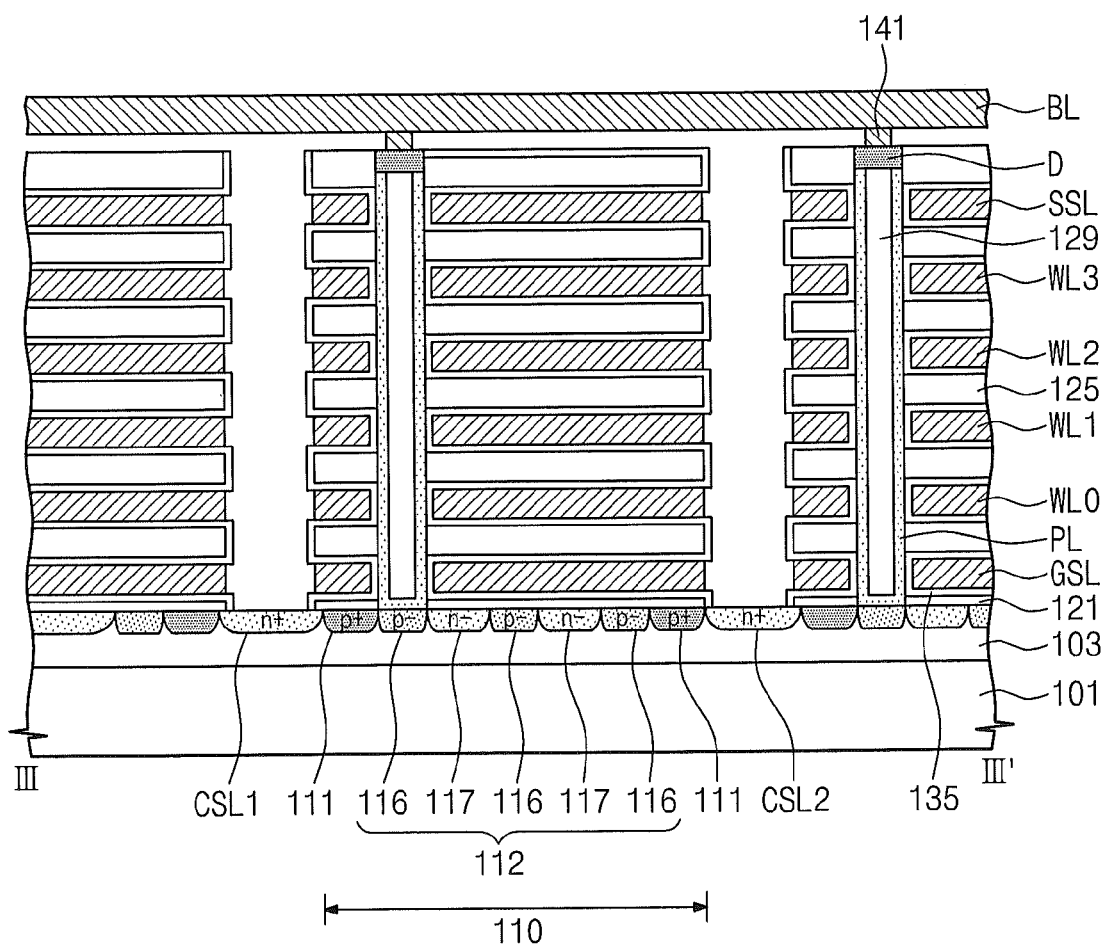
FIG. 20A is a cross-sectional view taken along line of FIG. 16, in another example of a nonvolatile memory device according to another embodiment of the inventive concept.
Figure 20B:
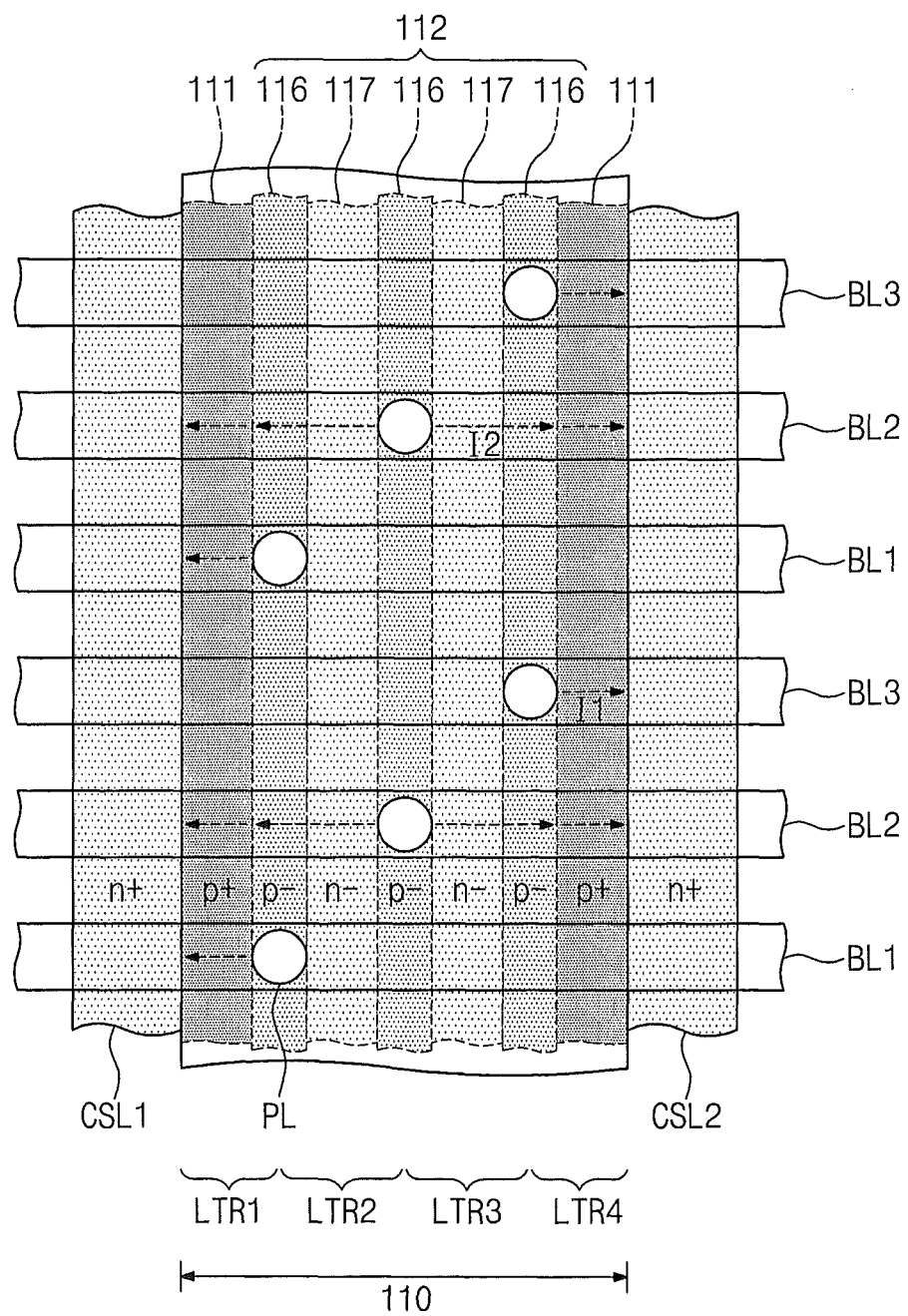
FIG. 20B is a plan view illustrating disposition of impurity regions which are doped on a well, in another example of a nonvolatile memory device according to another embodiment of the inventive concept.

FIGS. 20A and 20B illustrate another example of the nonvolatile memory device 300 according to another embodiment of the inventive concept. FIG. 20A is a cross-sectional view taken along line III-III' of FIG. 16. FIG. 20B is a plan view illustrating disposition of impurity regions which are doped on a well. Repetitive description on the same technical feature as that of FIGS. 19A and 19B will be omitted, and only a difference will be described below.

Referring to FIGS. 20A and 20B, the edge regions 111 may have the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. The third impurity regions 117 may have the second conductive type. On the other hand, the third impurity regions 117 may have the first conductive type, and a third impurity doping concentration lower than the second impurity doping concentration. The active pillars PL may contact the second impurity regions 116. The second impurity regions 116 may be extended in the second direction in which the active pillars PL are arranged. The third impurity regions 117 may be provided between the second impurity regions 116.

FIGS. 16, 20A and 20B, the first to fourth lateral transistors LTR1 to LTR4 using the ground selection line GSL as a gate may be provided in the substrate channel region 110. The first and fourth lateral transistors LTR1 and LTR4 may use the edge regions 111 as a channel. The second and third lateral transistors LTR2 and LTR3 may use the third impurity regions 117 as a channel.

The first and fourth lateral transistors LTR1 and LTR4 of the edge regions 111 may have a first threshold voltage Vth1. The second and third lateral transistor LTR2 and LTR3 of the middle region 112 may have a second threshold voltage Vth2. Based on the above-described doping profile, the second threshold voltage Vth2 may be lower than the first threshold voltage Vth1.

The nonvolatile memory devices according to embodiments of the inventive concept may be a NAND type flash memory device in which memory cells provided in one active pillar configure one cell string.

A method of forming the nonvolatile memory device according to the above-described embodiments of the inventive concept will be described below as an example.

FIGS. 21A to 21H illustrate an example of a method of forming the nonvolatile memory device according to an embodiment of the inventive concept which has been described above with reference to FIG. 7B, and are cross-sectional views corresponding to line I-I' of FIG. 3.

Figure 21A:
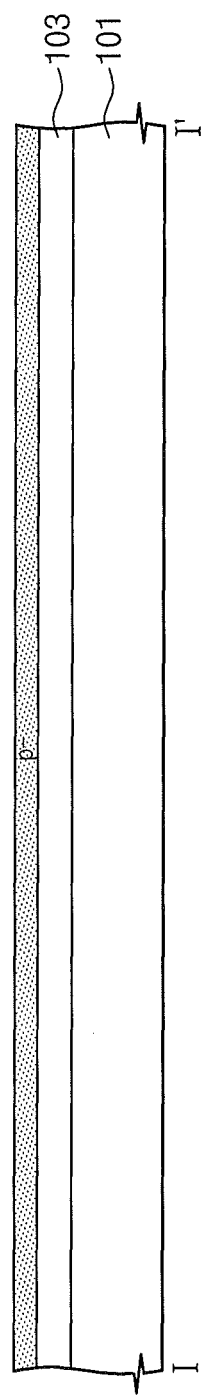
FIGS. 21A to 21F illustrate an example of a method of forming the nonvolatile memory device according to an embodiment of the inventive concept which will be described below with reference to FIG. 7B, and are cross-sectional views corresponding to line I-I' of FIG. 3.

Referring to FIG. 21A, a substrate 101 is provided. A well 103 may be formed by providing a first conductive impurity ion into the substrate 101. The well 103 may be formed in an impurity ion injecting process. A first conductive impurity ion P− for controlling the threshold voltage of the lateral transistors is provided in the cell region of the well 103 at a first concentration.

Figure 21B:
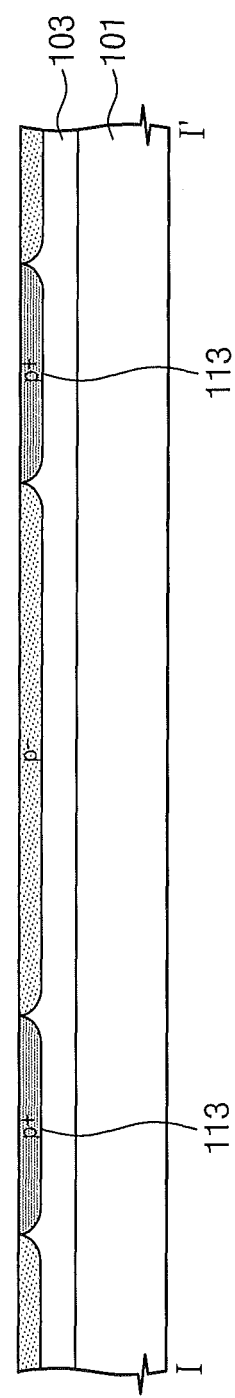

Referring to FIG. 21B, the first conductive impurity ion is provided in first regions 113 including a region in which the common source line of the nonvolatile memory device is formed and a region adjacent to the region, at a second concentration higher than the first concentration. The first regions 113 may be extended in the first direction.

Figure 21C:
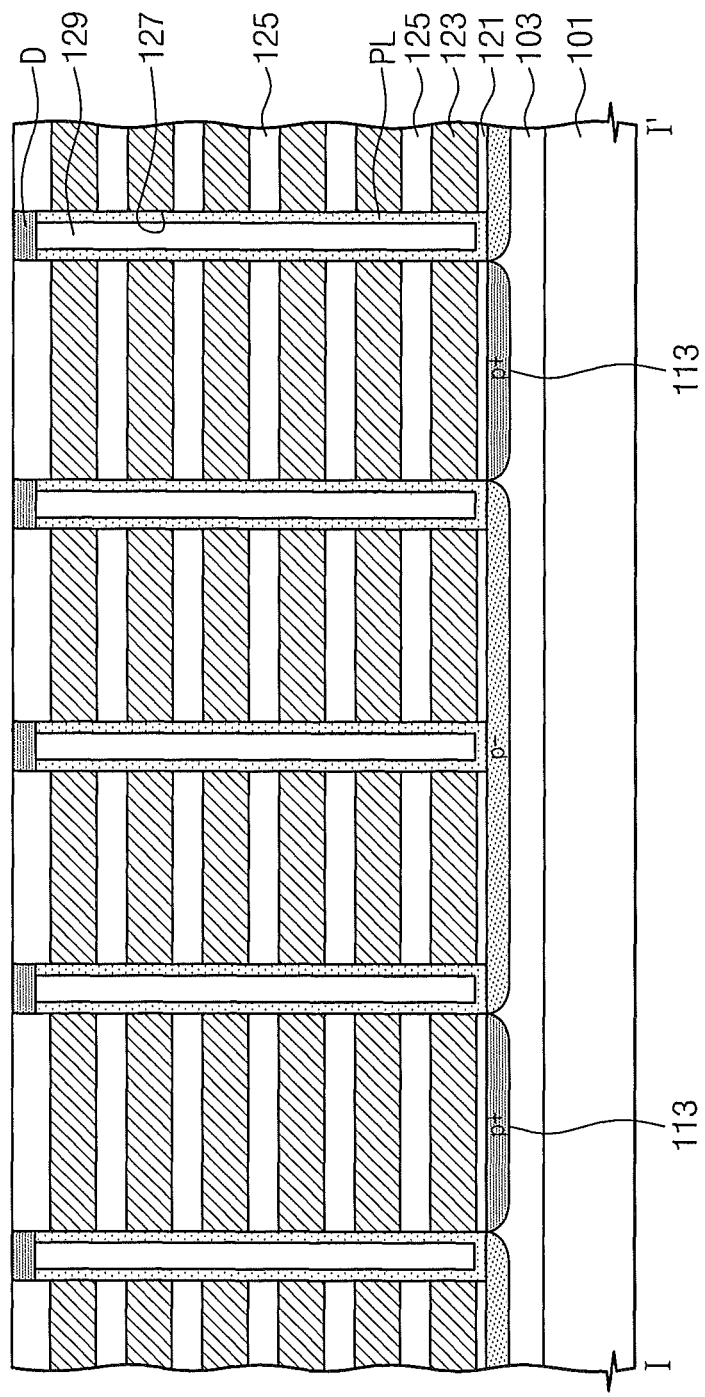

Referring to FIG. 21C, a buffer dielectric layer 121 may be formed over the substrate 101 including the well 103. The buffer dielectric layer 121, for example, may be a silicon oxide layer. The buffer dielectric layer 121, for example, may be formed in a thermal oxidation process. First material layers 123 and second material layers 125 are alternately stacked on the buffer dielectric layer 121 and provided. A material of the lowermost layer contacting the buffer dielectric layer 121 may be the first material layer 123. The material layer of the uppermost layer may be the second material layer 125. A first material layer of the lowermost layer and a first material layer of the uppermost layer may be formed thicker than first material layers between the lowermost layer and the uppermost layer. The second material layers 125 may be insulation layers. The second material layers 125, for example, may include silicon oxide. The first material layers 123 may include a material having wet etching characteristic different from that of the buffer dielectric layer 121 and that of the second material layers 125. The first material layers, for example, may include silicon nitride or silicon oxynitride. The first material layers 123 and the second material layers 125, for example, may be formed in a Chemical Vapor Deposition (CVD) process.

Active pillars PL connected to the substrate 101 are formed through the buffer dielectric layer 121, the first material layers 123 and the second material layers 125. The active pillars PL may be arranged in a matrix type based on the first and second directions. At least three active pillars PL may be arranged in the matrix type based on the first and second directions, between the first regions 113.

A process of forming the active pillars PL will be described below as an example. Channel holes 127 are formed through the buffer dielectric layer 121, the first material layers 123 and the second material layers 125, and a first conductive channel semiconductor layer is formed in the channel holes 127. In an embodiment of the inventive concept, the channel semiconductor layer is formed in order not to completely fill the channel holes 127, but a insulating material may be formed on the channel semiconductor layer and completely fill the channel holes 127. The channel semiconductor layer and the insulating material may be planarized, thereby exposing the first material layer of the uppermost layer. Therefore, cylinder-shaped active pillars PL having the inside filled by a filling insulation layer 129 may be formed. In another embodiment of the inventive concept, the channel semiconductor layer may be formed to fill the channel holes 127. In this case, the filling insulation layer 129 may not be required.

The upper portions of the active pillars PL may be recessed, and thus become lower than the second material layer 125 of the uppermost layer. Capping semiconductor patterns may be formed in the channel holes 127 having the recessed active pillars PL. By injecting a second conductive impurity ion into the upper portions of the capping semiconductor patterns and active pillars PL, drain regions D may be formed.

Figure 21D:
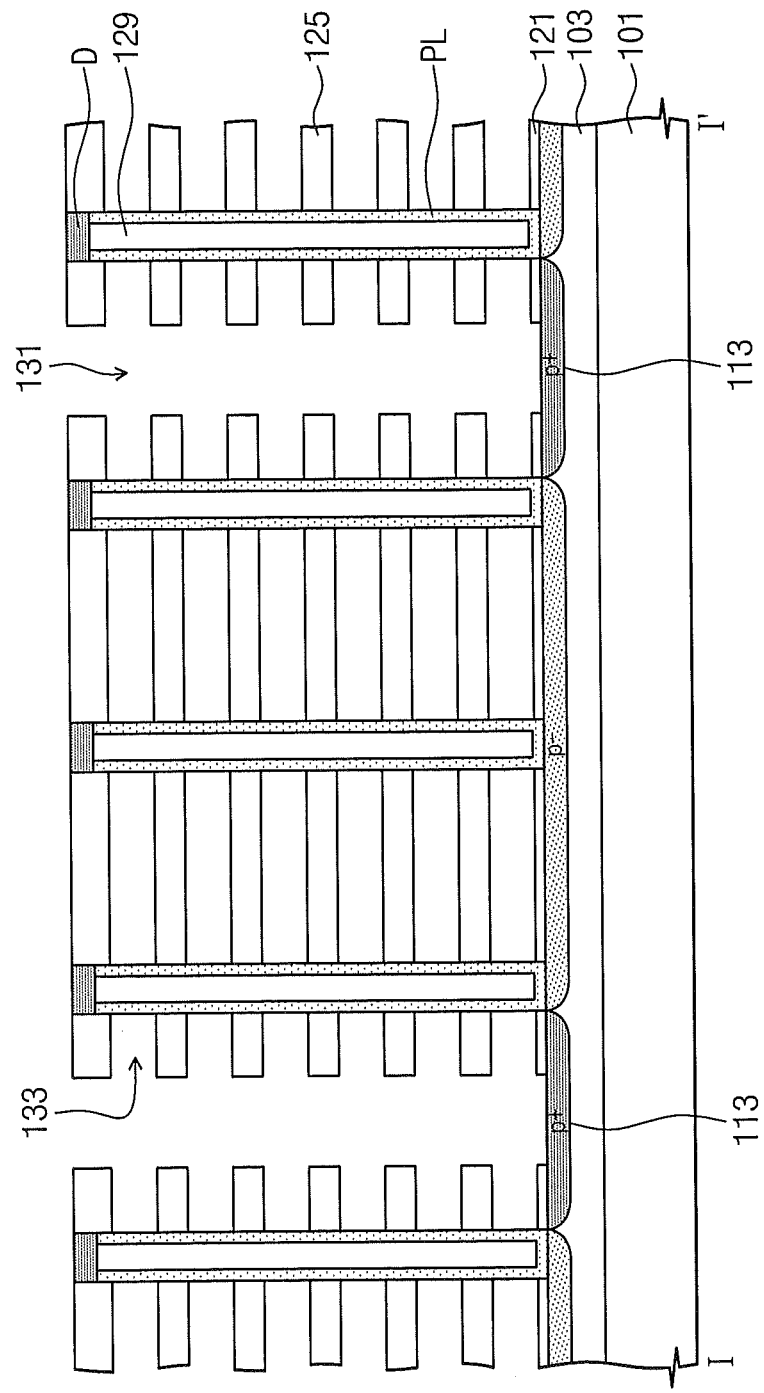

Referring to FIG. 21D, grooves 131 that are separated from each other, extended in the first direction and expose the well 103 of the substrate 101 are formed by successively patterning the buffer dielectric layer 121, the first material layers 123 and the second material layers 125. An empty space 133 is formed by selectively removing the first material layers 123 that are exposed to the grooves 131. The empty space 133 corresponds to a portion with the first material layers 123 removed. When the first material layers 123 include silicon nitride, the removing process may use an etching solution including phosphoric acid. The partial portions of the side walls of the active pillars PL are exposed by the empty space 133.

Figure 21E:
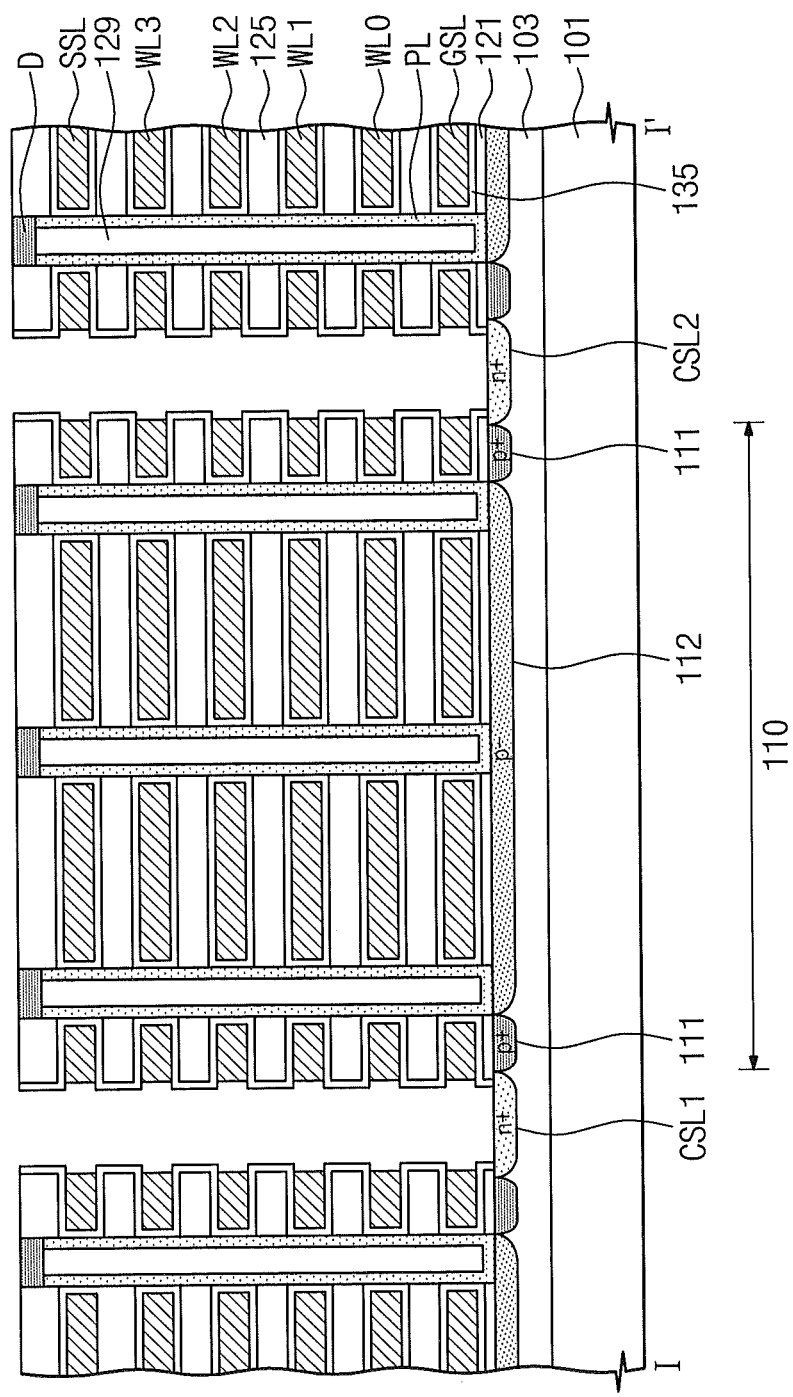

Referring to FIG. 21E, an information storage layer 133 is conformally formed in the empty space 133. The information storage layer 135 may include a tunnel insulation layer contacting the active pillars PL, a charge storage layer on the tunnel insulation layer, and a blocking insulation layer on the charge storage layer (see FIG. 4). The tunnel insulation layer may include silicon oxide. The tunnel insulation layer may be formed by thermally oxidizing the active pillars PL that are exposed to the empty space 133. On the other hand, the tunnel insulation layer may be formed in an Atomic Layer Deposition (ALD) process. The charge storage layer and the blocking dielectric layer may be formed in a CVD process and/or an ALD process having superior step coverage.

A conductive layer filling the empty space 133 is formed on the information storage layer 135. The conductive layer may fully of partially fill the empty space 133. The conductive layer may be formed of at least one of silicon, tungsten, metal nitrides or metal silicides that is/are doped. The conductive layer may be formed in the ALD process. The conductive layer formed outside the empty space 133 is removed. Therefore, conductive patterns are formed in the empty space 133. The conductive patterns may include string selection lines SSL, word lines WL0 to WL3, and a ground selection line GSL.

In this case, a conductive layer formed in the grooves 131 is removed, and thus the well 103 of the substrate 101 may be exposed. The second conductive impurity ion is provided in the exposed well 103 at a high concentration, and thus common source lines CSL1 and CSL2 may be formed. The second material layers 125 between the conductive patterns SSL, WL0 to WL3 and GSL may be the insulation patterns. Therefore, a substrate channel region 110 is formed in the well 103 between the common source lines CSL1 and CSL2. The substrate channel region 110 includes edge regions 111 that are adjacent to the common source lines CSL1 and CSL2 and extended in the firs direction, and a middle region 112 between the edge regions 111. The edge regions 111 may be provided between the common source lines CSL1 and CSL2 and active pillars most adjacent to the common source lines CSL1 and CSL2. The edge regions 111 and the middle region 112 may have the first conductive type. The edge regions 111 may have a first impurity doping concentration, and the middle region 112 may have a second impurity doping concentration lower than the first impurity doping concentration. The active pillars PL may contact the middle region 112.

Figure 21F:
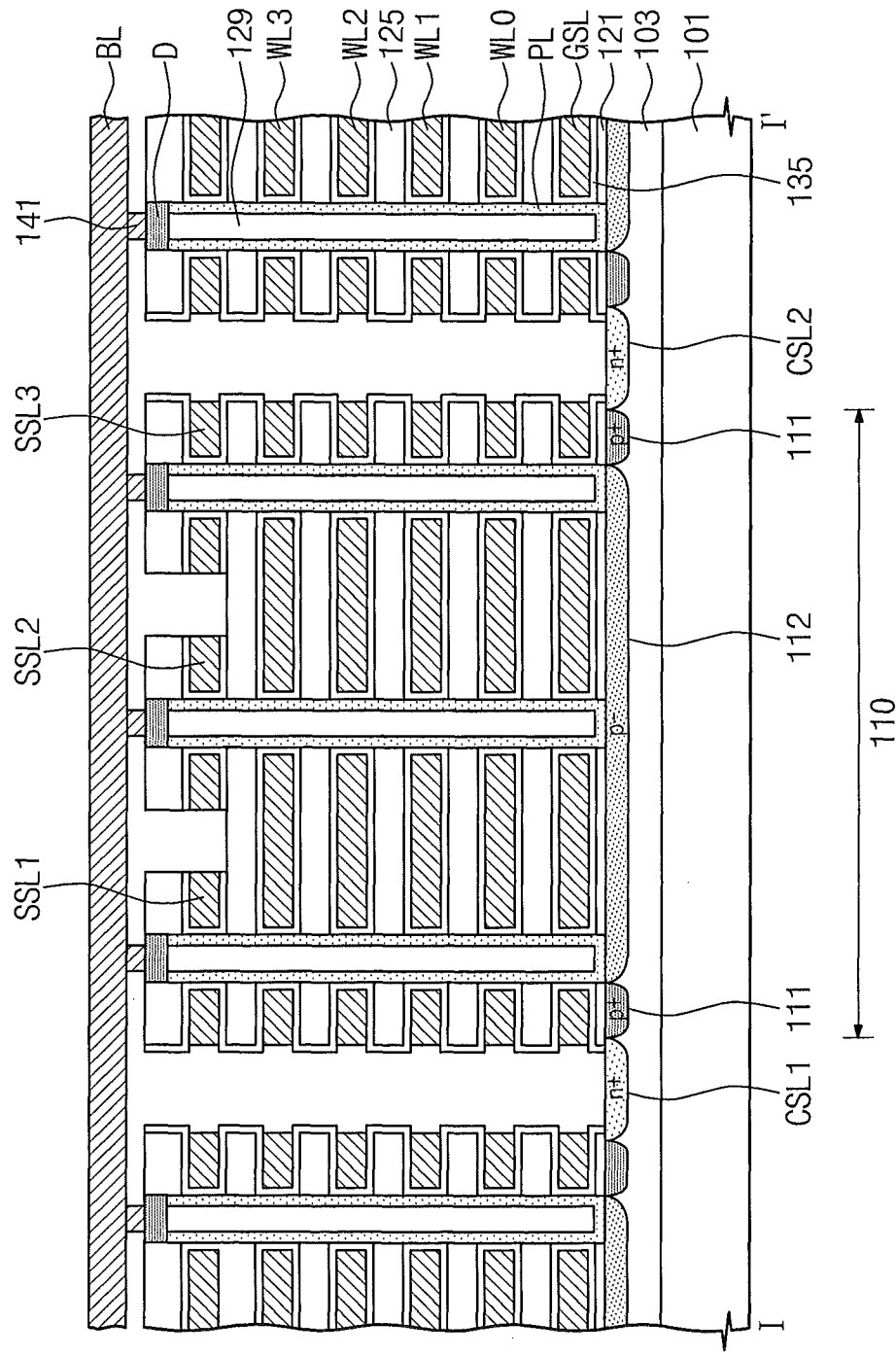

Referring to FIG. 21F, an isolation pattern (not shown) filling the grooves 131 is formed. A conductive pattern SSL of the uppermost portion is patterned, and thus string selection lines SSL1 to SSL3 are formed. The first to third string selection lines SSL1 to SSL3 are electrically coupled to active pillars that are arranged in the first direction, between the first and second common source lines CSL1 and CSL2. Active pillars PL aligned in the second direction may be connected to one bit line BL through the bit line contact 141 in common.

FIGS. 22A to 22G illustrate another example of a method of forming the nonvolatile memory device according to an embodiment of the inventive concept which has been described above with reference to FIG. 8B, and are cross-sectional views corresponding to line I-I' of FIG. 3. Repetitive description on the same technical feature as that of FIGS. 21A and 21F will be omitted, and only a difference will be described below.

Figure 22A:
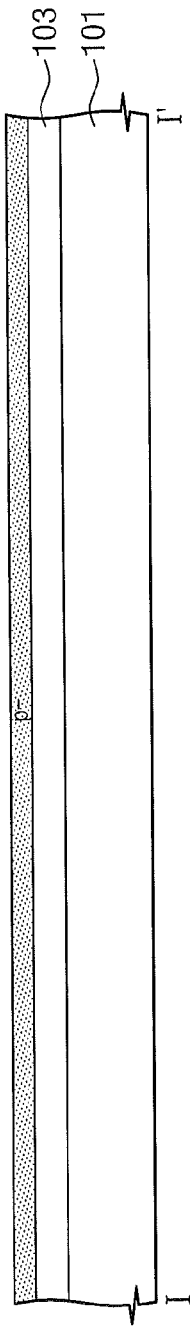

Referring to FIG. 22A, a substrate 101 is provided. A well 103 may be formed by providing a first conductive impurity ion into the substrate 101. The well 103 may be formed in an impurity ion injecting process. A first conductive impurity ion P− for controlling the threshold voltage of a transistor is provided in the cell region of the well 103 at a first concentration.

Figure 22B:
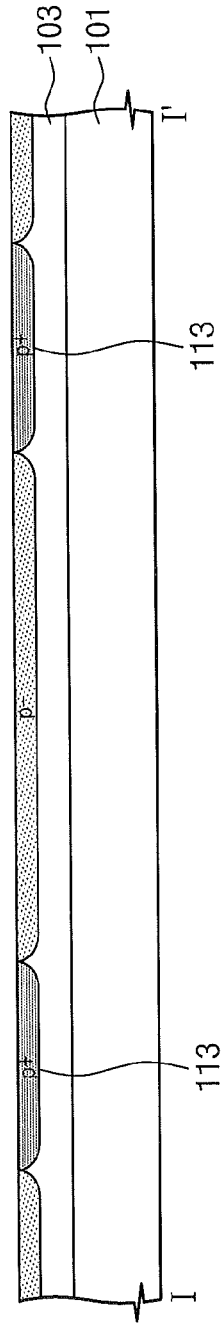
Figure 22C:
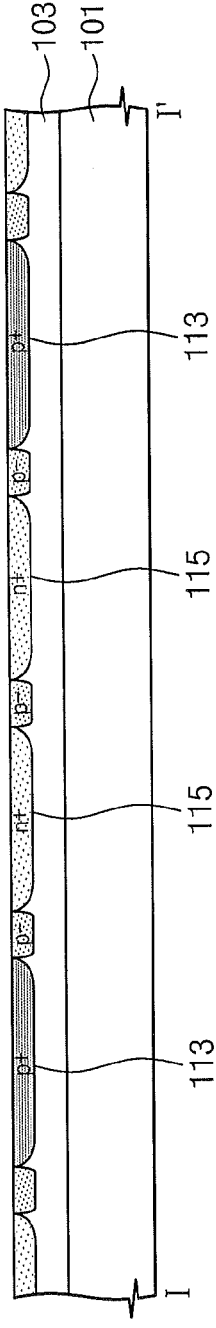

Referring to FIGS. 22B and 22C, the first conductive impurity ion is provided in first regions 113 including a region in which the common source line of the nonvolatile memory device is formed and a region adjacent to the region, at a second concentration higher than the first concentration. The second conductive impurity ion is provided in a second region 115 other than a region in which the active pillars of the nonvolatile memory device are formed, at a high concentration. The first and second regions 113 and 115 may be extended in the first direction.

Figure 22D:
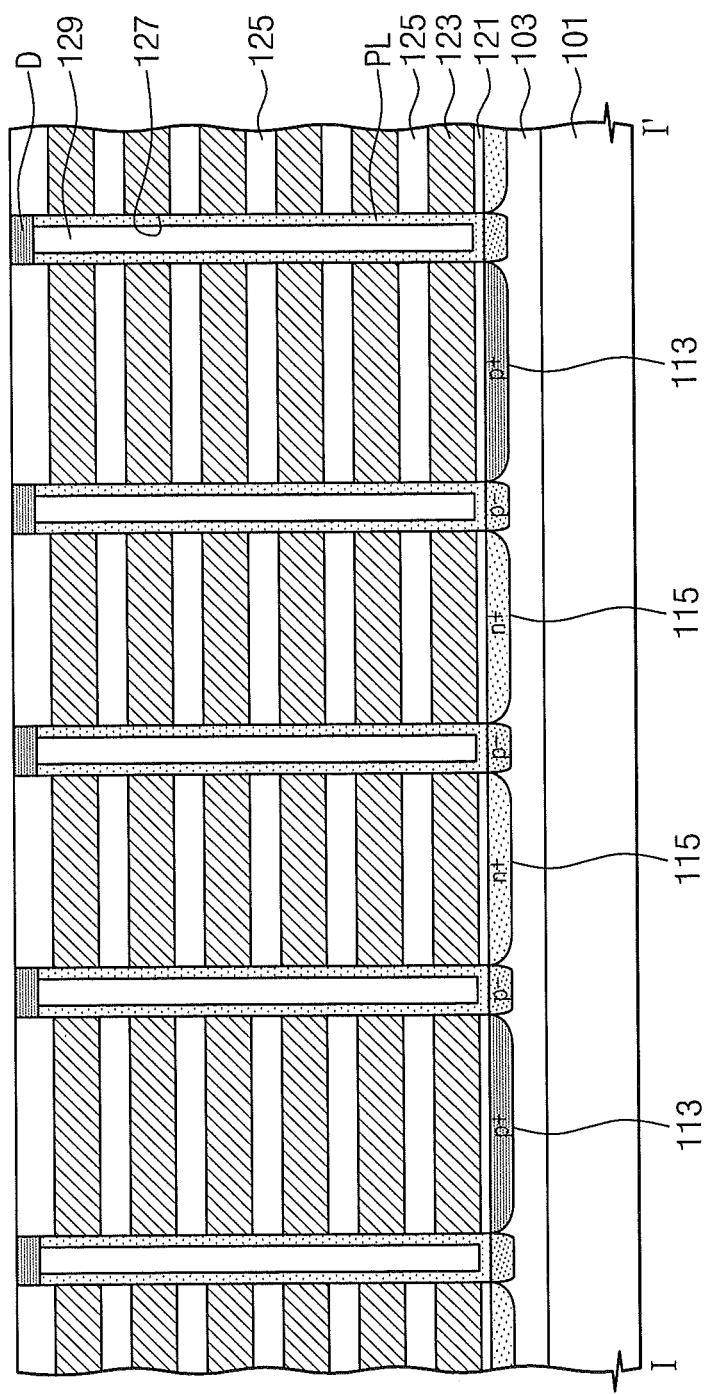

Referring to FIG. 22D, a process of forming the active pillars that have been described above with reference to FIG. 21C is performed.

Figure 22E:
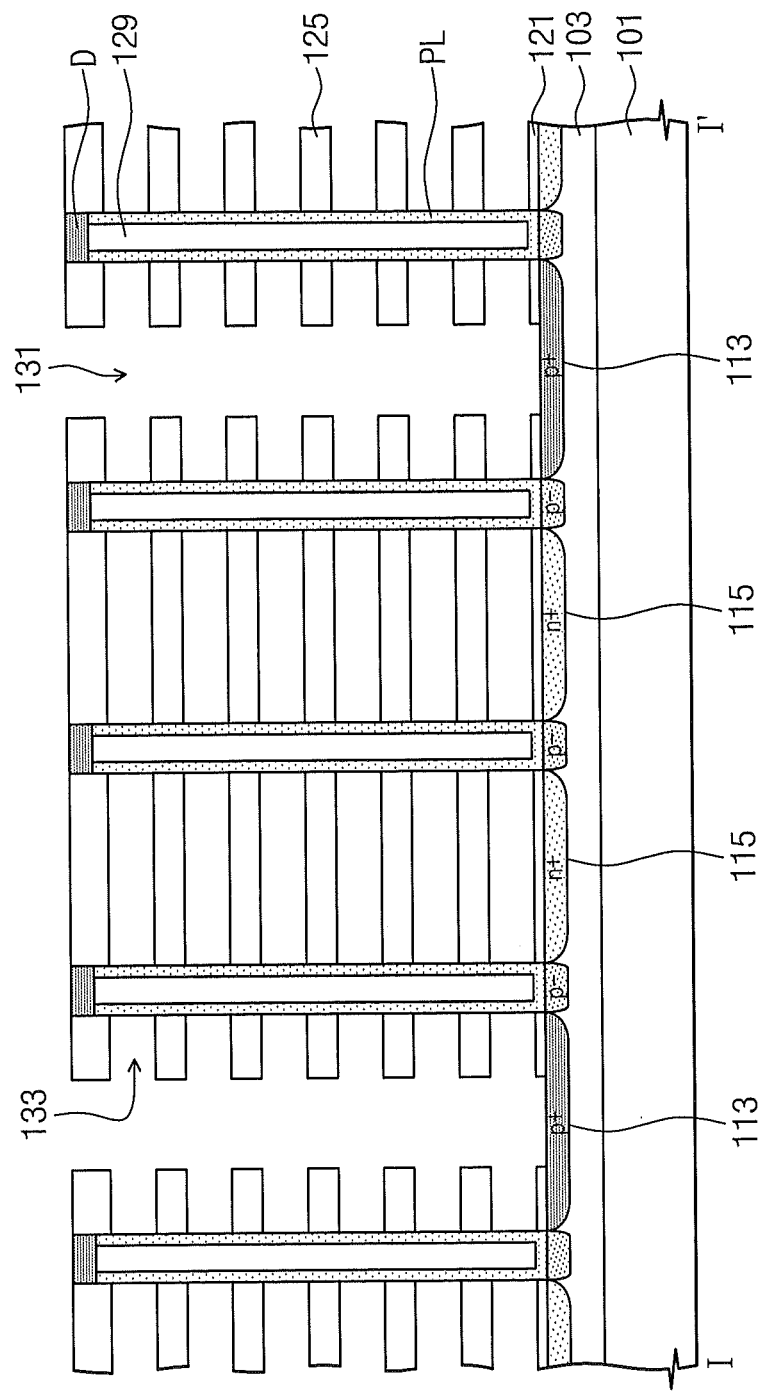

Referring to FIGS. 22E and 22F, a process of forming the conductive patterns that have been described above with reference to FIGS. 21D to 21E is performed. The second conductive impurity ion is provided in the well 103 at a high concentration, and thus common source lines CSL1 and CSL2 may be formed. Edge regions 111 may have the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. The third impurity regions 117 may have the second conductive type. On the other hand, the third impurity regions 117 may have the first conductive type, and a third impurity doping concentration lower than the second impurity doping concentration. The active pillars PL may contact the second impurity regions 116. The second impurity regions 116 may be extended in the second direction in which the active pillars PL are arranged. The third impurity regions 117 may be provided between the second impurity regions 116.

Figure 22G:
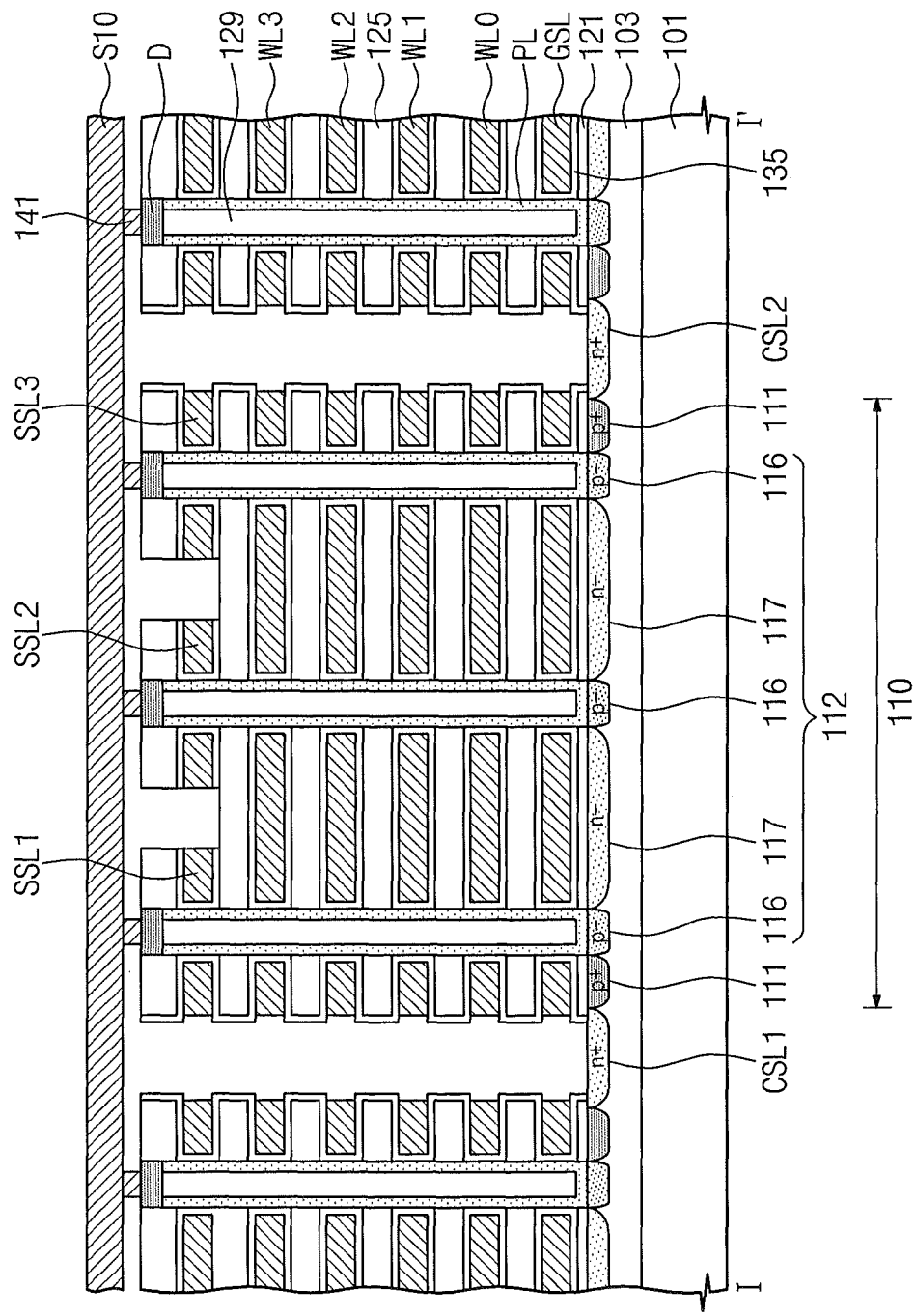
Figure 23D:
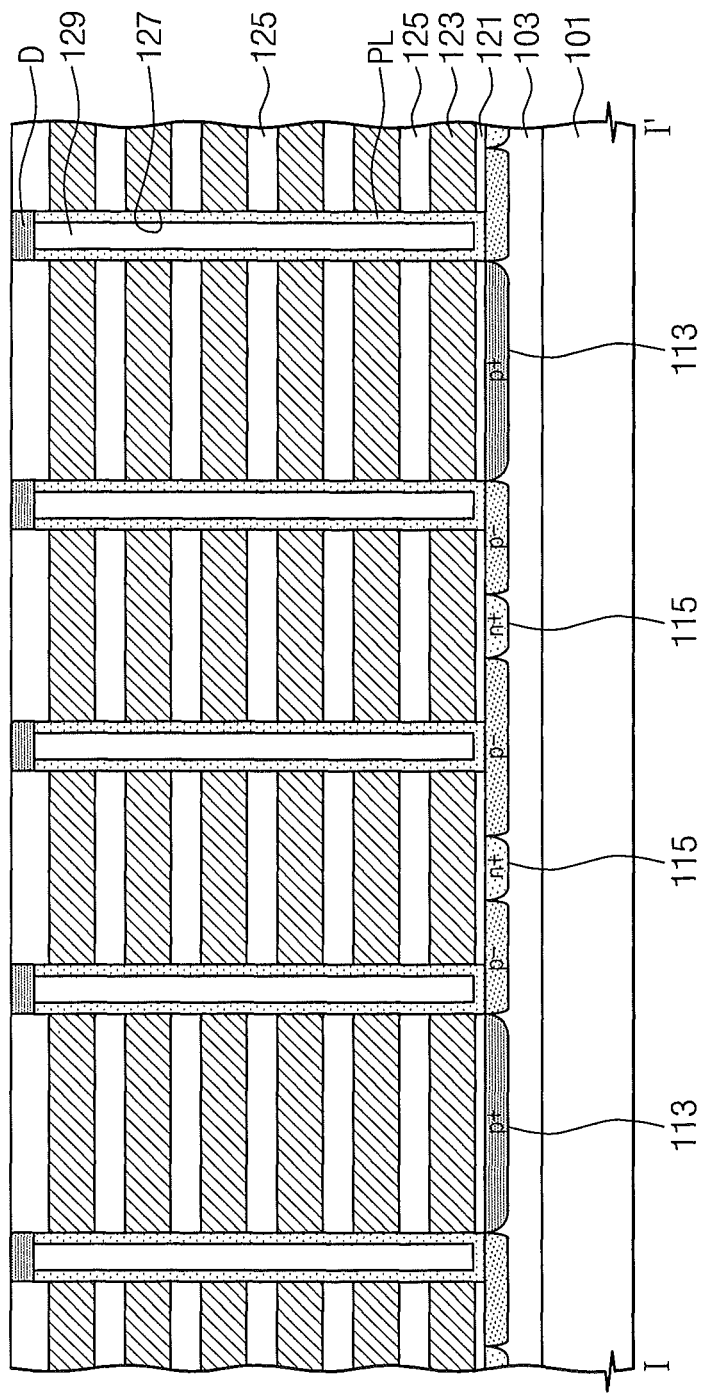
Figure 23F:
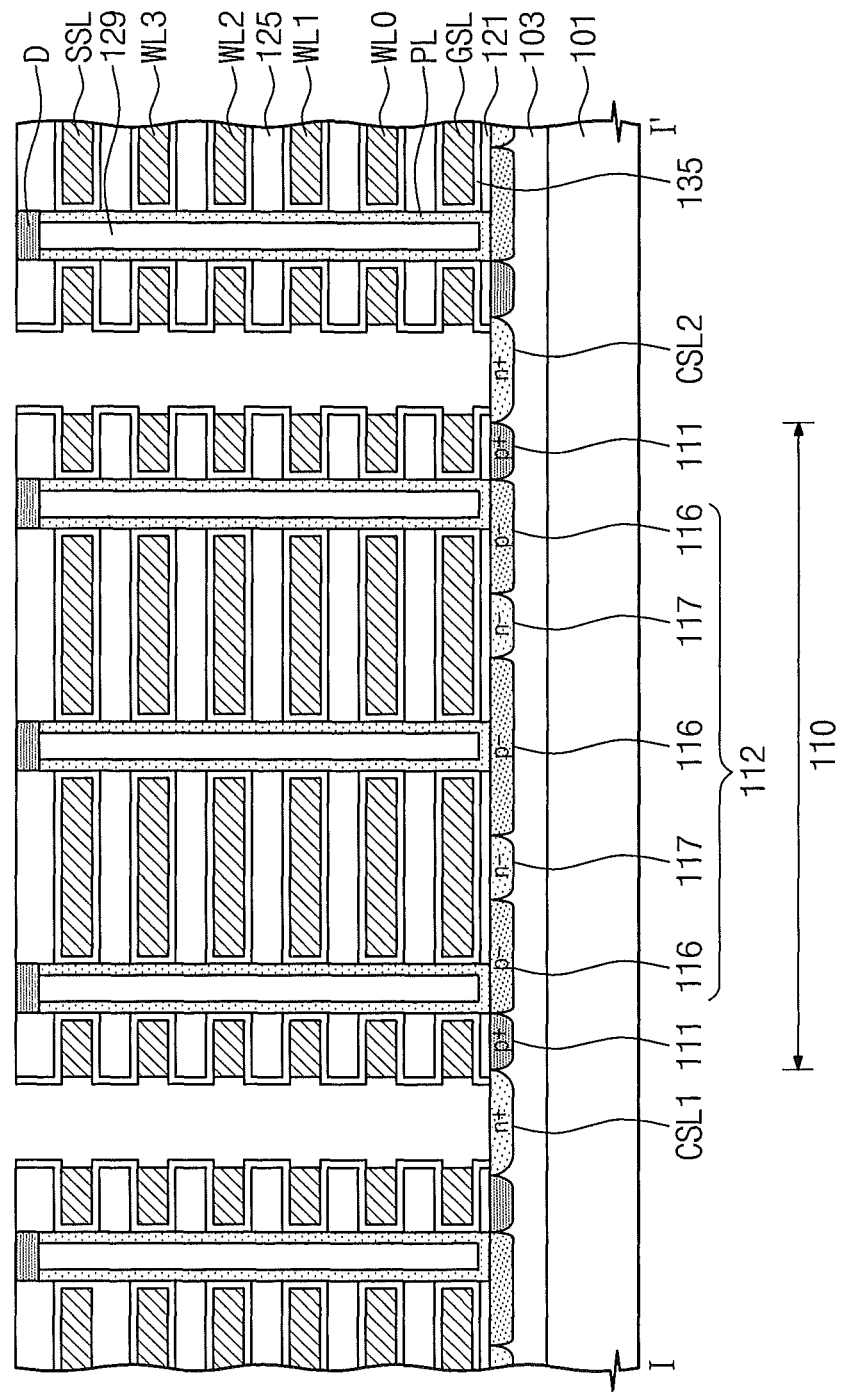
Figure 23G:
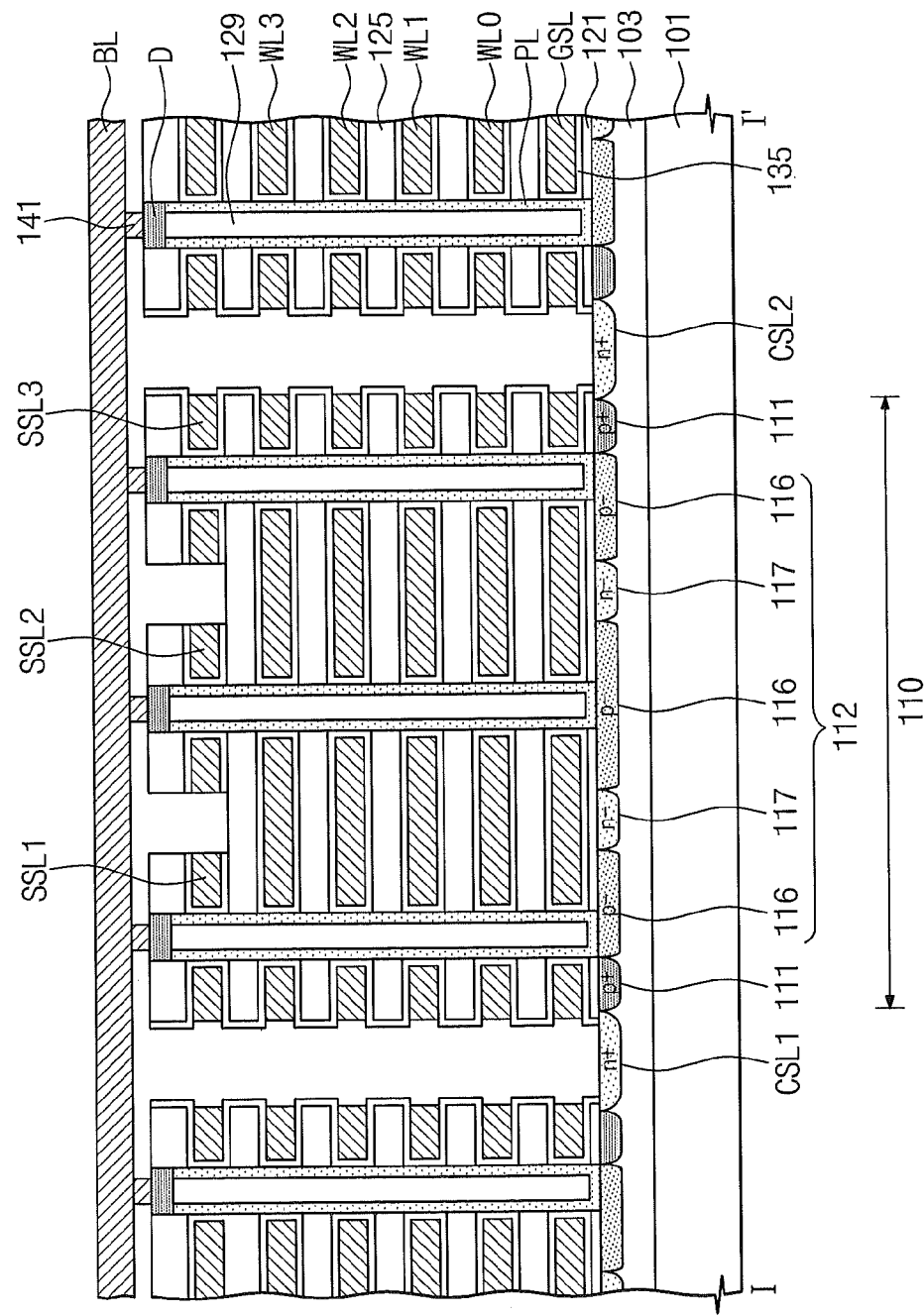

Referring to FIG. 22G, the process that has been described above with reference to FIG. 21F, and thus string selection lines SSL1 to SSL3 are formed. The first to third string selection lines SSL1 to SSL3 are electrically coupled to active pillars PL that are arranged in the first direction, between the first and second common source lines CSL1 and CSL2. Active pillars PL aligned in the second direction may be connected to one bit line BL through the bit line contact 141 in common.

FIGS. 23A to 23H illustrate another example of a method of forming the nonvolatile memory device according to an embodiment of the inventive concept which has been described above with reference to FIG. 9B, and are cross-sectional views corresponding to line I-I' of FIG. 3. Repetitive description on the same technical feature as that of FIGS. 22A and 22F will be omitted, and only a difference will be described below.

In FIG. 23C, the second conductive impurity ion is provided in a region 115 other than a region in which the active pillars of the nonvolatile memory device are formed, at a high concentration. The width of the region 115 on which the second conductive impurity ion is doped is narrower than that of FIG. 22C.

The edge regions 111 may have the first conductive type. The middle region 112 may have second impurity doping regions 116 having the first conductive type, and third impurity regions 117. The edge regions 111 may have a first impurity doping concentration, and the second impurity regions 116 may have a second impurity doping concentration lower than the first impurity doping concentration. The second impurity regions 116 may be provided to overlap with the string selection lines SSL1 to SSL3. The third impurity regions 117 may be provided between the second impurity regions 116. The third impurity regions 117 may overlap with a separated space between the string selection lines SSL1 to SSL3.

The method of forming the nonvolatile memory device 200 according to another embodiment of the inventive concept and the method of forming the nonvolatile memory device 300 according to another embodiment of the inventive concept may be performed in a process similar to the method of forming the nonvolatile memory device 100 according to an embodiment of the inventive concept.

Figure 24:
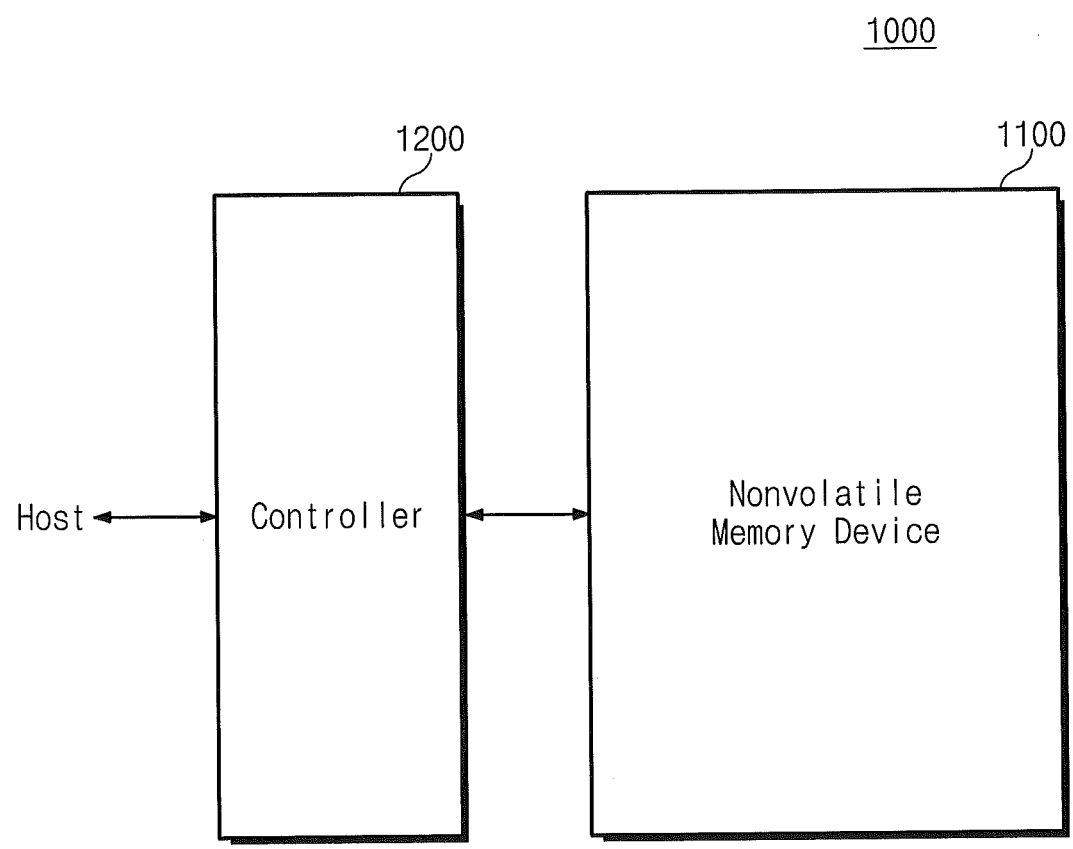
FIG. 24 is a block diagram illustrating a memory system 1000 which includes a nonvolatile memory device according to embodiments of the inventive concept.

FIG. 24 is a block diagram illustrating a memory system 1000 which includes the above-described nonvolatile memory device, according to an embodiment of the inventive concept.

Referring to FIG. 24, a memory system 1000 according to an embodiment of the inventive concept includes a memory device 1100 and a controller 1200. The memory device 1100 may be implemented as a nonvolatile memory device.

The controller 1200 is connected to a host and the memory device 1100. In response to a request from the host, the controller 1200 accesses the memory device 1100. For example, the controller 1200 controls the reading, writing, erasing and background operations of the memory device 1100. The controller 1200 provides interface between the memory device 1100 and the host. The controller 1200 drives firmware for controlling the memory device 1100.

For example, as described above with reference to FIG. 1, the controller 1200 provides a control signal CTRL and an address ADDR to the memory device 1100. Furthermore, the controller 1200 exchanges data DATA with the memory device 1100.

Exemplarily, the controller 1200 may further include a Random Access Memory (RAM), a processing unit, a host interface, and a memory interface. The RAM is used as at least one of a working memory of the processing unit, a cache memory between the memory device 1100 and the host, and a buffer memory between the memory device 1100 and the host. The processing unit controls the overall operation of the controller 1200.

The host interface includes a protocol for data exchange between the host and the controller 1200. Exemplarily, the controller 1200 may communicate with external devices (for example, a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and a Integrated Drive Electronics (IDE) protocol. A memory interface interfaces with the memory device 1100. For example, the memory interface includes a NAND interface or a NOR interface.

The memory system 1000 may further include an error correction block. The error correction block detects and corrects the error of data that is read from the memory device 1100 with an Error Correction Code (ECC). For example, the error correction block is provided as the element of the controller 1200. The error correction block may be provided as the element of the memory device 1100.

The controller 1200 and the memory device 1100 may be integrated as one semiconductor device. Exemplarily, the controller 1200 and the memory device 1100 are integrated as one semiconductor device to configure a memory card. For example, the controller 1200 and the memory device 1100 are integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and a universal flash memory device (UFS).

The controller 120 and the memory device 1100 are integrated as one semiconductor device to configure a semiconductor drive (Solid State Drive (SSD). The semiconductor drive (SSD) includes a storage unit for storing data in a semiconductor memory. When the memory system 1000 is used as the semiconductor drive (SSD), the operation speed of the host connected to the memory system 1000 is considerably improved.

As another example, the memory system 1000 is provided as one of various elements of electronic devices such as computers, Ultra Mobile PCs (UMPCs), workstations, netbooks, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and one of various elements configuring a computing system.

For example, the memory device 1100 or the memory system 1000 may be mounted as various types of packages. For example, the memory device 1100 or the memory system 1000 may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 25:
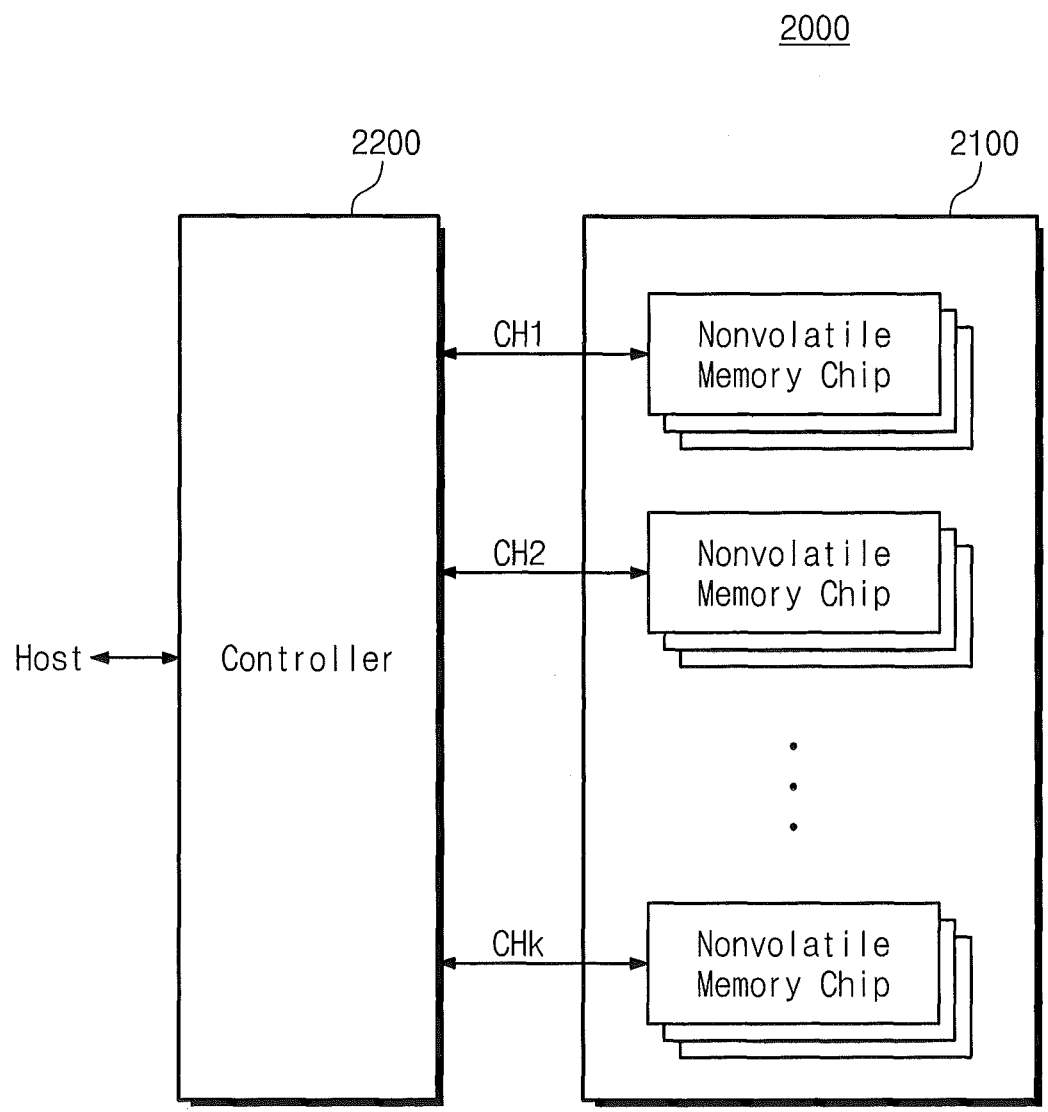
FIG. 25 is a block diagram illustrating an application example of the memory system of FIG. 24.

FIG. 25 is a block diagram illustrating an application example of the memory system 1000 of FIG. 24. Referring to FIG. 25, a memory system 2000 includes a memory device 2100 and a controller 2200. The memory device 2100 includes a plurality of nonvolatile memory chips. The plurality of nonvolatile memory chips are divided into a plurality of groups. The each group of the nonvolatile memory chips communicates with the controller 2200 through a common channel. In FIG. 25, it is illustrated that the plurality of nonvolatile memory chips communicate with the controller 2200 through first to kth channels CH1 to CHk.

In FIG. 25, it has been described above that the plurality of nonvolatile memory chips are connected to one channel. However, the memory system 2000 may be modified so that one nonvolatile memory chip may be connected to one channel.

Figure 26:
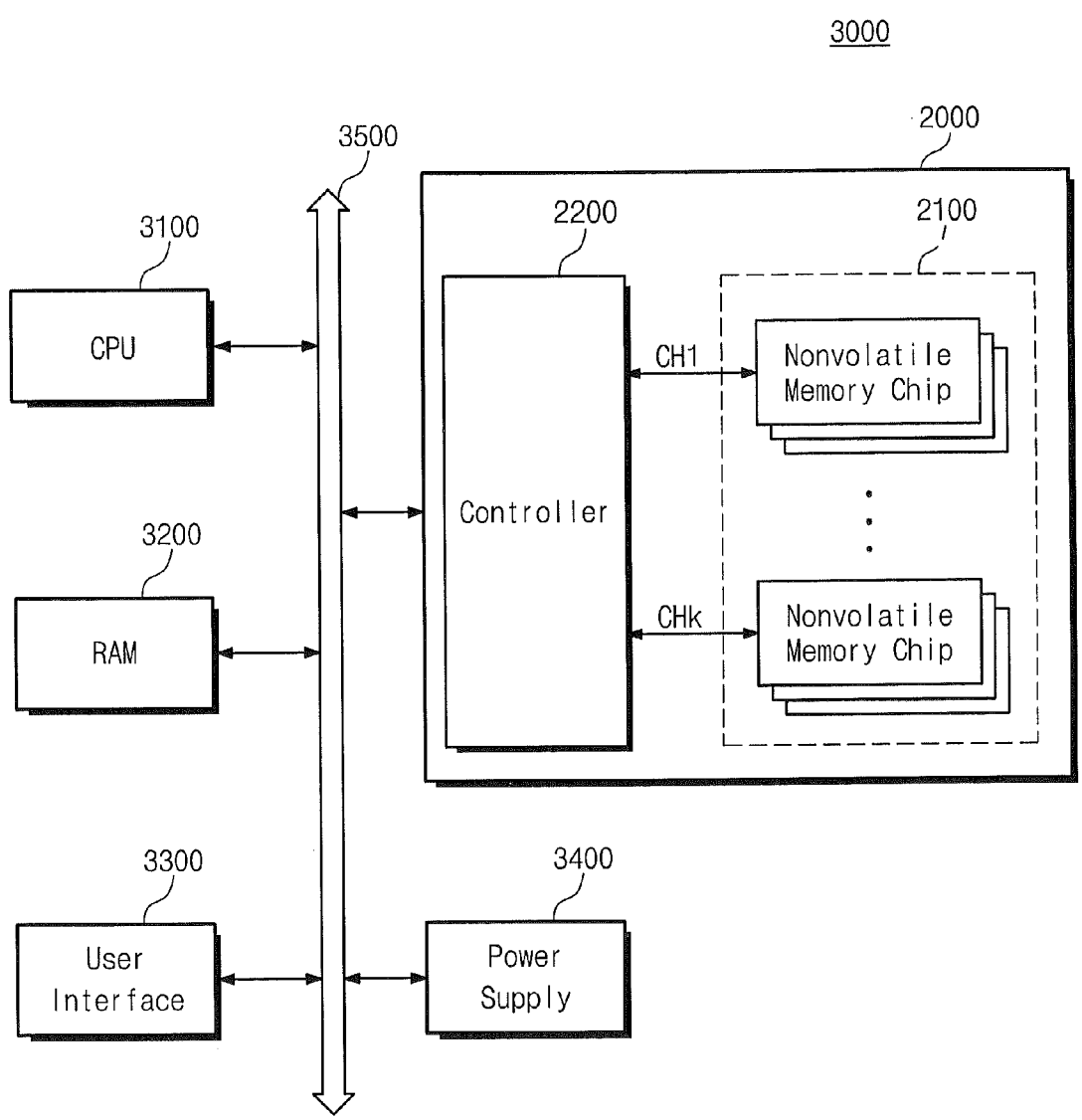
FIG. 26 is a block diagram illustrating a computing system which includes the memory system of FIG. 25.

FIG. 26 is a block diagram illustrating a computing system 3000 including the memory system 2000 which has been described above with reference to FIG. 25.

Referring to FIG. 26, a computing system 3000 includes a Central Processing Unit (CPU) 3100, a RAM 3200, a user interface 3300, a power supply 3400, and the memory system 2000.

The memory system 2000 is electrically connected to the CPU 3100, the RAM 3200, the user interface 3300 and the power supply 3400 through a system bus 3500. Data, which is provided through the user interface 3300 or is processed by the CPU 3100, is stored in the memory system 2000.

In FIG. 26, it is illustrated that the memory device 2100 is connected to the system bus 3500 through the controller 2200. However, the memory device 2100 may be directly connected to the system bus 3500.

In FIG. 26, it is illustrated that the memory system 2000 which has been described above with reference to FIG. 25 is provided. However, the memory system 2000 may be replaced by the memory system 1000 that has been described above with reference to FIG. 24.

For example, the computing system 3000 may include all the memory systems 1000 and 2000 that have respectively been described above with reference to FIGS. 24 and 25.

According to embodiments of the inventive concept, the nonvolatile memory device can reduce the dispersion of the cell current between active pillars that is separated by the first distance from the common source lines and active pillars that is separated by the second distance from the common source lines.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The invention claimed is:

1. A nonvolatile memory device comprising:
   first and second common source lines of a first conductivity type in a substrate;
   a channel region of a second conductivity type in the substrate between the first and second common source lines;
   a stacked structure on the channel region, the stacked structure including a vertically-stacked plurality of conductive patterns;
   first and second string selection lines on the stacked structure, the first and second string selection lines horizontally spaced apart from each other;
   a bit line overlapping the first and second string selection lines;
   a first vertical channel penetrating the first string selection line and the stacked structure, the first vertical channel connecting the first common source line to the bit line; and
   a second vertical channel penetrating the second string selection line and the stacked structure, the second vertical channel connecting the second common source line to the bit line.

2. The nonvolatile memory device of claim 1, wherein each of the first and second vertical channels is in contact with the channel region.

3. The nonvolatile memory device of claim 1,
   wherein the first vertical channel is spaced apart from the first common source line by a first distance, and
   wherein the second vertical channel is spaced apart from the second common source line by a second distance different from the first distance.

4. The nonvolatile memory device of claim 1,
   wherein the channel region comprises edge regions directly adjacent the first and second common source lines and a middle region between the edge regions, and
   wherein a first impurity doping concentration of the edge regions is higher than a second impurity doping concentration of the middle region.

5. The nonvolatile memory device of claim 4, the first and second vertical channels are in contact with the middle region.

6. The nonvolatile memory device of claim 4, wherein the middle region comprises:
   first regions contacting the first and second vertical channels, and extending in a direction; and
   a second region extending in the direction between the first regions.

7. The nonvolatile memory device of claim 4, wherein the middle region comprises a doping region extending in a direction between the first and second vertical channels and having the second conductivity type.

8. The nonvolatile memory device of claim 1, wherein the first and second common source lines are substantially parallel with the first and the second string selection lines.

9. A nonvolatile memory device comprising:
   first and second common source lines of a first conductivity type in a substrate;
   a channel region of a second conductivity type in the substrate between the first and second common source lines;
   a bit line overlapping the first and second common source lines;
   a first string connected between the first common source line and the bit line, the first string comprising:
      a first vertically-stacked plurality of nonvolatile memory cells;
      a first string select transistor connected between the bit line and the first vertically-stacked plurality of nonvolatile memory cells;
      a first ground select transistor connected with the first vertically-stacked plurality of nonvolatile memory cells; and
      a first lateral ground select transistor connected between the first ground select transistor and the first common source line; and
   a second string connected between the second common source line and the bit line, the second string comprising:
      a second vertically-stacked plurality of nonvolatile memory cells;
      a second string select transistor connected between the bit line and the second vertically-stacked plurality of nonvolatile memory cells;
      a second ground select transistor connected with the second vertically-stacked plurality of nonvolatile memory cells; and a second lateral ground select transistor connected between the second ground select transistor and the second common source line, wherein the first and second lateral ground select transistors are configured to use the channel region as a channel.

10. The nonvolatile memory device of claim 9, wherein the channel region comprises edge regions directly adjacent the first and second common source lines and a middle region between the edge regions, and wherein a first impurity doping concentration of the edge regions is higher than a second impurity doping concentration of the middle region.

11. The nonvolatile memory device of claim 10, wherein the first and second lateral ground select transistors are configured to use the edge regions as the channel.

12. The nonvolatile memory device of claim 10, wherein the first string is spaced apart from the first common source line by a first distance, and wherein the second string is spaced apart from the second common source line by a second distance different from the first distance.

* * * * *